(12) United States Patent
Yamato

(10) Patent No.: US 11,923,834 B2
(45) Date of Patent: Mar. 5, 2024

(54) SWITCH DEVICE

(71) Applicant: Rohm Co., Ltd., Kyoto (JP)

(72) Inventor: Tetsuo Yamato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 3 days.

(21) Appl. No.: 17/829,596

(22) Filed: Jun. 1, 2022

(65) Prior Publication Data
US 2022/0399885 A1      Dec. 15, 2022

(30) Foreign Application Priority Data

Jun. 9, 2021   (JP) .................................. 2021-096451

(51) Int. Cl.
| | | |
|---|---|---|
| *H03K 17/081* | (2006.01) | |
| *H03K 17/08* | (2006.01) | |
| *H03K 17/14* | (2006.01) | |
| *H03K 17/687* | (2006.01) | |

(52) U.S. Cl.
CPC ..... *H03K 17/08104* (2013.01); *H03K 17/145* (2013.01); *H03K 17/6871* (2013.01); *H03K 2017/0806* (2013.01)

(58) Field of Classification Search
CPC .......... H03K 17/08104; H03K 17/145; H03K 17/6871; H03K 2017/0806
See application file for complete search history.

(56) References Cited

U.S. PATENT DOCUMENTS

| | | | |
|---|---|---|---|
| 2018/0307599 A1* | 10/2018 | Tamura | ............... G06F 12/0253 |
| 2019/0190512 A1* | 6/2019 | Takuma | ................. H02H 3/087 |
| 2020/0272120 A1 | 8/2020 | Fujimora et al. | |

FOREIGN PATENT DOCUMENTS

WO   WO 2019065395   4/2019

\* cited by examiner

*Primary Examiner* — Metasebia T Retebo
(74) *Attorney, Agent, or Firm* — Fish & Richardson P.C.

(57) ABSTRACT

A switch device includes an output transistor, an overcurrent protection circuit configured to be capable of performing an overcurrent protection operation in which magnitude of target current flowing in the output transistor is limited to a predetermined upper limit current value or less, and a control circuit configured to be capable of controlling a state of the output transistor and capable of changing the upper limit current value among a plurality of current values including a predetermined first current value and a predetermined second current value less than the first current value. The control circuit can limit the magnitude of the target current to the first current value or less in response to the magnitude of the target current reaching the first current value, and then change the upper limit current value to the second current value.

7 Claims, 26 Drawing Sheets

SWITCH DEVICE

CROSS-REFERENCE TO RELATED APPLICATIONS

This nonprovisional application claims priority under 35 U.S.C. § 119(a) on Patent Application No. 2021-096451 filed in Japan on Jun. 9, 2021, the entire contents of which are hereby incorporated by reference.

BACKGROUND OF THE DISCLOSURE

Field of the Disclosure

The present disclosure relates to a switch device.

Description of Related Art

There is a switch device that includes an output transistor so as to turn on and off current flowing through the output transistor. The switch device of this type is equipped with an overcurrent protection function, and when overcurrent is detected, value of the current flowing through the output transistor is limited to a predetermined value or less.
Patent Document 1: PCT Publication No. 2019/065395

When short to high level, short to ground, or other fault occurs, an overcurrent protection operation may be performed repeatedly. The repeat of the overcurrent protection operation causes temperature fluctuation in the output transistor, and it may badly affect a structure of the switch device. Higher durability against overcurrent can improve reliability of the switch device more.

SUMMARY OF THE INVENTION

It is an object of the present disclosure to provide a switch device that can contribute to improvement of durability against overcurrent.

A switch device according to the present disclosure includes an output transistor, an overcurrent protection circuit configured to be capable of performing overcurrent protection operation in which magnitude of target current flowing in the output transistor is limited to a predetermined upper limit current value or less, and a control circuit configured to be capable of controlling a state of the output transistor and capable of changing the upper limit current value among a plurality of current values including a predetermined first current value and a predetermined second current value less than the first current value. The control circuit is configured to be capable of changing the upper limit current value to the second current value after performing the overcurrent protection operation to limit the magnitude of the target current to the first current value or less when the magnitude of the target current reaches the first current value.

According to the present disclosure, it is possible to provide a switch device that can contribute to improvement of durability against overcurrent.

DETAILED DESCRIPTION OF THE PREFERRED EMBODIMENTS

Figure 1:
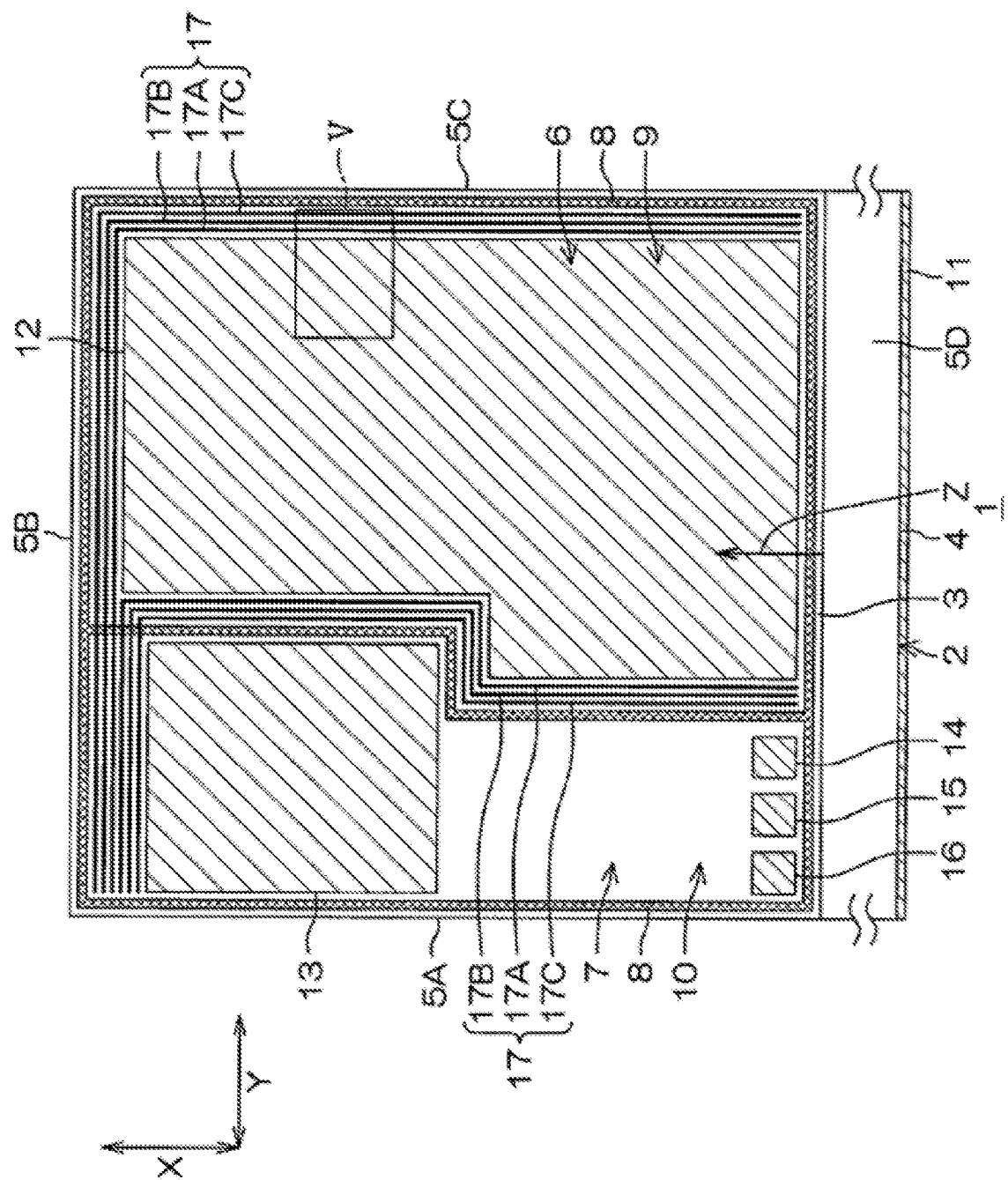
FIG. 1 is a perspective view of a semiconductor device viewed from one direction, according to a first embodiment.

Hereinafter, examples of embodiments of the present disclosure are specifically described with reference to the drawings. In the drawings that are referred to, the same part is denoted by the same numeral or symbol, and overlapping description of the same part is omitted as a rule. Note that in this specification, for simple description, names of information, signals, physical quantities, elements, parts, or the like may be omitted or abbreviated by referring to numerals or symbols thereof. For instance, a gate control circuit denoted by 1110 described later (see FIG. 16) can be written as a gate control circuit 1110 or abbreviated as a control circuit 1110 or a circuit 1110, and these expressions are all equivalent.

First Embodiment

A first embodiment of the present disclosure is described. FIG. 1 is a perspective view of a semiconductor device 1 viewed from one direction, according to the first embodiment of the present disclosure. In the following description, a form example is described in which the semiconductor device 1 is a switching device on the high side, but the semiconductor device 1 is not limited to the switching device on the high side. The semiconductor device 1 can be provided also as a switching device on the low side by adjusting electric connection forms and functions of various structures.

With reference to FIG. 1, the semiconductor device 1 includes a semiconductor layer 2. The semiconductor layer 2 contains silicon. The semiconductor layer 2 is formed as a chip having a rectangular parallelepiped shape. The semiconductor layer 2 has a first principal surface 3 on one side, a second principal surface 4 on the other side, and side surfaces 5A, 5B, 5C, and 5D that connect the first principal surface 3 and the second principal surface 4.

The first principal surface 3 and the second principal surface 4 are formed in a rectangular shape in a plan view viewed from the normal direction Z thereof (hereinafter simply referred to as "in a plan view"). The side surface 5A and the side surface 5C extend in a first direction X, and face each other in a second direction Y crossing the first direction X. The side surface 5B and the side surface 5D extend in the second direction Y, and face each other in the first direction X. More specifically, the second direction Y is perpendicular to the first direction X.

An output region 6 and an input region 7 are disposed in the semiconductor layer 2. The output region 6 is disposed in a region on the side of the side surface 5C. The input region 7 is disposed in a region on the side of the side surface 5A. In a plan view, area SOUT of the output region 6 is more than or equal to area SIN of the input region 7 (SIN≤SOUT).

A ratio SOUT/SIN of the area SOUT to the area SIN may be 1 or more and 10 or less (1≤SOUT/SIN≤10). The ratio SOUT/SIN may be 1 or more and 2 or less, 2 or more and 4 or less, 4 or more and 6 or less, 6 or more and 8 or less, or 8 or more and 10 or less. The input region 7 and the output region 6 may have any plan-view shape, which is not limited to a particular shape. As a matter of course, the ratio SOUT/SIN may be more than 0 and less than 1.

The output region 6 includes a power metal insulator semiconductor field effect transistor (MISFET) 9 as an example of an insulated gate type transistor. The power MISFET 9 includes a gate, a drain, and a source.

The input region 7 includes a control integrated circuit (IC) 10 as an example of a control circuit. The control IC 10 includes a plurality of types of function circuits for realizing various functions. The plurality of types of function circuits include a circuit that generates gate control signals for controlling drive of the power MISFET 9 on the basis of an external electric signal. The control IC 10 and the power MISFET 9 constitute a so-called intelligent power device (IPD). Note that the IPD is also called an intelligent power module (IPM).

The input region 7 is electrically insulated from the output region 6 by a region isolation structure 8. In FIG. 1, the region isolation structure 8 is shown by hatching. Although specific description is omitted, the region isolation structure 8 may have a trench insulation structure in which an insulator is embedded in a trench.

A plurality of (e.g. six) electrodes 11, 12, 13, 14, 15, and 16 are formed on the semiconductor layer 2. In FIG. 1, the plurality of electrodes 11 to 16 are shown by hatching. The plurality of electrodes 11 to 16 are formed as terminal electrodes that are connected externally by lead wires (e.g. bonding wires) or the like. The number of the electrodes 11 to 16, and a layout and plan-view shapes thereof are arbitrary, and are not limited to the form illustrated in FIG. 1.

The number of the plurality of electrodes 11 to 16, and a layout and plan-view shapes thereof are adjusted in accordance with a specification of the power MISFET 9 or a specification of the control IC 10. In this form, the plurality of electrodes 11 to 16 include a drain electrode 11 (a power electrode), a source electrode 12 (an output electrode), an input electrode 13, a reference voltage electrode 14, an ENABLE electrode 15, and a SENSE electrode 16.

The drain electrode 11 is formed on the second principal surface 4 of the semiconductor layer 2. The drain electrode 11 is electrically connected to the second principal surface 4 of the semiconductor layer 2. The drain electrode 11 transmits a power supply voltage VB to the drain of the power MISFET 9 and various circuits of the control IC 10.

The drain electrode 11 may include at least one of a Ti layer, a Ni layer, an Au layer, an Ag layer and an Al layer. The drain electrode 11 may have a single-layer structure including the Ti layer, the Ni layer, the Au layer, the Ag layer, or the Al layer. The drain electrode 11 may have a multilayer structure in which at least two of the Ti layer, the Ni layer, the Au layer, the Ag layer, and the Al layer are laminated in an arbitrary form.

The source electrode 12 is formed on the first principal surface 3 in the output region 6. The source electrode 12 is electrically connected to a source of the power MISFET 9. The source electrode 12 transmits an electric signal generated by the power MISFET 9 to outside.

The input electrode 13, the reference voltage electrode 14, the ENABLE electrode 15, and the SENSE electrode 16 are formed on the first principal surface 3 in the input region 7. The input electrode 13 transmits an input voltage for driving the control IC 10.

The reference voltage electrode 14 transmits a reference voltage (e.g. ground voltage) to the control IC 10. The ENABLE electrode 15 transmits an electric signal for enabling or disabling functions of the control IC 10 partially or entirely. The SENSE electrode 16 transmits an electric signal for detecting abnormality of the control IC 10.

Gate control wirings 17 as an example of control wirings are further formed on the semiconductor layer 2. The gate control wirings 17 are selectively patterned in the output region 6 and the input region 7. The gate control wirings 17 are electrically connected to a gate of the power MISFET 9 in the output region 6, and are electrically connected to the control IC 10 in the input region 7.

The gate control wirings 17 transmit the gate control signals generated by the control IC 10 to the gate of the power MISFET 9. The gate control signals include an ON signal Von and an OFF signal Voff, so as to control an ON state and an OFF state of the power MISFET 9.

The ON signal Von is higher than a gate threshold voltage Vth of the power MISFET 9 (Vth<Von). The OFF signal Voff is less than the gate threshold voltage Vth of the power MISFET 9 (Voff<Vth). The OFF signal Voff may be the reference voltage (e.g. the ground voltage).

In this form, the gate control wirings 17 include a first gate control wiring 17A, a second gate control wiring 17B, and a third gate control wiring 17C. The first gate control wiring 17A, the second gate control wiring 17B, and the third gate control wiring 17C are electrically insulated from each other.

In this form, two first gate control wirings 17A are patterned in different regions. In addition, two second gate control wirings 17B are patterned in different regions. Further, two third gate control wirings 17C are patterned in different regions.

The first gate control wiring 17A, the second gate control wiring 17B, and the third gate control wiring 17C transmit the same or different gate control signals to the gate of the power MISFET 9. The number of the gate control wirings 17, and a layout, shapes, and the like thereof are arbitrary, and are adjusted in accordance with transmission distances of the gate control signals or the number of the gate control signals to be transmitted.

The source electrode 12, the input electrode 13, the reference voltage electrode 14, the ENABLE electrode 15, the SENSE electrode 16, and the gate control wirings 17 may contain at least one of nickel, palladium, aluminum, copper, aluminum alloy, and copper alloy.

The source electrode 12, the input electrode 13, the reference voltage electrode 14, the ENABLE electrode 15, the SENSE electrode 16, and the gate control wirings 17 may contain at least one of aluminum-silicon-copper (Al—Si—Cu) alloy, aluminum-silicon (Al—Si) alloy, and aluminum-copper (Al—Cu) alloy.

The source electrode 12, the input electrode 13, the reference voltage electrode 14, the ENABLE electrode 15, the SENSE electrode 16, and the gate control wirings 17 may have the same type of electrode material, or different electrode materials.

Figure 2:
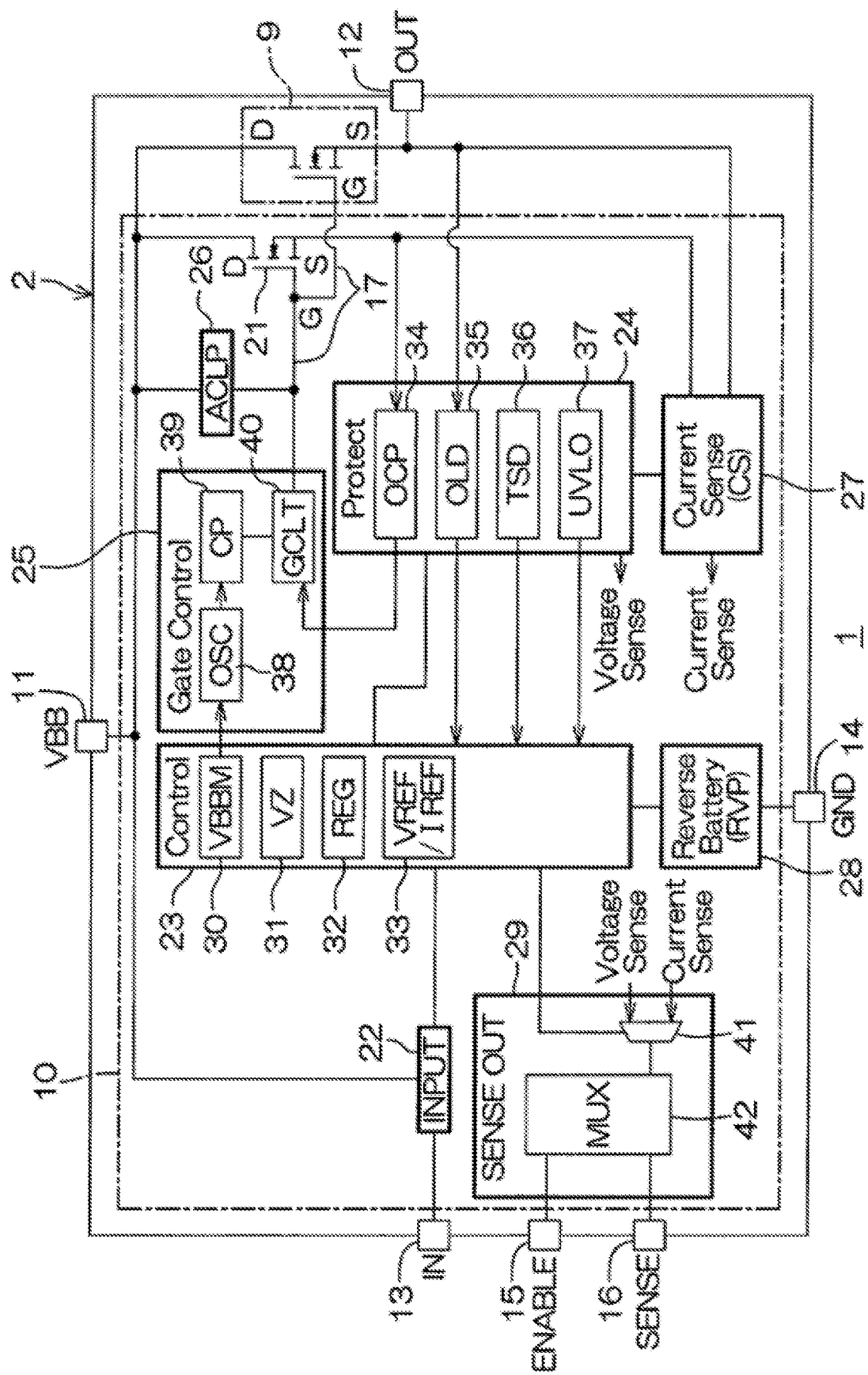
FIG. 2 is a block circuit diagram illustrating an electrical configuration of the semiconductor device illustrated in FIG. 1.

FIG. 2 is a block circuit diagram illustrating an electrical configuration of the semiconductor device 1 illustrated in FIG. 1. In the following description, an example is given in which the semiconductor device 1 is mounted in a vehicle.

The semiconductor device 1 includes the drain electrode 11, the source electrode 12, the input electrode 13, the reference voltage electrode 14, the ENABLE electrode 15, the SENSE electrode 16, the gate control wirings 17, the power MISFET 9, and the control IC 10.

The drain electrode 11 is connected to a power supply. The drain electrode 11 applies the power supply voltage VB to the power MISFET 9 and the control IC 10. The power supply voltage VB may be 10 V or more and 20 V or less. The source electrode 12 is connected to a load.

The input electrode 13 may be connected to a micro controller unit (MCU), a DC/DC converter, a low drop out (LDO), and the like. The input electrode 13 supplies the input voltage to the control IC 10. The input voltage may be 1 V or more and 10 V or less. The reference voltage electrode 14 is connected to a reference voltage wiring. The reference voltage electrode 14 supplies the reference voltage to the power MISFET 9 and the control IC 10.

The ENABLE electrode 15 may be connected to the MCU. The ENABLE electrode 15 is supplied with the electric signal for enabling or disabling functions of the control IC 10 partially or entirely. The SENSE electrode 16 may be connected to a resistor.

The gate of the power MISFET 9 is connected to the control IC 10 (a gate control circuit 25 described later) via the gate control wirings 17. The drain of the power MISFET 9 is connected to the drain electrode 11. The source of the power MISFET 9 is connected to the control IC 10 (a current detection circuit 27 described later) and the source electrode 12.

The control IC 10 includes a sensor MISFET 21, an input circuit 22, a current/voltage control circuit 23, a protection circuit 24, the gate control circuit 25, an active clamp circuit 26, the current detection circuit 27, a power supply reverse connection protection circuit 28, and an abnormality detection circuit 29.

A gate of the sensor MISFET 21 is connected to the gate control circuit 25. A drain of the sensor MISFET 21 is connected to the drain electrode 11. A source of the sensor MISFET 21 is connected to the current detection circuit 27.

The input circuit 22 is connected to the input electrode 13 and the current/voltage control circuit 23. The input circuit 22 may include a Schmitt trigger circuit. The input circuit 22 shapes a waveform of the electric signal applied to the input electrode 13. A signal generated by the input circuit 22 is input to the current/voltage control circuit 23.

The current/voltage control circuit 23 is connected to the protection circuit 24, the gate control circuit 25, the power supply reverse connection protection circuit 28, and the abnormality detection circuit 29. The current/voltage control circuit 23 may include a logic circuit.

The current/voltage control circuit 23 generates various voltages in accordance with the electric signal from the input circuit 22 and the electric signal from the protection circuit 24. In this form, the current/voltage control circuit 23 includes a drive voltage generation circuit 30, a first constant voltage generation circuit 31, a second constant voltage generation circuit 32, and a reference voltage and reference current generation circuit 33.

The drive voltage generation circuit 30 generates a drive voltage for driving the gate control circuit 25. The drive voltage may be set to a value obtained by subtracting a predetermined value from the power supply voltage VB. The drive voltage generation circuit 30 may generate the drive voltage of 5 V or more and 15 V or less obtained by subtracting 5 V from the power supply voltage VB. The drive voltage is input to the gate control circuit 25.

The first constant voltage generation circuit 31 generates a first constant voltage for driving the protection circuit 24. The first constant voltage generation circuit 31 may include a zener diode or a regulator circuit (here, a zener diode). The first constant voltage may be 1 V or more and 5 V or less. The first constant voltage is input to the protection circuit 24 (more specifically, such as a load open detection circuit 35 described later).

The second constant voltage generation circuit 32 generates a second constant voltage for driving the protection circuit 24. The second constant voltage generation circuit 32 may include a zener diode or a regulator circuit (here, a regulator circuit). The second constant voltage may be 1 V or more and 5 V or less. The second constant voltage is input to the protection circuit 24 (more specifically, an overheat protection circuit 36 or a low voltage malfunction suppression circuit 37 described later).

The reference voltage and reference current generation circuit 33 generates reference voltages and reference currents for various circuits. The reference voltage may be 1 V or more and 5 V or less. The reference current may be 1 mA or more and 1 A or less. The reference voltage and the reference current are input to various circuits. If the various circuits include a comparator, the reference voltage and the reference current may be input to the comparator.

The protection circuit 24 is connected to the current/voltage control circuit 23, the gate control circuit 25, the abnormality detection circuit 29, the source of the power MISFET 9, and the source of the sensor MISFET 21. The protection circuit 24 includes an overcurrent protection circuit 34, the load open detection circuit 35, the overheat protection circuit 36, and the low voltage malfunction suppression circuit 37.

The overcurrent protection circuit 34 protects the power MISFET 9 from overcurrent. The overcurrent protection circuit 34 is connected to the gate control circuit 25 and the source of the sensor MISFET 21. The overcurrent protection circuit 34 may include a current monitor circuit. The signal generated by the overcurrent protection circuit 34 is input to the gate control circuit 25 (more specifically, a drive signal output circuit 40 described later).

The load open detection circuit 35 detects a short or open state of the power MISFET 9. The load open detection circuit 35 is connected to the current/voltage control circuit 23 and the source of the power MISFET 9. The signal generated by the load open detection circuit 35 is input to the current/voltage control circuit 23.

The overheat protection circuit 36 monitors temperature of the power MISFET 9 and protects the power MISFET 9 from excessive temperature rise. The overheat protection circuit 36 is connected to the current/voltage control circuit 23. The overheat protection circuit 36 may include a temperature sensitive device such as a temperature sensitive diode or a thermistor. The signal generated by the overheat protection circuit 36 is input to the current/voltage control circuit 23.

The low voltage malfunction suppression circuit 37 suppresses malfunction of the power MISFET 9 when the power supply voltage VB is less than a predetermined value. The low voltage malfunction suppression circuit 37 is connected to the current/voltage control circuit 23. The signal generated by the low voltage malfunction suppression circuit 37 is input to the current/voltage control circuit 23.

The gate control circuit 25 controls the ON state and the OFF state of the power MISFET 9, and the ON state and the OFF state of the sensor MISFET 21. The gate control circuit 25 is connected to the current/voltage control circuit 23, the protection circuit 24, the gate of the power MISFET 9, and the gate of the sensor MISFET 21.

The gate control circuit 25 generates a plurality of types of gate control signals corresponding to the number of the gate control wirings 17, in accordance with the electric signal from the current/voltage control circuit 23 and the electric signal from the protection circuit 24. The plurality of types of gate control signals are each input to the gate of the power MISFET 9 and the gate of the sensor MISFET 21 via the gate control wirings 17.

More specifically, the gate control circuit 25 includes an oscillator circuit 38, a charge pump circuit 39, and a drive signal output circuit 40. The oscillator circuit 38 oscillates and generates a predetermined electric signal in accordance with the electric signal from the current/voltage control circuit 23. The electric signal generated by the oscillator circuit 38 is input to the charge pump circuit 39. The charge pump circuit 39 boosts the electric signal from the oscillator circuit 38. The electric signal boosted by the charge pump circuit 39 is input to the drive signal output circuit 40.

The drive signal output circuit 40 generates the plurality of types of gate control signals in accordance with the electric signal from the charge pump circuit 39 and the electric signal from the protection circuit 24 (more specifically, the overcurrent protection circuit 34). The plurality of types of gate control signals are input to the gate of the power MISFET 9 and the gate of the sensor MISFET 21 via the gate control wirings 17. The sensor MISFET 21 and the power MISFET 9 are simultaneously controlled by the gate control circuit 25.

The active clamp circuit 26 protects the power MISFET 9 from a counter electromotive force. The active clamp circuit 26 is connected to the drain electrode 11, the gate of the power MISFET 9, and the gate of the sensor MISFET 21. The active clamp circuit 26 may include a plurality of diodes.

The active clamp circuit 26 may include a plurality of diodes connected in forward bias. The active clamp circuit 26 may include a plurality of diodes connected in reverse bias. The active clamp circuit 26 may include a plurality of diodes connected in forward bias and a plurality of diodes connected in reverse bias.

The plurality of diodes may include a pn junction diode, a zener diode, or a pn junction diode and a zener diode. The active clamp circuit 26 may include a plurality of zener diodes connected in reverse bias. The active clamp circuit 26 may include a zener diode connected in reverse bias and a pn junction diode.

The current detection circuit 27 detects current that flows in the power MISFET 9 and the sensor MISFET 21. The current detection circuit 27 is connected to the protection circuit 24, the abnormality detection circuit 29, the source of the power MISFET 9, and the source of the sensor MISFET 21. The current detection circuit 27 generates a current detection signal in accordance with the electric signal generated by the power MISFET 9 and the electric signal generated by the sensor MISFET 21. The current detection signal is input to the abnormality detection circuit 29.

The power supply reverse connection protection circuit 28 protects the current/voltage control circuit 23, the power MISFET 9, and the like from a reverse voltage when the power supply is reversely connected. The power supply reverse connection protection circuit 28 is connected to the reference voltage electrode 14 and the current/voltage control circuit 23.

The abnormality detection circuit 29 monitors a voltage of the protection circuit 24. The abnormality detection circuit 29 is connected to the current/voltage control circuit 23, the protection circuit 24, and the current detection circuit 27. If one of the overcurrent protection circuit 34, the load open detection circuit 35, the overheat protection circuit 36, and the low voltage malfunction suppression circuit 37 causes abnormality (such as voltage fluctuation), the abnormality detection circuit 29 generates an abnormality detect signal in accordance with the voltage of the protection circuit 24, and outputs it externally.

More specifically, the abnormality detection circuit 29 includes a first multiplexer circuit 41 and a second multiplexer circuit 42. The first multiplexer circuit 41 includes two input parts, one output part, and one selection control input part. The input parts of the first multiplexer circuit 41 are connected to the protection circuit 24 and the current detection circuit 27, respectively. The output part of the first multiplexer circuit 41 is connected to the second multiplexer circuit 42. The selection control input part of the first multiplexer circuit 41 is connected to the current/voltage control circuit 23.

The first multiplexer circuit 41 generates an abnormality detect signal in accordance with the electric signal from the current/voltage control circuit 23, a voltage detection signal from the protection circuit 24, and the current detection signal from the current detection circuit 27. The abnormality detect signal generated by the first multiplexer circuit 41 is input to the second multiplexer circuit 42.

The second multiplexer circuit 42 includes two input parts and one output part. The input parts of the second multiplexer circuit 42 are connected to the output part of the second multiplexer circuit 42 and the ENABLE electrode 15. The output part of the second multiplexer circuit 42 is connected to the SENSE electrode 16.

If the ENABLE electrode 15 is connected to the MCU while the SENSE electrode 16 is connected to the resistor, the ON signal is input to the ENABLE electrode 15 from the MCU, and the abnormality detect signal is obtained from the SENSE electrode 16. The abnormality detect signal is converted into an electric signal by the resistor connected to the SENSE electrode 16. A state abnormality of the semiconductor device 1 is detected on the basis of this electric signal.

Figure 3:
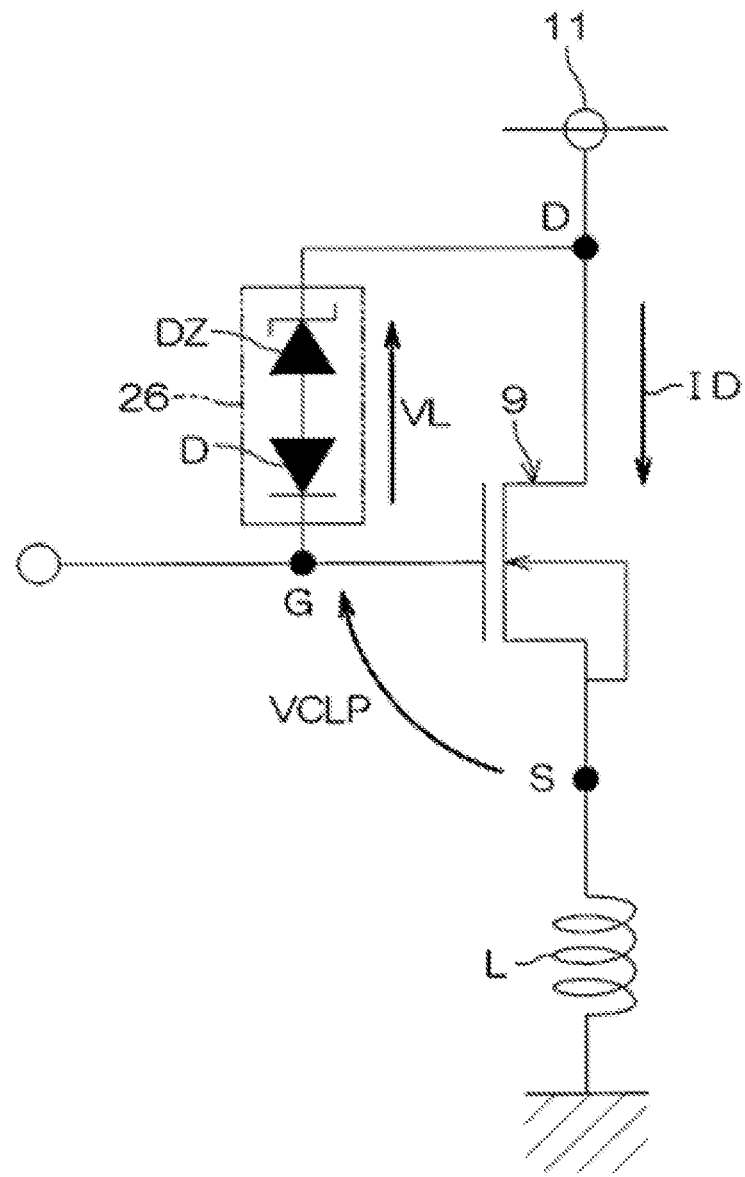
FIG. 3 is a circuit diagram for describing a normal operation and an active clamp operation of the semiconductor device illustrated in FIG. 1.
Figure 4:
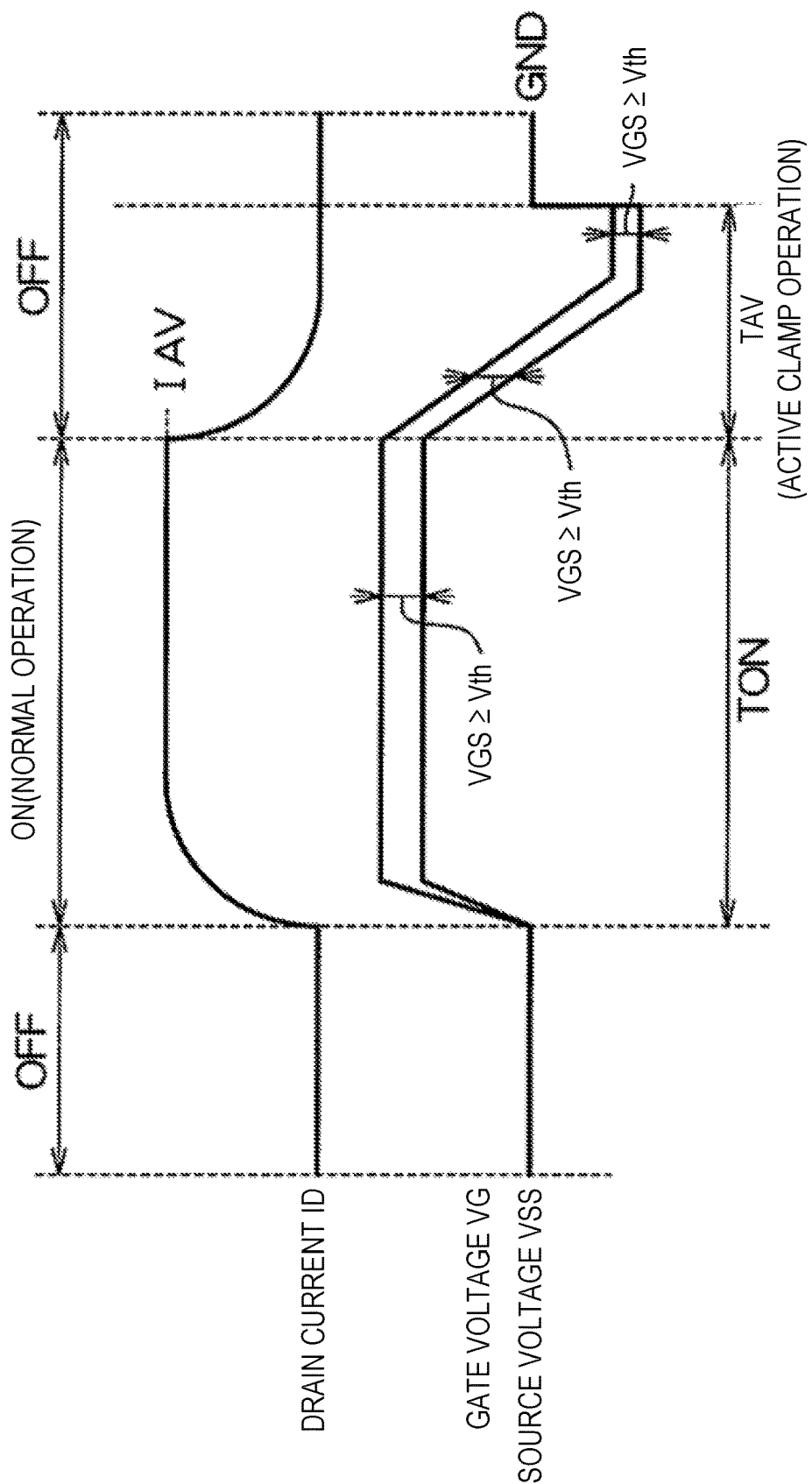
FIG. 4 is a waveform diagram of main electric signals applied to the circuit diagram illustrated in FIG. 3.

FIG. 3 is a circuit diagram for describing an active clamp operation of the semiconductor device 1 illustrated in FIG. 1. FIG. 4 is a waveform diagram of main electric signals of the circuit diagram illustrated in FIG. 3.

Here, using a circuit example in which the power MISFET 9 is connected to an inductive load L, a normal operation and an active clamp operation of the semiconductor device 1 are described. A device using a wiring (coil), such as a solenoid, a motor, a transformer, or a relay, is exemplified as the inductive load L. The inductive load L is also referred to as an L load.

With reference to FIG. 3, the source of the power MISFET 9 is connected to the inductive load L. The drain of the power MISFET 9 is electrically connected to the drain electrode 11. The gate and the drain of the power MISFET 9 are connected to the active clamp circuit 26. In this circuit example, the active clamp circuit 26 includes m zener diodes DZ (m is a natural number) and n pn junction diodes D (n is a natural number). The pn junction diode D is connected in reverse bias to the zener diode DZ.

With reference to FIGS. 3 and 4, when the ON signal Von is input to the gate of the power MISFET 9 in the OFF state, the power MISFET 9 is switched from the OFF state to the ON state (normal operation). The ON signal Von has a voltage more than or equal to the gate threshold voltage Vth (Vth Von). The power MISFET 9 is maintained in the ON state during a predetermined ON time TON.

When the power MISFET 9 is switched to the ON state, the drain current ID starts to flow from the drain to the source of the power MISFET 9. The drain current ID increases from zero to a predetermined value and is saturated. The inductive load L accumulates inductive energy due to an increase in the drain current ID.

When the OFF signal Voff is input to the gate of the power MISFET 9, the power MISFET 9 is switched from the ON state to the OFF state. The OFF signal Voff has a voltage less than the gate threshold voltage Vth (Voff<Vth). The OFF signal Voff may be the reference voltage (e.g. the ground voltage).

In the transition when the power MISFET 9 is switched from the ON state to the OFF state, the power MISFET 9 is applied with the inductive energy of the inductive load L as a counter electromotive force. In this way, the power MISFET 9 becomes an active clamp state (active clamp operation). When the power MISFET 9 becomes the active clamp state, a source voltage VSS rapidly falls to a negative voltage less than the reference voltage (ground voltage).

In this case, due to the operation of the active clamp circuit 26, the source voltage VSS is limited to a voltage more than or equal to the voltage obtained by subtracting a limit voltage VL and a clamp-on voltage VCLP from the power supply voltage VB (VSS≥VB−VL−VCLP).

In other words, when the power MISFET 9 becomes the active clamp state, a drain voltage VDS between drain and source of the power MISFET 9 rapidly rises to a clamp voltage VDSSCL. The clamp voltage VDSSCL is limited by the power MISFET 9 and the active clamp circuit 26 to a voltage less than or equal to the voltage obtained by adding the clamp-on voltage VCLP and the limit voltage VL (VDS≤VCLP+VL).

In this form, the limit voltage VL is the sum voltage of terminal voltage VZ of the zener diodes DZ and terminal voltages VF of the pn junction diodes (VL=m×VZ+n×VF) in the active clamp circuit 26.

The clamp-on voltage VCLP is a positive voltage applied between the gate and the source of the power MISFET 9 (i.e. a gate voltage VGS). The clamp-on voltage VCLP is the gate threshold voltage Vth or more (Vth≤VCLP). Therefore, the power MISFET 9 maintains the ON state in the active clamp state.

If the clamp voltage VDSSCL exceeds a maximum rating drain voltage VDSS (VDSS<VDSSCL), the power MISFET 9 will be broken down. The power MISFET 9 is designed so that the clamp voltage VDSSCL is the maximum rating drain voltage VDSS or less (VDSSCL≤VDSS).

If the clamp voltage VDSSCL is the maximum rating drain voltage VDSS or less (VDSSCL≤VDSS), the drain current ID continuously flows from the drain to the source of the power MISFET 9, and the inductive energy of the inductive load L is consumed (absorbed) in the power MISFET 9.

In an active clamp time TAV, the drain current ID is decreased to zero from a peak value IAV just before the power MISFET 9 is turned off. In this way, the gate voltage VGS becomes the reference voltage (e.g. the ground voltage), and the power MISFET 9 is switched from the ON state to the OFF state.

Active clamp durability Eac of the power MISFET 9 is defined by durability of the power MISFET 9 in the active clamp operation. More specifically, the active clamp durability Eac is defined by durability of the power MISFET 9 against the counter electromotive force, which is generated due to the inductive energy of the inductive load L in the transition of the power MISFET 9 from the ON state to the OFF state.

Still more specifically, the active clamp durability Eac is defined by durability of the power MISFET 9 against energy generated due to the clamp voltage VDSSCL. For instance, the active clamp durability Eac is expressed by the equation of Eac=(VL+VCLP)×ID×TAV, using the limit voltage VL, the clamp-on voltage VCLP, the drain current ID, and the active clamp time TAV.

Figure 5:
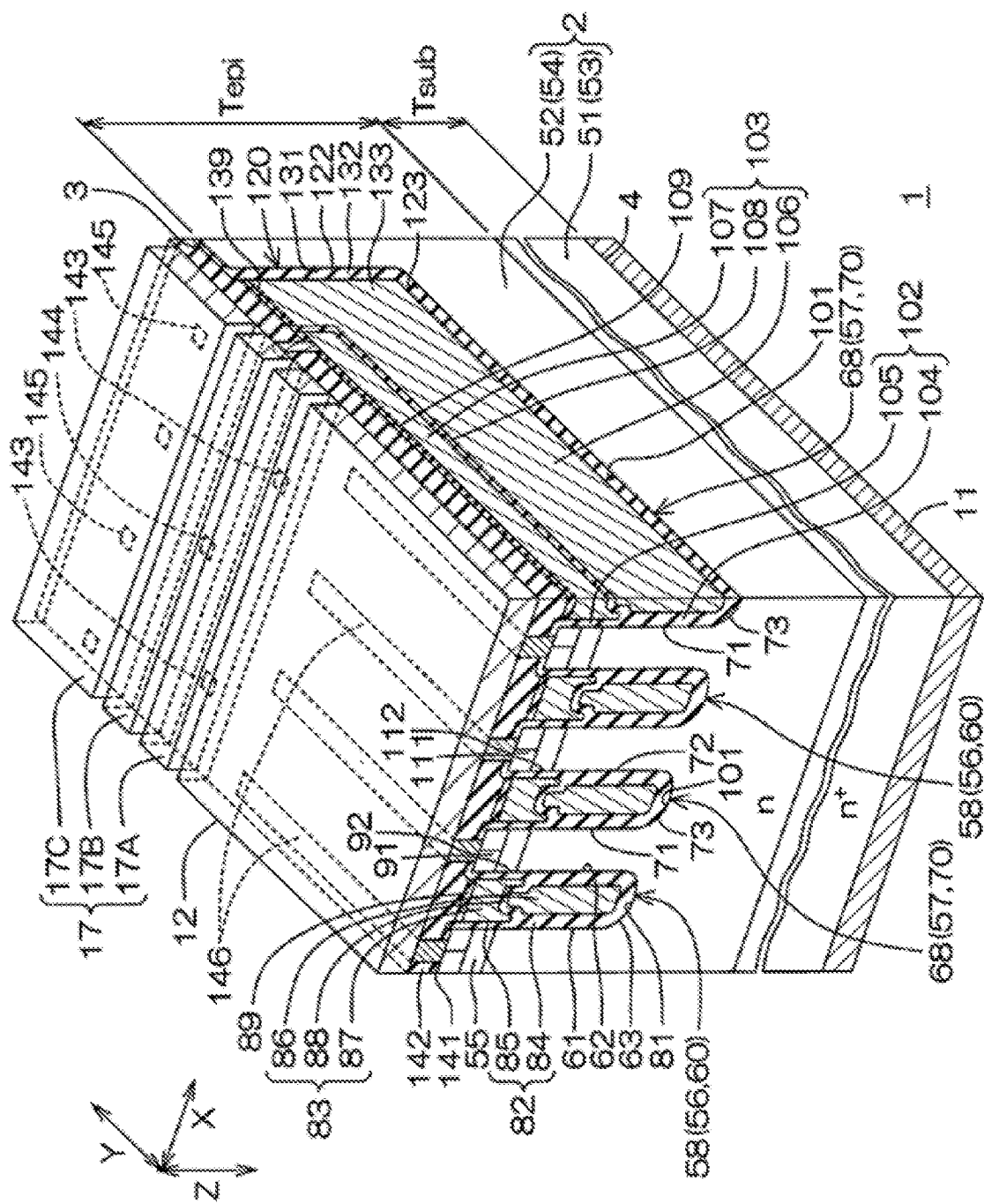
FIG. 5 is a cross-sectional perspective view of a region V illustrated in FIG. 1.
Figure 6:
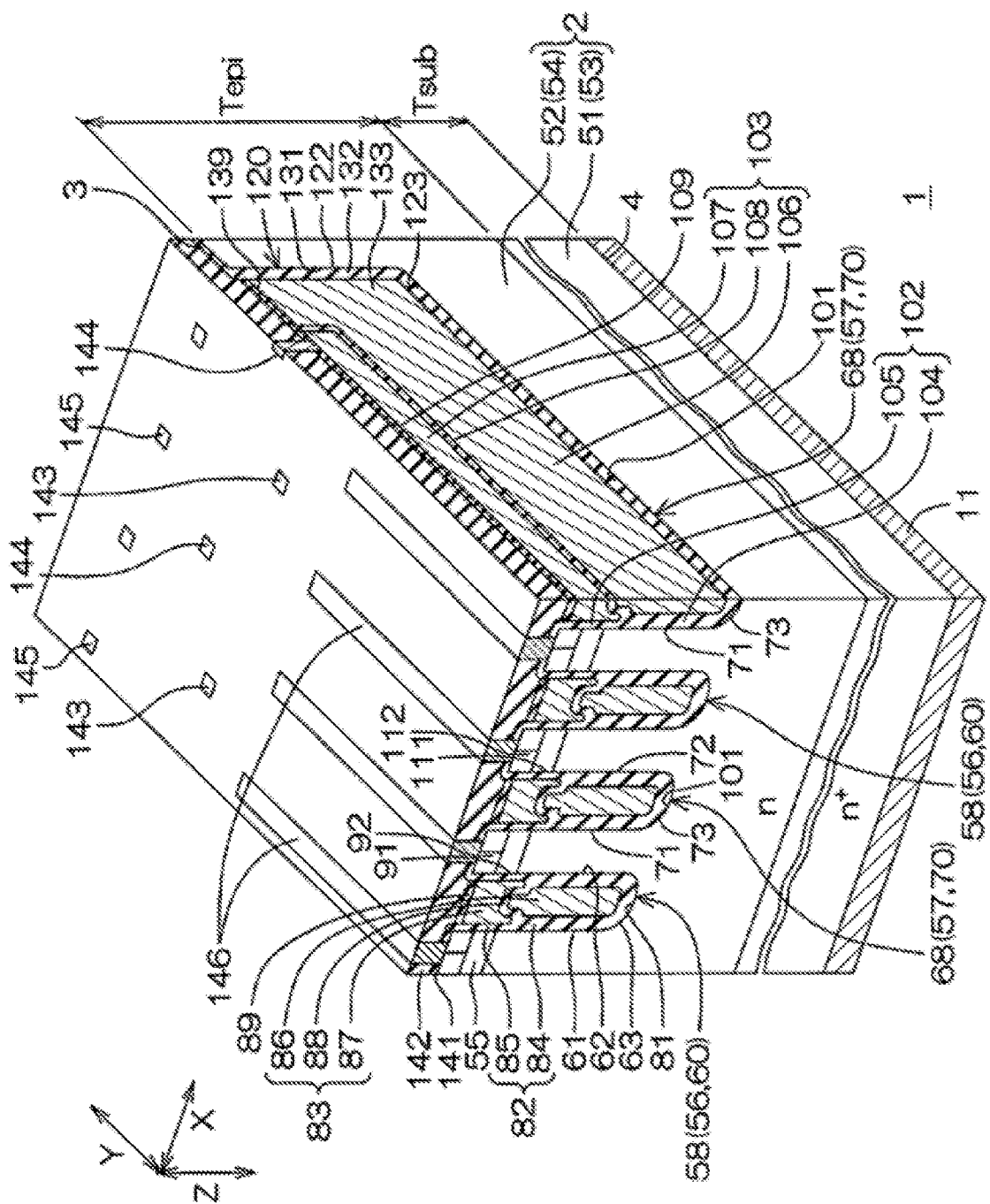
FIG. 6 is a cross-sectional perspective view after removing electrodes from FIG. 5.
Figure 7:
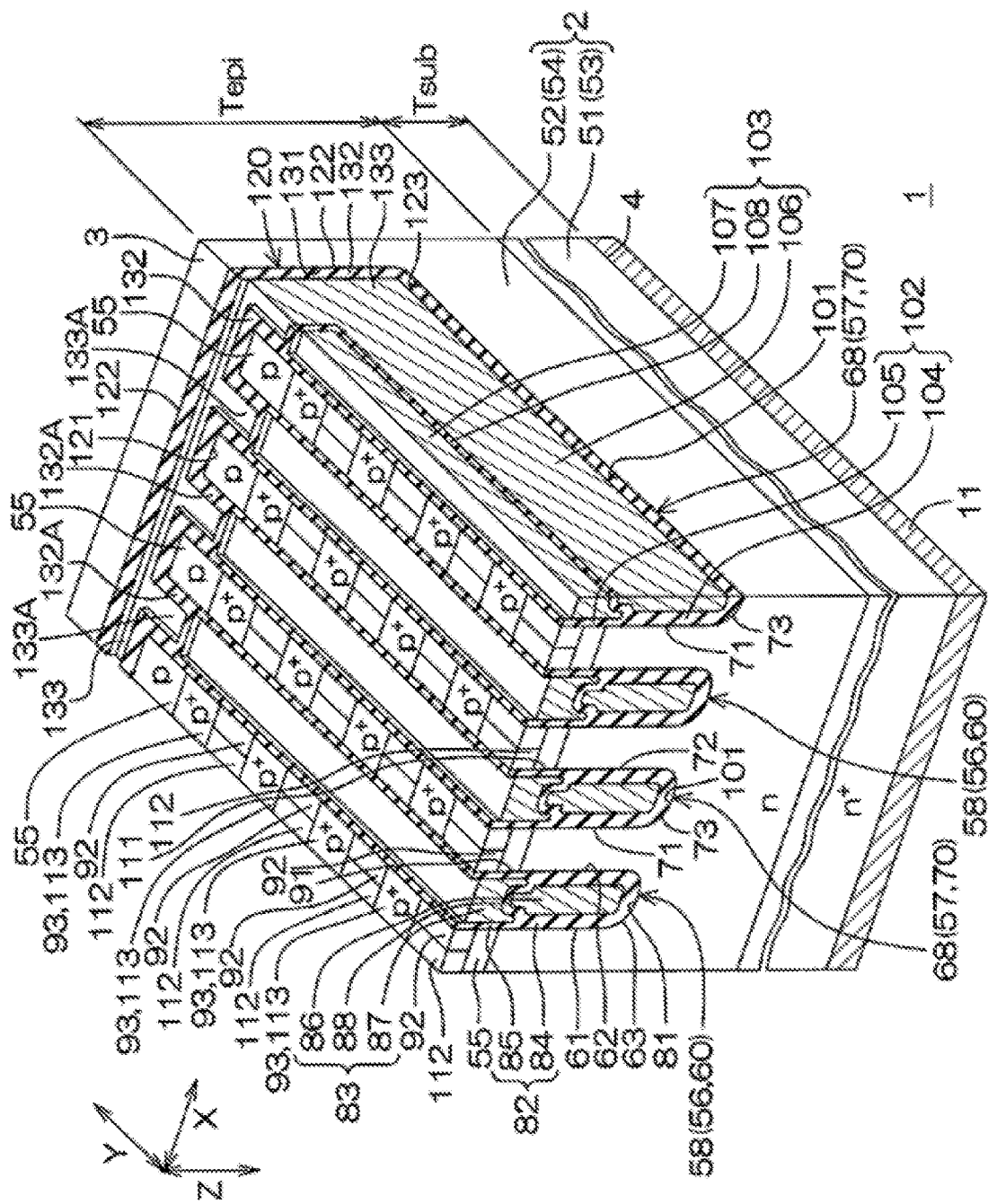
FIG. 7 is a cross-sectional perspective view after removing an upper structure of a semiconductor layer of FIG. 6, and is a cross-sectional perspective view illustrating a form including a channel structure according to a first form example.

FIG. 5 is a cross-sectional perspective view of a region V illustrated in FIG. 1. FIG. 6 is a cross-sectional perspective view after removing the source electrode 12 and the gate control wirings 17 from FIG. 5. FIG. 7 is a cross-sectional perspective view after removing an interlayer insulation layer 142 from FIG. 6, and is a cross-sectional perspective view illustrating a form including a channel structure according to a first form example.

Figure 8:
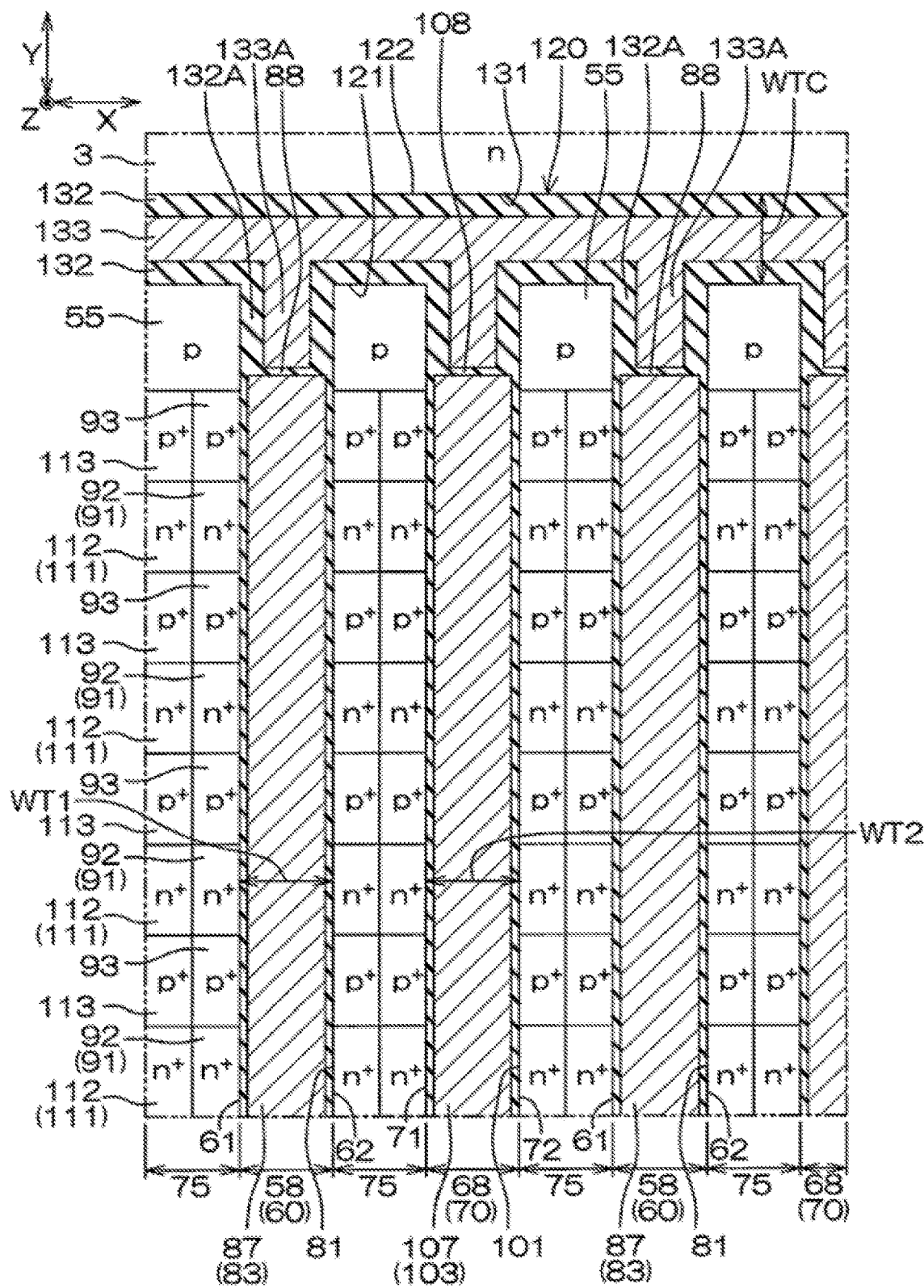
FIG. 8 is a plan view of FIG. 7.
Figure 9:
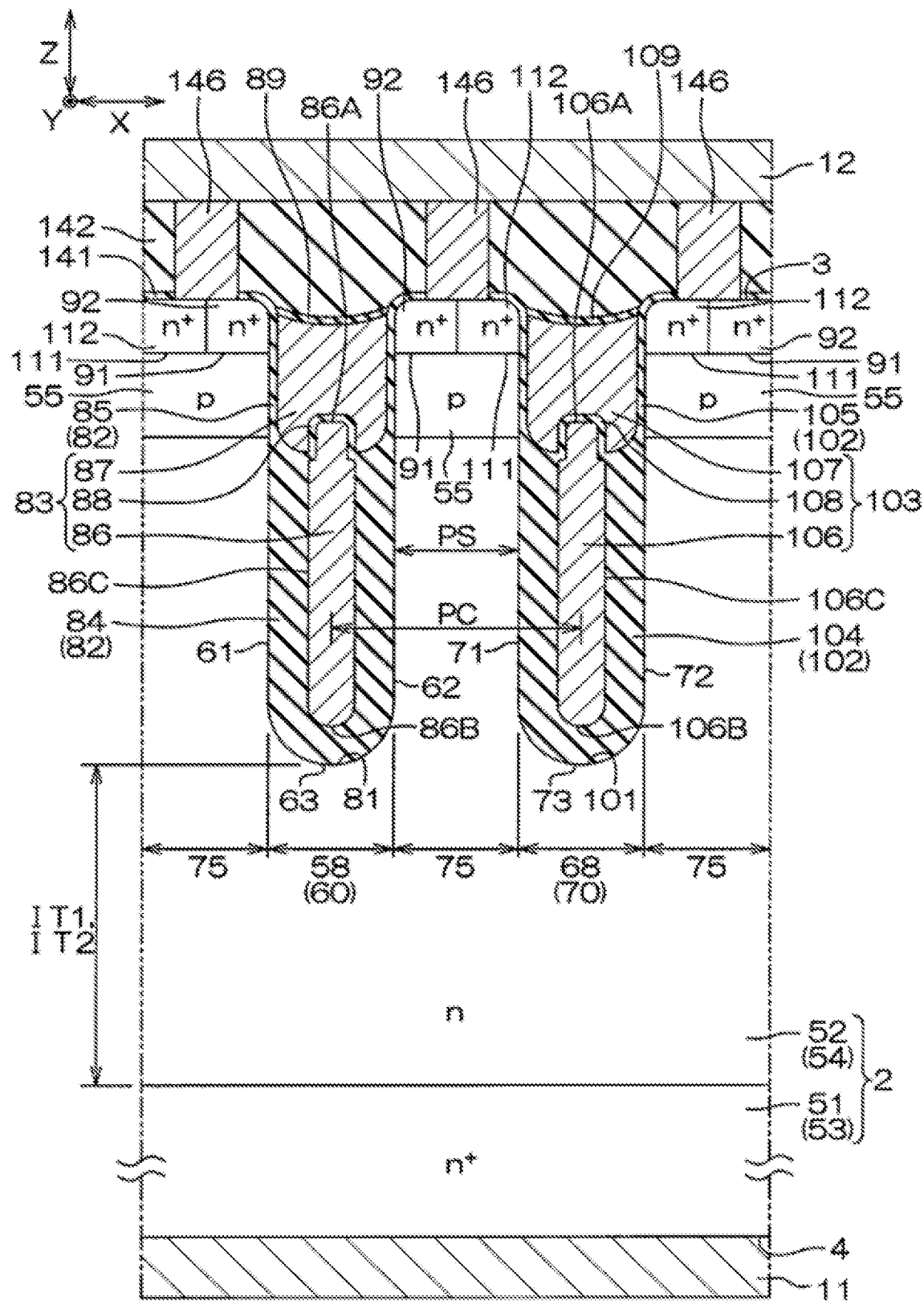
FIG. 9 is an enlarged cross-sectional view of a region including a first trench gate structure and a second trench gate structure of FIG. 5.
Figure 10:
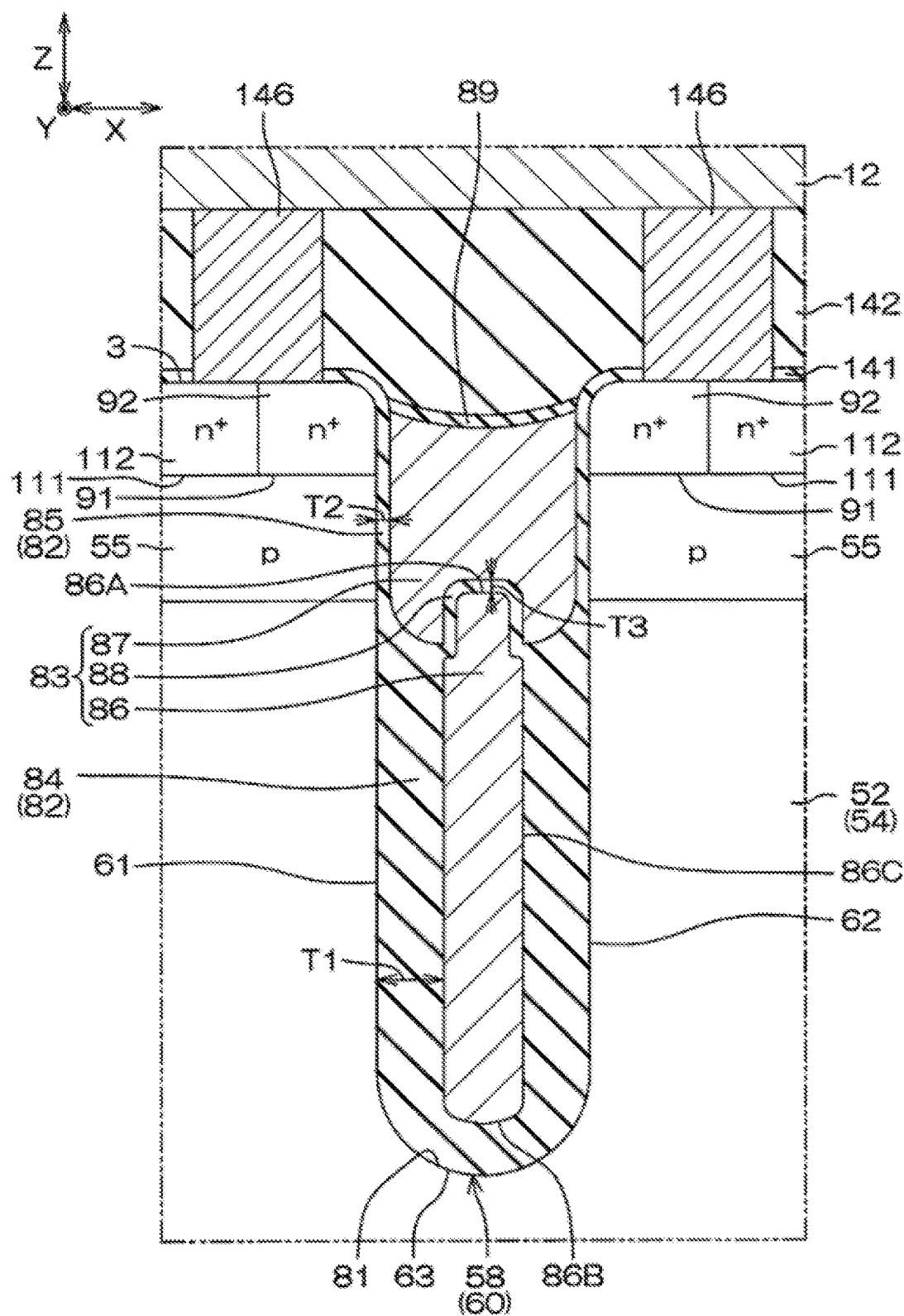
FIG. 10 is an enlarged cross-sectional view of the first trench gate structure illustrated in FIG. 5.
Figure 11:
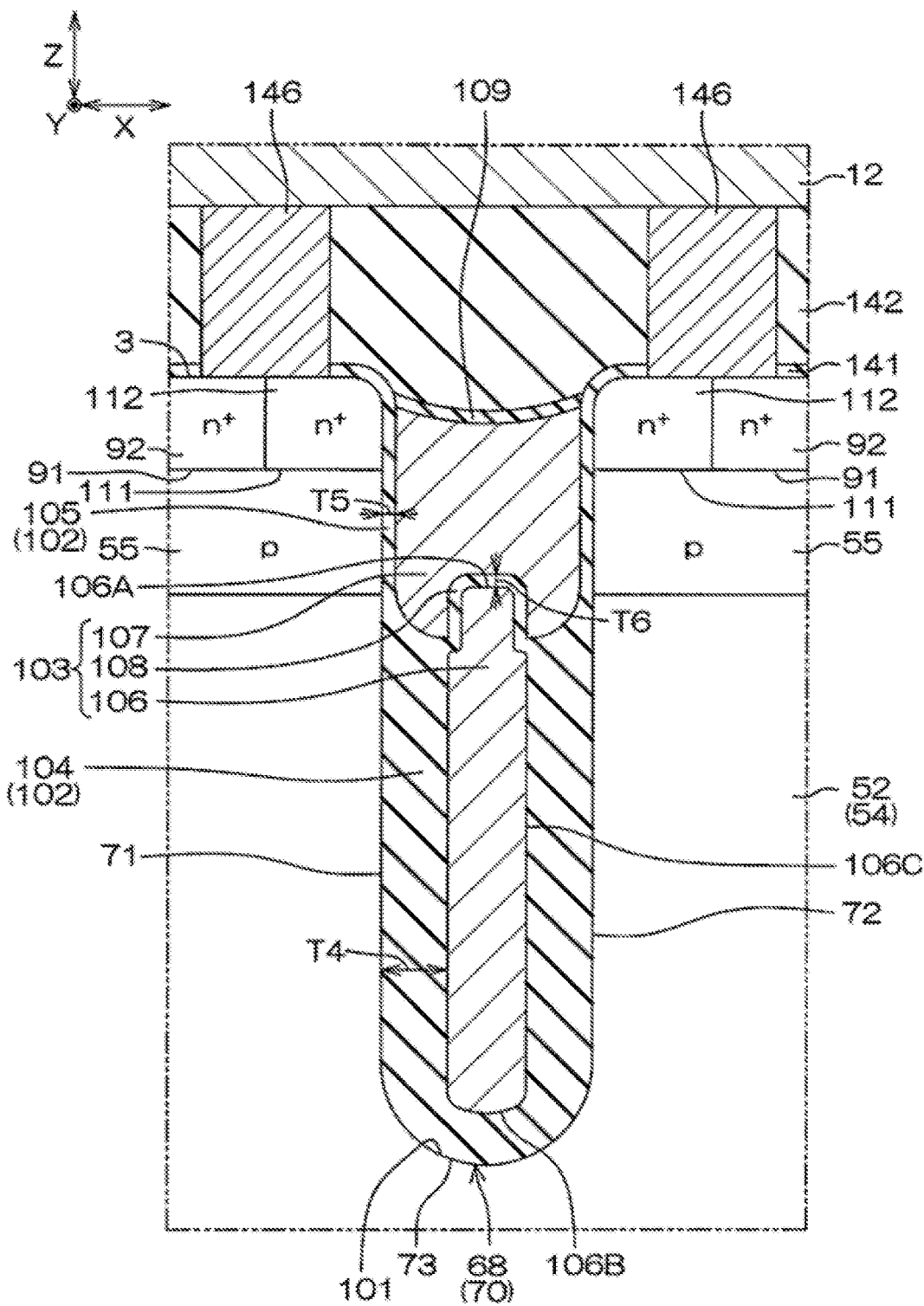
FIG. 11 is an enlarged cross-sectional view of the second trench gate structure illustrated in FIG. 5.

FIG. 8 is a plan view of FIG. 7. FIG. 9 is an enlarged cross-sectional view of a region including a first trench gate structure 60 (first gate structure) and a second trench gate structure 70 (second gate structure), illustrated in FIG. 5. FIG. 10 is an enlarged cross-sectional view of the first trench gate structure 60 illustrated in FIG. 5. FIG. 11 is an enlarged cross-sectional view of the second trench gate structure 70 illustrated in FIG. 5.

With reference to FIGS. 5 to 11, in this form, the semiconductor layer 2 has a multilayer structure including an n⁺ type semiconductor substrate 51 and an n type epitaxial layer 52. The semiconductor substrate 51 forms the second principal surface 4 of the semiconductor layer 2. The epitaxial layer 52 forms the first principal surface 3 of the semiconductor layer 2. The semiconductor substrate 51 and the epitaxial layer 52 form the side surfaces 5A to 5D of the semiconductor layer 2.

The epitaxial layer 52 has an n-type impurity atom concentration less than that of the semiconductor substrate 51. The n-type impurity atom concentration in the semiconductor substrate 51 may be $1\times10^{18}$ cm$^{-3}$ or more and $1\times10^{20}$ cm$^{-3}$ or less. The n-type impurity atom concentration in the epitaxial layer 52 may be $1\times10^{15}$ cm$^{-3}$ or more and $1\times10^{18}$ cm$^{-3}$ or less.

The epitaxial layer 52 has a thickness Tepi less than a thickness Tsub of the semiconductor substrate 51 (Tepi<Tsub). The thickness Tsub may be 50 μm or more and 450 μm or less. The thickness Tsub may be 50 μm or more and 150 μm or less, 150 μm or more and 250 μm or less, 250 μm or more and 350 μm or less, or 350 μm or more and 450 μm or less.

By reducing the thickness Tsub, its resistance can be reduced. The thickness Tsub is adjusted by polishing. In this case, the second principal surface 4 of the semiconductor layer 2 may be a polished surface having polishing marks.

The thickness Tepi of the epitaxial layer 52 is preferably 1/10 or less of the thickness Tsub. The thickness Tepi may be 5 μm or more and 20 μm or less. The thickness Tepi may be 5 μm or more and 10 μm or less, 10 μm or more and 15 μm or less, or 15 μm or more and 20 μm or less. The thickness Tepi is preferably 5 μm or more and 15 μm or less.

The semiconductor substrate 51 is formed as a drain region 53 on the side of the second principal surface 4 of the semiconductor layer 2. The epitaxial layer 52 is formed as a drift region 54 (a drain drift region) in a surface part of the first principal surface 3 of the semiconductor layer 2. A bottom part of the drift region 54 is formed by a boundary between the semiconductor substrate 51 and the epitaxial layer 52. In the following description, the epitaxial layer 52 is referred to as the drift region 54.

In the output region 6, a p-type body region 55 is formed in the surface part of the first principal surface 3 of the semiconductor layer 2. The body region 55 is a region to be a base of the power MISFET 9. A p-type impurity atom concentration in the body region 55 may be $1\times10^{16}$ cm$^{-3}$ or more and $1\times10^{18}$ cm$^{-3}$ or less.

The body region 55 is formed in the surface part of the drift region 54. A bottom part of the body region 55 is formed in a region on the side of the first principal surface 3 with respect to the bottom part of the drift region 54. The body region 55 may have a thickness of 0.5 μm or more and 2 μm or less. The body region 55 may have a thickness of 0.5 μm or more and 1 μm or less, 1 μm or more and 1.5 μm or less, or 1.5 μm or more and 2 μm or less.

The power MISFET 9 includes a first MISFET 56 (first transistor) and a second MISFET 57 (second transistor). The first MISFET 56 is electrically separated from the second MISFET 57 and is independently controlled. The second MISFET 57 is electrically separated from the first MISFET 56 and is independently controlled.

In other words, the power MISFET 9 is configured to be driven when both the first MISFET 56 and the second MISFET 57 are in the ON state (Full-ON control). In addition, the power MISFET 9 is configured to be driven when the first MISFET 56 is in the ON state while the second MISFET 57 is in the OFF state (first Half-ON control). Further, the power MISFET 9 is configured to be driven when the first MISFET 56 is in the OFF state while the second MISFET 57 is in the ON state (second Half-ON control).

In the Full-ON control, the power MISFET 9 is driven in the state where all the current paths are valid. Therefore, on-resistance of the semiconductor layer 2 is relatively reduced. In contrast, in the first Half-ON control or the second Half-ON control, the power MISFET 9 is driven in the state where the current paths are partially invalid. Therefore, on-resistance of the semiconductor layer is relatively increased.

Specifically, the first MISFET 56 includes a plurality of first field effect transistor (FET) structures 58. The plurality of first FET structures 58 are arranged with intervals in the first direction X in a plan view, and each extend in a strip shape in the second direction Y. The plurality of first FET structures 58 are formed in a stripe pattern as a whole in a plan view.

In FIGS. 5 to 8, a region of one end side of the first FET structures 58 is illustrated, while a region of the other end side of the first FET structures 58 is not illustrated. Note that the structure of the region of the other end side of the first FET structures 58 is substantially the same as the structure of the region of one end side of the first FET structures 58. In the following description, the structure of the region of one end side of the first FET structures 58 is exemplified for description, and a description about the structure of the region of the other end side of the first FET structures 58 is omitted.

In this form, each first FET structure 58 includes the first trench gate structure 60. The first trench gate structure 60 may have a first width WT1 of 0.5 μm or more and 5 μm or less. The first width WT1 is a width in a direction (the first direction X) perpendicular to the direction (the second direction Y) in which the first trench gate structure 60 extends.

Note that the first width WT1 may be 0.5 μm or more and 1 μm or less, 1 μm or more and 1.5 μm or less, 1.5 μm or more and 2 μm or less, 2 μm or more and 2.5 μm or less, 2.5 μm or more and 3 μm or less, 3 μm or more and 3.5 μm or less, 3.5 μm or more and 4 μm or less, 4 μm or more and 4.5 μm or less, or 4.5 μm or more and 5 μm or less. The first width WT1 is preferably 0.8 μm or more and 1.2 μm or less.

The first trench gate structure 60 penetrates the body region 55 and reaches the drift region 54. The first trench gate structure 60 may have a first depth DT1 of 1 μm or more and 10 μm or less. The first depth DT1 may be 1 μm or more and 2 μm or less, 2 μm or more and 4 μm or less, 4 μm or more and 6 μm or less, 6 μm or more and 8 μm or less, or 8 µm or more and 10 µm or less. The first depth DT1 is preferably 2 µm or more and 6 µm or less.

The first trench gate structure 60 includes a first side wall 61 on one side, a second side wall 62 on the other side, and a bottom wall 63 that connects the first side wall 61 and the second side wall 62. In the following description, the first side wall 61, the second side wall 62, and the bottom wall 63 may be referred to as an "inner wall" or an "outer wall" as a whole.

In the semiconductor layer 2, the absolute value of the angle (taper angle) between the first side wall 61 and the first principal surface 3 may be more than 90 degrees and 95 degrees or less (e.g. approximately 91 degrees). In the semiconductor layer 2, the absolute value of the angle (taper angle) between the second side wall 62 and the first principal surface 3 may be more than 90 degrees and 95 degrees or less (e.g. approximately 91 degrees). In the cross-sectional view, the first trench gate structure 60 may be formed in a tapered-off shape (taper shape) in which the first width WT1 decreases from the side of the first principal surface 3 to the side of the bottom wall 63.

The bottom wall 63 of the first trench gate structure 60 is positioned in a region on the side of the first principal surface 3 with respect to the bottom part of the drift region 54. The bottom wall 63 of the first trench gate structure 60 is formed in a convex shape (a U-shape) toward the bottom part of the drift region 54.

The bottom wall 63 of the first trench gate structure 60 is positioned in a region on the side of the first principal surface 3 with a first interval IT1 of 1 µm or more and 10 µm or less, with respect to the bottom part of the drift region 54. The first interval IT1 may be 1 µm or more and 2 µm or less, 2 µm or more and 4 µm or less, 4 µm or more and 6 µm or less, 6 µm or more and 8 µm or less, or 8 µm or more and 10 µm or less. The first interval IT1 is preferably 1 µm or more and 5 µm or less.

In this form, the second MISFET 57 includes a plurality of second FET structures 68. In a plan view, the plurality of second FET structures 68 are arranged with intervals in the first direction X, and each extend in a strip shape in the second direction Y.

The plurality of second FET structures 68 extend in the same direction as the plurality of first FET structures 58. The plurality of second FET structures 68 are formed in a stripe pattern as a whole in a plan view. In this form, the plurality of second FET structures 68 are arranged alternately with the plurality of first FET structures 58 so that one first FET structure 58 is sandwiched between the second FET structures 68.

In FIGS. 5 to 8, a region of one end side of the second FET structures 68 is illustrated, while a region of the other end side of the second FET structures 68 is not illustrated. Note that the structure of the region of the other end side of the second FET structures 68 is substantially the same as the structure of the region of one end side of the second FET structures 68. In the following description, the structure of the region of one end side of the second FET structures 68 is exemplified for description, and a description about the structure of the region of the other end side of the second FET structures 68 is omitted.

In this form, each second FET structure 68 includes the second trench gate structure 70. The second trench gate structure 70 may have a second width WT2 of 0.5 µm or more and 5 µm or less. The second width WT2 is a width in a direction (the second direction Y) perpendicular to the direction (the first direction X) in which the second trench gate structure 70 extends.

Note that the second width WT2 may be 0.5 µm or more and 1 µm or less, 1 µm or more and 1.5 µm or less, 1.5 µm or more and 2 µm or less, 2 µm or more and 2.5 µm or less, 2.5 µm or more and 3 µm or less, 3 µm or more and 3.5 µm or less, 3.5 µm or more and 4 µm or less, 4 µm or more and 4.5 µm or less, or 4.5 µm or more and 5 µm or less. The second width WT2 is preferably 0.8 µm or more and 1.2 µm or less.

The second width WT2 of the second trench gate structure 70 may be more than or equal to the first width WT1 of the first trench gate structure 60 (WT1 WT2). The second width WT2 may be less than or equal to the first width WT1 (WT1≥WT2). The second width WT2 is preferably equal to the first width WT1 (WT1=WT2).

The second trench gate structure 70 penetrates the body region 55 and reaches the drift region 54. The second trench gate structure 70 may have a second depth DT2 of 1 µm or more and 10 µm or less. The second depth DT2 may be 1 µm or more and 2 µm or less, 2 µm or more and 4 µm or less, 4 µm or more and 6 µm or less, 6 µm or more and 8 µm or less, or 8 µm or more and 10 µm or less. The second depth DT2 is preferably 2 µm or more and 6 µm or less.

The second depth DT2 of the second trench gate structure 70 may be more than or equal to the first depth DT1 of the first trench gate structure 60 (DT1≤DT2). The second depth DT2 may be less than or equal to the first depth DT1 (DT1≥DT2). Note that the second depth DT2 is preferably equal to the first depth DT1 (DT1=DT2).

The second trench gate structure 70 includes a first side wall 71 on one side, a second side wall 72 on the other side, and a bottom wall 73 that connects the first side wall 71 and the second side wall 72. In the following description, the first side wall 71, the second side wall 72, and the bottom wall 73 may be referred to as an "inner wall" or an "outer wall" as a whole.

In the semiconductor layer 2, the absolute value of the angle (taper angle) between the first side wall 71 and the first principal surface 3 may be more than 90 degrees and 95 degrees or less (e.g. approximately 91 degrees). In the semiconductor layer 2, the absolute value of the angle (taper angle) between the second side wall 72 and the first principal surface 3 may be more than 90 degrees and 95 degrees or less (e.g. approximately 91 degrees). In the cross-sectional view, the second trench gate structure 70 may be formed in a tapered-off shape (taper shape) in which the second width WT2 decreases from the side of the first principal surface 3 to the side of the bottom wall 73.

The bottom wall 73 of the second trench gate structure 70 is positioned in a region on the side of the first principal surface 3 with respect to the bottom part of the drift region 54. The bottom wall 73 of the second trench gate structure 70 is formed in a convex shape (a U-shape) toward the bottom part of the drift region 54.

The bottom wall 73 of the second trench gate structure 70 is positioned in a region on the side of the first principal surface 3 with a second interval IT2 of 1 µm or more and 10 µm or less, with respect to the bottom part of the drift region 54. The second interval IT2 may be 1 µm or more and 2 µm or less, 2 µm or more and 4 µm or less, 4 µm or more and 6 µm or less, 6 µm or more and 8 µm or less, or 8 µm or more and 10 µm or less. The second interval IT2 is preferably 1 µm or more and 5 µm or less.

In regions between the plurality of the first trench gate structures 60 and the plurality of the second trench gate structures 70, cell regions 75 are respectively defined. In a plan view, a plurality of the cell regions 75 are arranged with intervals in the first direction X, and each extend in a strip shape in the second direction Y. The plurality of cell regions 75 extend in the same direction as the first trench gate structure 60 and the second trench gate structure 70. The plurality of cell regions 75 are formed in a stripe pattern as a whole in a plan view.

From the outer wall of the first trench gate structure 60, a first depletion layer extends into the drift region 54. The first depletion layer extends from the outer wall of the first trench gate structure 60 in a direction along the first principal surface 3 and in the normal direction Z. Similarly, from the outer wall of the second trench gate structure 70, a second depletion layer extends into the drift region 54. The second depletion layer extends from the outer wall of the second trench gate structure 70 in a direction along the first principal surface 3 and in the normal direction Z.

The second trench gate structures 70 are arranged with intervals from the first trench gate structures 60 in such a manner that the second depletion layer overlaps the first depletion layer. In other words, the second depletion layer overlaps the first depletion layer in a region on the side of the first principal surface 3 with respect to the bottom wall 73 of the second trench gate structure 70 in the cell region 75. With this structure, concentration of electric field to the first trench gate structure 60 and the second trench gate structure 70 can be suppressed, and hence decrease in breakdown voltage can be suppressed.

The second depletion layer preferably overlaps the first depletion layer in a region on the side of the bottom part of the drift region 54 with respect to the bottom wall 73 of the second trench gate structure 70. With this structure, concentration of electric field to the bottom wall 63 of the first trench gate structure 60 and the bottom wall 73 of the second trench gate structure 70 can be suppressed, and hence decrease in breakdown voltage can be appropriately suppressed.

A pitch PS between the side walls of the first trench gate structure 60 and the second trench gate structure 70 may be 0.2 μm or more and 2 μm or less. The pitch PS is a distance between the first side wall 61 (the second side wall 62) of the first trench gate structure 60 and the second side wall 72 (the first side wall 71) of the second trench gate structure 70, in a direction (the first direction X) perpendicular to a direction (the second direction Y) in which the first trench gate structure 60 and the second trench gate structure 70 extend.

The pitch PS may be 0.2 μm or more and 0.4 μm or less, 0.4 μm or more and 0.6 μm or less, 0.6 μm or more and 0.8 μm or less, 0.8 μm or more and 1.0 μm or less, 1.0 μm or more and 1.2 μm or less, 1.2 μm or more and 1.4 μm or less, 1.4 μm or more and 1.6 μm or less, 1.6 μm or more and 1.8 μm or less, or 1.8 μm or more and 2.0 μm or less. The pitch PS is preferably 0.3 μm or more and 1.5 μm or less.

A pitch PC between centers of the first trench gate structure 60 and the second trench gate structure 70 may be 1 μm or more and 7 μm or less. The pitch PC is a distance between the center of the first trench gate structure 60 and the center of the second trench gate structure 70, in a direction (the first direction X) perpendicular to a direction (the second direction Y) in which the first trench gate structure 60 and the second trench gate structure 70 extend.

Note that the pitch PC may be 1 μm or more and 2 μm or less, 2 μm or more and 3 μm or less, 3 μm or more and 4 μm or less, 4 μm or more and 5 μm or less, 5 μm or more and 6 μm or less, or 6 μm or more and 7 μm or less. The pitch PC is preferably 1 μm or more and 3 μm or less.

With reference to FIGS. 9 and 10, more specifically, the first trench gate structure 60 includes a first gate trench 81, a first insulation layer 82, and a first electrode 83. The first gate trench 81 is formed by digging down the first principal surface 3 toward the second principal surface 4.

The first gate trench 81 defines the first side wall 61, the second side wall 62, and the bottom wall 63 of the first trench gate structure 60. In the following description, the first side wall 61, the second side wall 62, and the bottom wall 63 of the first trench gate structure 60 are also referred to as the first side wall 61, the second side wall 62, and the bottom wall 63 of the first gate trench 81.

The first insulation layer 82 is formed in a film shape along the inner wall of the first gate trench 81. The first insulation layer 82 defines a concave space in the first gate trench 81. A part of the first insulation layer 82 that covers the bottom wall 63 of the first gate trench 81 is formed to follow the bottom wall 63 of the first gate trench 81. In this way, the first insulation layer 82 defines a U-shaped space recessed in a U-shape in the first gate trench 81.

The first insulation layer 82 contains at least one of silicon oxide ($SiO_2$), silicon nitride (SiN), aluminum oxide ($Al_2O_3$), zirconium oxide ($ZrO_2$), and tantalum oxide ($Ta_2O_3$).

The first insulation layer 82 may have a multilayer structure including an SiN layer and an $SiO_2$ layer laminated in order from the side of the semiconductor layer 2. The first insulation layer 82 may have a multilayer structure including an $SiO_2$ layer and an SiN layer laminated in order from the side of the semiconductor layer 2. The first insulation layer 82 may have a single-layer structure of an $SiO_2$ layer or an SiN layer. In this form, the first insulation layer 82 has a single-layer structure of an $SiO_2$ layer.

The first insulation layer 82 includes a first bottom side insulation layer 84 and a first opening side insulation layer 85 formed in order from the side of the bottom wall 63 of the first gate trench 81 toward the side of the first principal surface 3.

The first bottom side insulation layer 84 covers the inner wall on the side of the bottom wall 63 of the first gate trench 81. More specifically, the first bottom side insulation layer 84 covers the inner wall on the side of the bottom wall 63 of the first gate trench 81 with respect to the bottom part of the body region 55. The first bottom side insulation layer 84 defines a U-shaped space on the side of the bottom wall 63 of the first gate trench 81. The first bottom side insulation layer 84 has a smooth inner wall surface that defines the U-shaped space. The first bottom side insulation layer 84 is in contact with the drift region 54. A part of the first bottom side insulation layer 84 may be in contact with the body region 55.

The first opening side insulation layer 85 covers the inner wall on the opening side of the first gate trench 81. More specifically, the first opening side insulation layer 85 covers the first side wall 61 and the second side wall 62 of the first gate trench 81, in a region on the opening side of the first gate trench 81 with respect to the bottom part of the body region 55. The first opening side insulation layer 85 is in contact with the body region 55. A part of the first opening side insulation layer 85 may be in contact with the drift region 54.

The first bottom side insulation layer 84 has a first thickness T1. The first opening side insulation layer 85 has a second thickness T2 less than the first thickness T1 (T2<T1). The first thickness T1 is a thickness in the normal direction of the inner wall of the first gate trench 81 in the first bottom side insulation layer 84. The second thickness T2 is a thickness in the normal direction of the inner wall of the first gate trench 81 in the first opening side insulation layer 85.

Note that a first ratio T1/WT1 of the first thickness T1 to the first width WT1 of the first gate trench 81 may be 0.1 or more and 0.4 or less. In addition, the first ratio T1/WT1 may be 0.1 or more and 0.15 or less, 0.15 or more and 0.2 or less, 0.2 or more and 0.25 or less, 0.25 or more and 0.3 or less, 0.3 or more and 0.35 or less, or 0.35 or more and 0.4 or less. The first ratio T1/WT1 is preferably 0.25 or more and 0.35 or less.

Note that the first thickness T1 of the first bottom side insulation layer 84 may be 1500 angstroms or more and 4000 angstroms or less. The first thickness T1 may be 1500 angstroms or more and 2000 angstroms or less, 2000 angstroms or more and 2500 angstroms or less, 2500 angstroms or more and 3000 angstroms or less, 3000 angstroms or more and 3500 angstroms or less, or 3500 angstroms or more and 4000 angstroms or less. The first thickness T1 is preferably 1800 angstroms or more and 3500 angstroms or less.

The first thickness T1 may be adjusted to 4000 angstroms or more and 12000 angstroms or less in accordance with the first width WT1 of the first gate trench 81. The first thickness T1 may be 4000 angstroms or more and 5000 angstroms or less, 5000 angstroms or more and 6000 angstroms or less, 6000 angstroms or more and 7000 angstroms or less, 7000 angstroms or more and 8000 angstroms or less, 8000 angstroms or more and 9000 angstroms or less, 9000 angstroms or more and 10000 angstroms or less, 10000 angstroms or more and 11000 angstroms or less, or 11000 angstroms or more and 12000 angstroms or less. In this case, withstand voltage of the semiconductor device 1 can be improved by increasing the thickness of the first bottom side insulation layer 84.

The second thickness T2 of the first opening side insulation layer 85 may be $1/100$ or more and $1/10$ or less of the first thickness T1 of the first bottom side insulation layer 84. The second thickness T2 may be 100 angstroms or more and 500 angstroms or less. The second thickness T2 may be 100 angstroms or more and 200 angstroms or less, 200 angstroms or more and 300 angstroms or less, 300 angstroms or more and 400 angstroms or less, or 400 angstroms or more and 500 angstroms or less. The second thickness T2 is preferably 200 angstroms or more and 400 angstroms or less.

The first bottom side insulation layer 84 is formed so that the first thickness T1 decreases from a part covering the first side wall 61 and the second side wall 62 of the first gate trench 81 to a part covering the bottom wall 63 of the first gate trench 81.

The thickness of a part of the first bottom side insulation layer 84, the part covering the bottom wall 63 of the first gate trench 81, is less than the thickness of a part of the first bottom side insulation layer 84, the part covering the first side wall 61 and the second side wall 62 of the first gate trench 81. The bottom wall side opening width of the U-shaped space defined by the first bottom side insulation layer 84 is expanded corresponding to the decrease in the first thickness T1. In this way, the tapered-off shape of the U-shaped space is suppressed. For instance, this U-shaped space is formed by an etching method (e.g. a wet etching method) of the inner wall of the first bottom side insulation layer 84.

The first electrode 83 is embedded in the first gate trench 81 via the first insulation layer 82. The first electrode 83 is applied with first gate control signals (first control signals) including the ON signal Von and the OFF signal Voff. In this form, the first electrode 83 has an insulation separation type split electrode structure, which includes a first bottom side electrode 86, a first opening side electrode 87, and a first intermediate insulation layer 88.

The first bottom side electrode 86 is embedded in the first gate trench 81 on the side of the bottom wall 63 via the first insulation layer 82. More specifically, the first bottom side electrode 86 is embedded in the first gate trench 81 on the side of the bottom wall 63 via the first bottom side insulation layer 84. The first bottom side electrode 86 faces the drift region 54 via the first bottom side insulation layer 84. A part of the first bottom side electrode 86 may face the body region 55 via the first bottom side insulation layer 84.

The first bottom side electrode 86 includes a first top end part 86A, a first bottom end part 86B, and a first wall part 86C. The first top end part 86A is positioned on the opening side of the first gate trench 81. The first bottom end part 86B is positioned on the side of the bottom wall 63 of the first gate trench 81. The first wall part 86C connects the first top end part 86A and the first bottom end part 86B, and extends like a wall along the inner wall of the first gate trench 81.

The first top end part 86A is exposed from the first bottom side insulation layer 84. The first top end part 86A is protruded to the side of the first principal surface 3 with respect to the first bottom side insulation layer 84. In this way, the first bottom side electrode 86 defines a reverse concave recess in the cross-sectional view, between the first bottom side insulation layer 84 and the first opening side insulation layer 85 on the opening side of the first gate trench 81. The first top end part 86A has a width less than that of the first wall part 86C.

The first bottom end part 86B is formed in a convex shape toward the bottom wall 63 of the first gate trench 81. More specifically, the first bottom end part 86B is formed to follow the bottom wall of the U-shaped space defined by the first bottom side insulation layer 84, and is formed in a smooth convex shape toward the bottom wall 63 of the first gate trench 81.

With this structure, local electric field concentration to the first bottom side electrode 86 can be suppressed, and hence decrease in breakdown voltage can be suppressed. In particular, the first bottom side electrode 86 is embedded in the expanded U-shaped space of the first bottom side insulation layer 84, and hence that the first bottom side electrode 86 becomes a tapered-off shape from the first top end part 86A toward the first bottom end part 86B can be appropriately suppressed. In this way, local electric field concentration to the first bottom end part 86B of the first bottom side electrode 86 can be appropriately suppressed.

The first bottom side electrode 86 may contain at least one of conductive polysilicon, tungsten, aluminum, copper, aluminum alloy, and copper alloy. In this form, the first bottom side electrode 86 contains conductive polysilicon. The conductive polysilicon may contain an n-type impurity or a p-type impurity. Note that the conductive polysilicon preferably contains an n-type impurity.

The first opening side electrode 87 is embedded in the first gate trench 81 on the opening side via the first insulation layer 82. More specifically, the first opening side electrode 87 is embedded in the reverse concave recess defined on the opening side of the first gate trench 81 via the first opening side insulation layer 85. The first opening side electrode 87 faces the body region 55 via the first opening side insulation layer 85. A part of the first opening side electrode 87 may face the drift region 54 via the first opening side insulation layer 85.

The first opening side electrode 87 may contain at least one of conductive polysilicon, tungsten, aluminum, copper, aluminum alloy, and copper alloy. The first opening side electrode 87 preferably contains the same type of conductive material as the first bottom side electrode 86. In this form, the first opening side electrode 87 contains conductive polysilicon. The conductive polysilicon may contain an n-type impurity or a p-type impurity. The conductive polysilicon preferably contains an n-type impurity.

The first intermediate insulation layer 88 is disposed between the first bottom side electrode 86 and the first opening side electrode 87, so as to electrically insulate between the first bottom side electrode 86 and the first opening side electrode 87. More specifically, the first intermediate insulation layer 88 covers the first bottom side electrode 86 that is exposed from the first bottom side insulation layer 84, in a region between the first bottom side electrode 86 and the first opening side electrode 87. The first intermediate insulation layer 88 covers the first top end part 86A (more specifically, a protruding part) of the first bottom side electrode 86. The first intermediate insulation layer 88 is continuous to the first insulation layer 82 (the first bottom side insulation layer 84).

The first intermediate insulation layer 88 has a third thickness T3. The third thickness T3 is less than the first thickness T1 of the first bottom side insulation layer 84 (T3<T1). The third thickness T3 may be 1/100 or more and 1/10 or less of the first thickness T1. The third thickness T3 may be 100 angstroms or more and 500 angstroms or less. The third thickness T3 may be 100 angstroms or more and 200 angstroms or less, 200 angstroms or more and 300 angstroms or less, 300 angstroms or more and 400 angstroms or less, or 400 angstroms or more and 500 angstroms or less. The third thickness T3 is preferably 200 angstroms or more and 400 angstroms or less.

The first intermediate insulation layer 88 contains at least one of silicon oxide ($SiO_2$), silicon nitride (SiN), aluminum oxide ($Al_2O_3$), zirconium oxide ($ZrO_2$), and tantalum oxide ($Ta_2O_3$). In this form, the first intermediate insulation layer 88 has a single-layer structure of an $SiO_2$ layer.

In this form, an exposed part of the first opening side electrode 87, which is exposed from the first gate trench 81, is positioned in the first gate trench 81 on the bottom wall 63 with respect to the first principal surface 3. The exposed part of the first opening side electrode 87 is formed in a curved shape toward the bottom wall 63 of the first gate trench 81.

The exposed part of the first opening side electrode 87 is covered with a first cap insulation layer 89 formed in a film shape. The first cap insulation layer 89 is continuous to the first insulation layer 82 (the first opening side insulation layer 85) in the first gate trench 81. The first cap insulation layer 89 may contain silicon oxide ($SiO_2$).

Each first FET structure 58 further includes a p-type first channel region 91 (a first channel). The first channel region 91 is formed in a region facing the first electrode 83 (the first opening side electrode 87) via the first insulation layer 82 (the first opening side insulation layer 85) in the body region 55.

The first channel region 91 is formed along the first side wall 61 or the second side wall 62 of the first trench gate structure 60, or along the first side wall 61 and the second side wall 62. In this form, the first channel region 91 is formed along the first side wall 61 and the second side wall 62 of the first trench gate structure 60.

Each first FET structure 58 further includes an $n^+$ type first source region 92 formed in a surface part of the body region 55. The first source region 92 defines the first channel region 91 between itself and the drift region 54 in the body region 55. The n-type impurity atom concentration in the first source region 92 exceeds the n-type impurity atom concentration in the drift region 54. The n-type impurity atom concentration in the first source region 92 may be $1\times10^{19}$ $cm^{-3}$ or more and $1\times10^{21}$ $cm^{-3}$ or less.

In this form, each first FET structure 58 includes a plurality of the first source regions 92. The plurality of the first source regions 92 are formed with intervals along the first trench gate structure 60 in the surface part of the body region 55. More specifically, the plurality of first source regions 92 are formed along the first side wall 61 or the second side wall 62 of the first trench gate structure 60, or along the first side wall 61 and the second side wall 62. In this form, the plurality of first source regions 92 are formed with intervals along the first side wall 61 and the second side wall 62 of the first trench gate structure 60.

Bottom parts of the plurality of first source regions 92 are positioned in a region on the side of the first principal surface 3 with respect to the bottom part of the body region 55. In this way, the plurality of first source regions 92 face the first electrode 83 (the first opening side electrode 87) via the first insulation layer 82 (the first opening side insulation layer 85). In this way, the first channel region 91 of the first MISFET 56 is formed in a region sandwiched between the drift region 54 and the plurality of first source regions 92 in the body region 55.

Each first FET structure 58 further includes a $p^+$ type first contact region 93 formed in the surface part of the body region 55. A p-type impurity atom concentration in the first contact region 93 exceeds that in the body region 55. For instance, the p-type impurity atom concentration in the first contact region 93 may be $1\times10^{19}$ $cm^{-3}$ or more and $1\times10^{21}$ $cm^{-3}$ or less.

In this form, each first FET structure 58 includes a plurality of the first contact regions 93. The plurality of first contact regions 93 are formed with intervals along the first trench gate structure 60 in the surface part of the body region 55. More specifically, the plurality of first contact regions 93 are formed along the first side wall 61 or the second side wall 62 of the first trench gate structure 60, or along the first side wall 61 and the second side wall 62.

In this form, the plurality of first contact regions 93 are formed with intervals along the first side wall 61 and the second side wall 62 of the first trench gate structure 60. More specifically, the plurality of first contact regions 93 are formed in the surface part of the body region 55 so as to be arranged alternately with the plurality of first source regions 92. Bottom parts of the plurality of first contact regions 93 are positioned in a region on the side of the first principal surface 3 with respect to the bottom part of the body region 55.

With reference to FIGS. 9 and 11, the second trench gate structure 70 includes a second gate trench 101, a second insulation layer 102, and a second electrode 103. The second gate trench 101 is formed by digging down the first principal surface 3 toward the second principal surface 4.

The second gate trench 101 defines the first side wall 71, the second side wall 72, and the bottom wall 73 of the second trench gate structure 70. In the following description, the first side wall 71, the second side wall 72, and the bottom wall 73 of the second trench gate structure 70 are also referred to as the first side wall 71, the second side wall 72, and the bottom wall 73 of the second gate trench 101.

The second insulation layer 102 is formed in a film shape along the inner wall of the second gate trench 101. The second insulation layer 102 defines a concave space in the second gate trench 101. A part of the second insulation layer 102 covering the bottom wall 73 of the second gate trench 101 is formed to follow the bottom wall 73 of the second gate trench 101. In this way, the second insulation layer 102 defines a U-shaped space recessed in a U-shape in the second gate trench 101.

The second insulation layer 102 contains at least one of silicon oxide ($SiO_2$), silicon nitride (SiN), aluminum oxide ($Al_2O_3$), zirconium oxide ($ZrO_2$), and tantalum oxide ($Ta_2O_3$).

The second insulation layer 102 may have a multilayer structure including an SiN layer and an $SiO_2$ layer laminated in order from the side of the semiconductor layer 2. The second insulation layer 102 may have a multilayer structure including an $SiO_2$ layer and an SiN layer laminated in order from the side of the semiconductor layer 2. The second insulation layer 102 may have a single-layer structure of an $SiO_2$ layer or an SiN layer. In this form, the second insulation layer 102 has a single-layer structure of an $SiO_2$ layer.

The second insulation layer 102 includes a second bottom side insulation layer 104 and a second opening side insulation layer 105 formed in order from the side of the bottom wall 73 of the second gate trench 101 to the side of the first principal surface 3.

The second bottom side insulation layer 104 covers the inner wall of the second gate trench 101 on the side of the bottom wall 73. More specifically, the second bottom side insulation layer 104 covers the inner wall of the second gate trench 101 on the side of the bottom wall 73 with respect to the bottom part of the body region 55. The second bottom side insulation layer 104 defines a U-shaped space on the side of the bottom wall 73 of the second gate trench 101. The second bottom side insulation layer 104 has a smooth inner wall surface that defines the U-shaped space. The second bottom side insulation layer 104 is in contact with the drift region 54. A part of the second bottom side insulation layer 104 may be in contact with the body region 55.

The second opening side insulation layer 105 covers an opening side inner wall of the second gate trench 101. More specifically, the second opening side insulation layer 105 covers the first side wall 71 and the second side wall 72 of the second gate trench 101 in a region on the opening side of the second gate trench 101 with respect to the bottom part of the body region 55. The second opening side insulation layer 105 is in contact with the body region 55. A part of the second opening side insulation layer 105 may be in contact with the drift region 54.

The second bottom side insulation layer 104 has a fourth thickness T4. The second opening side insulation layer 105 has a fifth thickness T5 less than the fourth thickness T4 (T5<T4). The fourth thickness T4 is a thickness of the second bottom side insulation layer 104 in the normal direction of the inner wall of the second gate trench 101. The fifth thickness T5 is a thickness of the second opening side insulation layer 105 in the normal direction of the inner wall of the second gate trench 101.

A second ratio T4/WT2 of the fourth thickness T4 to the second width WT2 of the second gate trench 101 may be 0.1 or more and 0.4 or less. For instance, the second ratio T4/WT2 may be 0.1 or more and 0.15 or less, 0.15 or more and 0.2 or less, 0.2 or more and 0.25 or less, 0.25 or more and 0.3 or less, 0.3 or more and 0.35 or less, or 0.35 or more and 0.4 or less. The second ratio T4/WT2 is preferably 0.25 or more and 0.35 or less.

The second ratio T4/WT2 may be less than or equal to the first ratio T1/WT1 (T4/WT2 T1/WT1). The second ratio T4/WT2 may be more than or equal to the first ratio T1/WT1 (T4/WT2 T1/WT1). In addition, the second ratio T4/WT2 may be equal to the first ratio T1/WT1 (T4/WT2=T1/WT1).

The fourth thickness T4 of the second bottom side insulation layer 104 may be 1500 angstroms or more and 4000 angstroms or less. The fourth thickness T4 may be 1500 angstroms or more and 2000 angstroms or less, 2000 angstroms or more and 2500 angstroms or less, 2500 angstroms or more and 3000 angstroms or less, 3000 angstroms or more and 3500 angstroms or less, or 3500 angstroms or more and 4000 angstroms or less. The fourth thickness T4 is preferably 1800 angstroms or more and 3500 angstroms or less.

The fourth thickness T4 may be 4000 angstroms or more and 12000 angstroms or less in accordance with the second width WT2 of the second gate trench 101. The fourth thickness T4 may be 4000 angstroms or more and 5000 angstroms or less, 5000 angstroms or more and 6000 angstroms or less, 6000 angstroms or more and 7000 angstroms or less, 7000 angstroms or more and 8000 angstroms or less, 8000 angstroms or more and 9000 angstroms or less, 9000 angstroms or more and 10000 angstroms or less, 10000 angstroms or more and 11000 angstroms or less, or 11000 angstroms or more and 12000 angstroms or less. In this case, withstand voltage of the semiconductor device 1 can be improved by increasing the thickness of the second bottom side insulation layer 104.

The fourth thickness T4 may be less than or equal to the first thickness T1 (T4≤T1). The fourth thickness T4 may be more than or equal to the first thickness T1 or (T4≥T1). The fourth thickness T4 may be equal to the first thickness T1 (T4=T1).

The fifth thickness T5 of the second opening side insulation layer 105 is less than the fourth thickness T4 of the second bottom side insulation layer 104 (T5<T4). The fifth thickness T5 may be 1/100 or more and 1/10 or less of the fourth thickness T4. It may be 100 angstroms or more and 500 angstroms or less. The fifth thickness T5 may be 100 angstroms or more and 200 angstroms or less, 200 angstroms or more and 300 angstroms or less, 300 angstroms or more and 400 angstroms or less, or 400 angstroms or more and 500 angstroms or less. The fifth thickness T5 is preferably 200 angstroms or more and 400 angstroms or less.

The fifth thickness T5 may be less than or equal to the second thickness T2 (T5 T2). The fifth thickness T5 may be more than or equal to the second thickness T2 (T5 T2). The fifth thickness T5 may be equal to the second thickness T2 (T5=T2).

The second bottom side insulation layer 104 is formed so that the fourth thickness T4 decreases from a part covering the first side wall 71 and the second side wall 72 of the second gate trench 101 to a part covering the bottom wall 73 of the second gate trench 101.

The thickness of a part of the second bottom side insulation layer 104, the part covering the bottom wall 73 of the second gate trench 101, is less than a thickness of a part of the second bottom side insulation layer 104, the part covering the first side wall 71 and the second side wall 72 of the second gate trench 101. The bottom wall side opening width of the U-shaped space defined by the second bottom side insulation layer 104 is expanded corresponding to the decrease in the fourth thickness T4. In this way, the tapered-off shape of the U-shaped space is suppressed. For instance, this U-shaped space is formed by an etching method (e.g. a wet etching method) of the inner wall of the second bottom side insulation layer 104.

The second electrode 103 is embedded in the second gate trench 101 via the second insulation layer 102. The second electrode 103 is applied with predetermined second gate control signals (second control signals) including the ON signal Von and the OFF signal Voff.

In this form, the second electrode 103 has an insulation separation type split electrode structure, which includes a second bottom side electrode 106, a second opening side electrode 107, and a second intermediate insulation layer 108. In this form, the second bottom side electrode 106 is electrically connected to the first bottom side electrode 86. The second opening side electrode 107 is electrically insulated from the first opening side electrode 87.

The second bottom side electrode 106 is embedded in the second gate trench 101 on the side of the bottom wall 73 via the second insulation layer 102. More specifically, the second bottom side electrode 106 is embedded in the second gate trench 101 on the side of the bottom wall 73 via the second bottom side insulation layer 104. The second bottom side electrode 106 faces the drift region 54 via the second bottom side insulation layer 104. A part of the second bottom side electrode 106 may face the body region 55 via the second bottom side insulation layer 104.

The second bottom side electrode 106 includes a second top end part 106A, a second bottom end part 106B, and a second wall part 106C. The second top end part 106A is positioned on the opening side of the second gate trench 101. The second bottom end part 106B is positioned on the side of the bottom wall 73 of the second gate trench 101. The second wall part 106C connects the second top end part 106A and the second bottom end part 106B, and extends like a wall along the inner wall of the second gate trench 101.

The second top end part 106A is exposed from the second bottom side insulation layer 104. The second top end part 106A is protruded from the second bottom side insulation layer 104 to the side of the first principal surface 3. In this way, the second bottom side electrode 106 defines a reverse concave recess in the cross-sectional view, between the second bottom side insulation layer 104 and the second opening side insulation layer 105 on the opening side of the second gate trench 101. The second top end part 106A has a width less than that of the second wall part 106C.

The second bottom end part 106B is formed in a convex shape toward the bottom wall 73 of the second gate trench 101. More specifically, the second bottom end part 106B is formed to follow the bottom wall of the U-shaped space defined by the second bottom side insulation layer 104, and is formed in a smooth convex shape toward the bottom wall 73 of the second gate trench 101.

With this structure, local electric field concentration to the second bottom side electrode 106 can be suppressed, and hence decrease in breakdown voltage can be suppressed. In particular, the second bottom side electrode 106 is embedded in the expanded U-shaped space of the second bottom side insulation layer 104, and hence that the second bottom side electrode 106 becomes a tapered-off shape from the second top end part 106A to the second bottom end part 106B can be appropriately suppressed. In this way, local electric field concentration to the second bottom end part 106B of the second bottom side electrode 106 can be appropriately suppressed.

The second bottom side electrode 106 may contain at least one of conductive polysilicon, tungsten, aluminum, copper, aluminum alloy and copper alloy. In this form, the second bottom side electrode 106 contains conductive polysilicon. The conductive polysilicon may contain an n-type impurity or a p-type impurity. The conductive polysilicon preferably contains an n-type impurity.

The second opening side electrode 107 is embedded in the second gate trench 101 on the opening side via the second insulation layer 102. More specifically, the second opening side electrode 107 is embedded in the reverse concave recess defined on the opening side of the second gate trench 101 via the second opening side insulation layer 105. The second opening side electrode 107 faces the body region 55 via the second opening side insulation layer 105. A part of the second opening side electrode 107 may face the drift region 54 via the second opening side insulation layer 105.

The second opening side electrode 107 may contain at least one of conductive polysilicon, tungsten, aluminum, copper, aluminum alloy, and copper alloy. The second opening side electrode 107 preferably contains the same type of conductive material as the second bottom side electrode 106. In this form, the second opening side electrode 107 contains conductive polysilicon. The conductive polysilicon may contain an n-type impurity or a p-type impurity. The conductive polysilicon preferably contains an n-type impurity.

The second intermediate insulation layer 108 is disposed between the second bottom side electrode 106 and the second opening side electrode 107, so as to electrically insulate between the second bottom side electrode 106 and the second opening side electrode 107. More specifically, the second intermediate insulation layer 108 covers the second bottom side electrode 106 that is exposed form the second bottom side insulation layer 104 in a region between the second bottom side electrode 106 and the second opening side electrode 107. The second intermediate insulation layer 108 covers the second top end part 106A of the second bottom side electrode 106 (more specifically, the protruding part). The second intermediate insulation layer 108 is continuous to the second insulation layer 102 (the second bottom side insulation layer 104).

The second intermediate insulation layer 108 has a sixth thickness T6. The sixth thickness T6 is less than the fourth thickness T4 of the second bottom side insulation layer 104 (T6<T4). The sixth thickness T6 may be 1/100 or more and 1/10 or less of the fourth thickness T4. The sixth thickness T6 may be 100 angstroms or more and 500 angstroms or less. The sixth thickness T6 may be 100 angstroms or more and 200 angstroms or less, 200 angstroms or more and 300 angstroms or less, 300 angstroms or more and 400 angstroms or less, or 400 angstroms or more and 500 angstroms or less. The sixth thickness T6 is preferably 200 angstroms or more and 400 angstroms or less.

The sixth thickness T6 may be less than or equal to the third thickness T3 (T6≤T3). The sixth thickness T6 may be the third thickness T3 or more (T6≥T3). The sixth thickness T6 may be equal to the third thickness T3 (T6=T3).

The second intermediate insulation layer 108 contains at least one of silicon oxide ($SiO_2$), silicon nitride (SiN), aluminum oxide ($Al_2O_3$), zirconium oxide ($ZrO_2$), and tantalum oxide ($Ta_2O_3$). Note that in this form, the second intermediate insulation layer 108 has a single-layer structure of an $SiO_2$ layer.

In this form, an exposed part of the second opening side electrode 107, which is exposed from the second gate trench 101, is positioned in the second gate trench 101 on the side of the bottom wall 73 with respect to the first principal surface 3. The exposed part of the second opening side electrode 107 is formed in a curved shape toward the bottom wall 73 of the second gate trench 101.

The exposed part of the second opening side electrode 107 is covered with a second cap insulation layer 109 formed in a film shape. The second cap insulation layer 109 is continuous to the second insulation layer 102 (the second opening side insulation layer 105) in the second gate trench 101. The second cap insulation layer 109 may contain silicon oxide ($SiO_2$).

Each second FET structure 68 further includes a p-type second channel region 111 (a second channel). More specifically, the second channel region 111 is formed in a region facing the second electrode 103 (the second opening side electrode 107) via the second insulation layer 102 (the second opening side insulation layer 105) in the body region 55.

More specifically, the second channel region 111 is formed along the first side wall 71 or the second side wall 72 of the second trench gate structure 70, or along the first side wall 71 and the second side wall 72. In this form, the second channel region 111 is formed along the first side wall 71 and the second side wall 72 of the second trench gate structure 70.

Each second FET structure 68 further includes an $n^+$ type second source region 112 formed in the surface part of the body region 55. The second source region 112 defines the second channel region 111 between itself and the drift region 54 in the body region 55.

The second source region 112 has an n-type impurity atom concentration more than that in the drift region 54. The n-type impurity atom concentration in the second source region 112 may be $1 \times 10^{19}$ $cm^{-3}$ or more and $1 \times 10^{21}$ $cm^{-3}$ or less. The n-type impurity atom concentration in the second source region 112 is preferably equal to that in the first source region 92.

In this form, each second FET structure 68 includes a plurality of the second source regions 112. The plurality of second source regions 112 are formed with intervals along the second trench gate structure 70 in the surface part of the body region 55. Specifically, the plurality of second source regions 112 are formed along the first side wall 71 or the second side wall 72 of the second trench gate structure 70, or along the first side wall 71 and the second side wall 72. In this form, the plurality of second source regions 112 are formed with intervals along the first side wall 71 and the second side wall 72 of the second trench gate structure 70.

In this form, each second source region 112 faces each first source region 92 in the first direction X. In addition, each second source region 112 is united with each first source region 92. In FIGS. 7 and 8, the first source region 92 and the second source region 112 are separated by a boundary line, but actually there is no definite boundary line in a region between the first source region 92 and the second source region 112.

Each second source region 112 may be shifted from each first source region 92 in the second direction Y, so that it does not face a part or the whole of each first source region 92 in the first direction X. In other words, the plurality of first source regions 92 and the plurality of second source regions 112 may be arranged in a zigzag manner in a plan view.

The bottom part of the plurality of second source regions 112 is positioned in a region on the side of the first principal surface 3 with respect to the bottom part of the body region 55. In this way, the plurality of second source regions 112 face the second electrode 103 (the second opening side electrode 107) via the second insulation layer 102 (the second opening side insulation layer 105). In this way, the second channel region 111 of the second MISFET 57 is formed in a region between the drift region 54 and the plurality of second source regions 112 in the body region 55.

Each second FET structure 68 further includes a $p^+$ type second contact region 113 formed in the surface part of the body region 55. The second contact region 113 has a p-type impurity atom concentration more than that of the body region 55. The p-type impurity atom concentration of the second contact region 113 may be $1 \times 10^{19}$ $cm^{-3}$ or more and $1 \times 10^{21}$ $cm^{-3}$ or less. The p-type impurity atom concentration of the second contact region 113 is preferably equal to the p-type impurity atom concentration in the first contact region 93.

In this form, each second FET structure 68 includes a plurality of the second contact regions 113. The plurality of second contact regions 113 are formed with intervals along the second trench gate structure 70 in the surface part of the body region 55. More specifically, the plurality of second contact regions 113 are formed along the first side wall 71 or the second side wall 72 of the second trench gate structure 70, or along the first side wall 71 and the second side wall 72. Bottom parts of the plurality of second contact regions 113 are positioned in a region on the side of the first principal surface 3 with respect to the bottom part of the body region 55.

In this form, the plurality of second contact regions 113 are formed with intervals along the first side wall 71 and the second side wall 72 of the second trench gate structure 70. More specifically, the plurality of second contact regions 113 are formed in the surface part of the body region 55 so as to be arranged alternately with the plurality of second source regions 112.

In this form, with reference to FIGS. 7 and 8, each second contact region 113 faces each first contact region 93 in the first direction X. Each second contact region 113 is united with each first contact region 93.

In FIG. 7, for discrimination from the first source region 92 and the second source region 112, the first contact region 93 and the second contact region 113 are denoted by symbol $p^+$. In addition, in FIG. 8, the first contact region 93 and the second contact region 113 are discriminated from each other by a boundary line, but actually there is no definite boundary line in a region between the first contact region 93 and the second contact region 113.

Each second contact region 113 may be shifted from each first contact region 93 in the second direction Y, so that it does not face a part or the whole of each first contact region 93 in the first direction X. In other words, the plurality of first contact regions 93 and the plurality of second contact regions 113 may be arranged in a zigzag manner in a plan view.

In this form, with reference to FIGS. 7 and 8, in the first principal surface 3 of the semiconductor layer 2, the body region 55 is exposed from a region between one end part of the first trench gate structure 60 and one end part of the second trench gate structure 70. The first source region 92, the first contact region 93, the second source region 112, and the second contact region 113 are not formed in the region between one end part of the first trench gate structure 60 and one end part of the second trench gate structure 70 in the first principal surface 3.

Similarly, although not illustrated in the diagram, in the first principal surface 3 of the semiconductor layer 2, the body region 55 is exposed from a region between the other end part of the first trench gate structure 60 and the other end part of the second trench gate structure 70 in this form. The first source region 92, the first contact region 93, the second source region 112, and the second contact region 113 are not formed in the region between the other end part of the first trench gate structure 60 and the other end part of the second trench gate structure 70.

With reference to FIGS. 5 to 8, a plurality of (e.g. two) trench contact structures 120 are formed in the first principal surface 3 of the semiconductor layer 2. The plurality of trench contact structures 120 include the trench contact structure 120 on one side and the trench contact structure 120 on the other side.

The trench contact structure 120 on one side is positioned in regions on one end part of the first trench gate structure 60 and on one end side of the second trench gate structure 70. The trench contact structure 120 on the other side is positioned in regions on the other end part of the first trench gate structure 60 and on the other end part of the second trench gate structure 70.

The trench contact structure 120 on the other side and the trench contact structure 120 on one side have substantially the same structure. In the following description, the structure of the trench contact structure 120 on one side is exemplified for description, and specific description about the structure of the trench contact structure 120 on the other side is omitted.

The trench contact structure 120 is connected to one end part of the first trench gate structure 60 and one end part of the second trench gate structure 70. In this form, the trench contact structure 120 extends in a strip shape along the first direction X in a plan view.

The trench contact structure 120 has a width WTC, which may be 0.5 μm or more and 5 μm or less. The width WTC is a width in a direction (the second direction Y) perpendicular to the extending direction of the trench contact structure 120 (the first direction X).

The width WTC may be 0.5 μm or more and 1 μm or less, 1 μm or more and 1.5 μm or less, 1.5 μm or more and 2 μm or less, 2 μm or more and 2.5 μm or less, 2.5 μm or more and 3 μm or less, 3 μm or more and 3.5 μm or less, 3.5 μm or more and 4 μm or less, 4 μm or more and 4.5 μm or less, or 4.5 μm or more and 5 μm or less. The width WTC is preferably 0.8 μm or more and 1.2 μm or less.

The width WTC is preferably equal to the first width WT1 of the first trench gate structure 60 (WTC=WT1). The width WTC is preferably equal to the second width WT2 of the second trench gate structure 70 (WTC=WT2).

The trench contact structure 120 penetrates the body region 55 and reaches the drift region 54. The trench contact structure 120 has a depth DTC, which may be 1 μm or more and 10 μm or less. The depth DTC may be 1 μm or more and 2 μm or less, 2 μm or more and 4 μm or less, 4 μm or more and 6 μm or less, 6 μm or more and 8 μm or less, or 8 μm or more and 10 μm or less. The depth DTC is preferably 2 μm or more and 6 μm or less.

The depth DTC is preferably equal to the first depth DT1 of the first trench gate structure 60 (DTC=DT1). The depth DTC is preferably equal to the second depth DT2 of the second trench gate structure 70 (DTC=DT2).

The trench contact structure 120 includes a first side wall 121 on one side, a second side wall 122 on the other side, and a bottom wall 123 that connects the first side wall 121 and the second side wall 122. In the following description, the first side wall 121, the second side wall 122, and the bottom wall 123 may be referred to as an "inner wall" as a whole. The first side wall 121 is a connecting surface connected to the first trench gate structure 60 and the second trench gate structure 70.

The first side wall 121, the second side wall 122, and the bottom wall 123 are positioned in the drift region 54. The first side wall 121 and the second side wall 122 extend in the normal direction Z. The first side wall 121 and the second side wall 122 may be formed perpendicular to the first principal surface 3.

In the semiconductor layer 2, the absolute value of the angle (taper angle) between the first side wall 121 and the first principal surface 3 may be more than 90 degrees and 95 degrees or less (e.g. approximately 91 degrees). In the semiconductor layer 2, the absolute value of the angle (taper angle) between the second side wall 122 and the first principal surface 3 may be more than 90 degrees and 95 degrees or less (e.g. approximately 91 degrees). In the cross-sectional view, the trench contact structure 120 may be formed in a tapered-off shape (taper shape) in which the width WTC decreases from the side of the first principal surface 3 in the semiconductor layer 2 to the side of the bottom wall 123.

The bottom wall 123 is positioned in a region on the side of the first principal surface 3 with respect to the bottom part of the drift region 54. The bottom wall 123 is formed in a convex shape toward the bottom part of the drift region 54. The bottom wall 123 is positioned in a region on the side of the first principal surface 3 with an interval ITC of 1 μm or more and 10 μm or less to the bottom part of the drift region 54. The interval ITC may be 1 μm or more and 2 μm or less, 2 μm or more and 4 μm or less, 4 μm or more and 6 μm or less, 6 μm or more and 8 μm or less, or 8 μm or more and 10 μm or less. The interval ITC is preferably 1 μm or more and 5 μm or less.

The interval ITC is preferably equal to the first interval IT1 of the first trench gate structure 60 (ITC=IT1). The interval ITC is preferably equal to the second interval IT2 of the second trench gate structure 70 (ITC=IT2).

The trench contact structure 120 includes a contact trench 131, a contact insulation layer 132, and a contact electrode 133. The contact trench 131 is formed by digging down the first principal surface 3 of the semiconductor layer 2 toward the second principal surface 4.

The contact trench 131 defines the first side wall 121, the second side wall 122, and the bottom wall 123 of the trench contact structure 120. In the following description, the first side wall 121, the second side wall 122, and the bottom wall 123 of the trench contact structure 120 are also referred to as the first side wall 121, the second side wall 122, and the bottom wall 123 of the contact trench 131.

The first side wall 121 of the contact trench 131 is connected to the first side wall 61 and the second side wall 62 of the first gate trench 81. The first side wall 121 of the contact trench 131 is connected to the first side wall 71 and the second side wall 72 of the second gate trench 101. The contact trench 131 forms one trench between the first gate trench 81 and the second gate trench 101.

The contact insulation layer 132 is formed in a film shape along the inner wall of the contact trench 131. The contact insulation layer 132 defines a concave space in the contact trench 131. A part of the contact insulation layer 132 covering the bottom wall 123 of the contact trench 131 is formed to follow the bottom wall 123 of the contact trench 131.

The contact insulation layer 132 defines a U-shaped space recessed in a U-shape in the contact trench 131, in the same manner as the first bottom side insulation layer 84 (the second bottom side insulation layer 104). In other words, the contact insulation layer 132 defines the U-shaped space, in which a region of the contact trench 131 on the side of the bottom wall 123 is expanded, and the tapered-off shape is suppressed. For instance, this U-shaped space is formed by an etching method (e.g. wet etching method) of the inner wall of the contact insulation layer 132.

The contact insulation layer 132 has a seventh thickness T7. The seventh thickness T7 may be 1500 angstroms or more and 4000 angstroms or less. The seventh thickness T7 may be 1500 angstroms or more and 2000 angstroms or less, 2000 angstroms or more and 2500 angstroms or less, 2500 angstroms or more and 3000 angstroms or less, 3000 angstroms or more and 3500 angstroms or less, or 3500 angstroms or more and 4000 angstroms or less. The seventh thickness T7 is preferably 1800 angstroms or more and 3500 angstroms or less.

The seventh thickness T7 may be 4000 angstroms or more and 12000 angstroms or less in accordance with the width WTC of the trench contact structure 120. The seventh thickness T7 may be 4000 angstroms or more and 5000 angstroms or less, 5000 angstroms or more and 6000 angstroms or less, 6000 angstroms or more and 7000 angstroms or less, 7000 angstroms or more and 8000 angstroms or less, 8000 angstroms or more and 9000 angstroms or less, 9000 angstroms or more and 10000 angstroms or less, 10000 angstroms or more and 11000 angstroms or less, or 11000 angstroms or more and 12000 angstroms or less. In this case, withstand voltage of the semiconductor device 1 can be improved by increasing the thickness of the contact insulation layer 132.

The seventh thickness T7 is preferably equal to the first thickness T1 of the first bottom side insulation layer 84 (T7=T1). The seventh thickness T7 is preferably equal to the fourth thickness T4 of the second bottom side insulation layer 104 (T7=T4).

The contact insulation layer 132 contains at least one of silicon oxide ($SiO_2$), silicon nitride (SiN), aluminum oxide ($Al_2O_3$), zirconium oxide ($ZrO_2$) and tantalum oxide ($Ta_2O_3$).

The contact insulation layer 132 may have a multilayer structure including an SiN layer and an $SiO_2$ layer laminated in order from the side of the semiconductor layer 2. The contact insulation layer 132 may have a multilayer structure including an $SiO_2$ layer and an SiN layer laminated in order from the side of the semiconductor layer 2. The contact insulation layer 132 may have a single-layer structure of an $SiO_2$ layer or an SiN layer. In this form, the contact insulation layer 132 has a single-layer structure of an $SiO_2$ layer. The contact insulation layer 132 preferably contains the same insulating material as the first insulation layer 82 (the second insulation layer 102).

The contact insulation layer 132 is united with the first insulation layer 82 in the connecting part between the first gate trench 81 and the contact trench 131. The contact insulation layer 132 is united with the second insulation layer 102 in the connecting part between the second gate trench 101 and the contact trench 131.

In this form, the contact insulation layer 132 includes a pull-out insulation layer 132A that is pulled out to one end part of the first gate trench 81 and one end part of the second gate trench 101. The pull-out insulation layer 132A covers the inner wall of one end part of the first gate trench 81 across the connecting part. The pull-out insulation layer 132A covers the inner wall of one end part of the second gate trench 101 across the connecting part.

The pull-out insulation layer 132A is united with the first bottom side insulation layer 84 and the first opening side insulation layer 85 in the first gate trench 81. The pull-out insulation layer 132A defines a U-shaped space together with the first bottom side insulation layer 84 on the inner wall of the first gate trench 81 on one end part.

The pull-out insulation layer 132A is united with the second bottom side insulation layer 104 and the second opening side insulation layer 105 in the second gate trench 101. The pull-out insulation layer 132A defines a U-shaped space together with the second bottom side insulation layer 104 on the inner wall of the second gate trench 101 on one end part.

The contact electrode 133 is embedded in the contact trench 131 via the contact insulation layer 132. Unlike the first electrode 83 or the second electrode 103, the contact electrode 133 is embedded in the contact trench 131 as one unit. The contact electrode 133 has a top end part exposed from the contact trench 131, and a bottom end part contacting with the contact insulation layer 132.

The bottom end part of the contact electrode 133 is formed in a convex shape toward the bottom wall 123 of the contact trench 131, in the same manner as the first bottom side electrode 86 (the second bottom side electrode 106). More specifically, the bottom end part of the contact electrode 133 is formed to follow the bottom wall of the U-shaped space defined by the contact insulation layer 132, and is formed in a smooth convex shape toward the bottom wall 123.

With this structure, local electric field concentration to the contact electrode 133 can be suppressed, and hence decrease in breakdown voltage can be suppressed. In particular, the contact electrode 133 is embedded in the expanded U-shaped space of the contact insulation layer 132, and hence that the contact electrode 133 becomes a tapered-off shape from the top end part to the bottom end part can be appropriately suppressed. In this way, local electric field concentration to the bottom end part of the contact insulation layer 132 can be appropriately suppressed.

The contact electrode 133 is electrically connected to the first bottom side electrode 86 in the connecting part between the first gate trench 81 and the contact trench 131. The contact electrode 133 is electrically connected to the second bottom side electrode 106 in the connecting part between the second gate trench 101 and the contact trench 131. In this way, the second bottom side electrode 106 is electrically connected to the first bottom side electrode 86.

More specifically, the contact electrode 133 includes a pull-out electrode 133A that is pulled out to one end part of the first gate trench 81 and one end part of the second gate trench 101. The pull-out electrode 133A is positioned in the first gate trench 81 across the connecting part between the first gate trench 81 and the contact trench 131. The pull-out electrode 133A is further positioned in the second gate trench 101 across the connecting part between the second gate trench 101 and the contact trench 131.

The pull-out electrode 133A is embedded in the U-shaped space defined by the contact insulation layer 132 in the first gate trench 81. The pull-out electrode 133A is united with the first bottom side electrode 86 in the first gate trench 81. In this way, the contact electrode 133 is electrically connected to the first bottom side electrode 86.

The first intermediate insulation layer 88 is disposed between the contact electrode 133 and the first opening side electrode 87 in the first gate trench 81. In this way, the contact electrode 133 is electrically insulated from the first opening side electrode 87 in the first gate trench 81.

The pull-out electrode 133A is embedded in the U-shaped space defined by the contact insulation layer 132 in the second gate trench 101. The pull-out electrode 133A is united with the second bottom side electrode 106 in the second gate trench 101. In this way, the contact electrode 133 is electrically connected to the second bottom side electrode 106.

In the second gate trench 101, the second intermediate insulation layer 108 is disposed between the contact electrode 133 and the second opening side electrode 107. In this way, the contact electrode 133 is electrically insulated from the second opening side electrode 107 in the second gate trench 101.

The contact electrode 133 may contain at least one of conductive polysilicon, tungsten, aluminum, copper, aluminum alloy, and copper alloy. In this form, the contact electrode 133 contains conductive polysilicon. The conductive polysilicon may contain an n-type impurity or a p-type impurity. The conductive polysilicon preferably contains an n-type impurity. The contact electrode 133 preferably contains the same conductive material as the first bottom side electrode 86 and the second bottom side electrode 106.

In this form, the exposed part of the contact electrode 133 exposed from the contact trench 131 is positioned on the side of the bottom wall 123 of the contact trench 131 with respect to the first principal surface 3. The exposed part of the contact electrode 133 is formed in a curved shape toward the bottom wall 123 of the contact trench 131.

The exposed part of the contact electrode 133 is covered with a third cap insulation layer 139 formed in a film shape. The third cap insulation layer 139 is continuous to the contact insulation layer 132 in the contact trench 131. The third cap insulation layer 139 may contain silicon oxide ($SiO_2$).

With reference to FIGS. 5 to 11, a principal surface insulation layer 141 is formed on the first principal surface 3 of the semiconductor layer 2. The principal surface insulation layer 141 selectively covers the first principal surface 3. The principal surface insulation layer 141 is continuous to the first insulation layer 82, the second insulation layer 102, and the contact insulation layer 132. The principal surface insulation layer 141 contains at least one of silicon oxide ($SiO_2$), silicon nitride (SiN), aluminum oxide ($Al_2O_3$), zirconium oxide ($ZrO_2$) and tantalum oxide ($Ta_2O_3$).

The principal surface insulation layer 141 may have a multilayer structure including an SiN layer and an $SiO_2$ layer laminated in order from the side of the semiconductor layer 2. The principal surface insulation layer 141 may have a multilayer structure including an $SiO_2$ layer and an SiN layer laminated in order from the side of the semiconductor layer 2. The principal surface insulation layer 141 may have a single-layer structure of an $SiO_2$ layer or an SiN layer. In this form, the principal surface insulation layer 141 has a single-layer structure of $SiO_2$ layer. The principal surface insulation layer 141 preferably contains the same insulating material as the first insulation layer 82, the second insulation layer 102 and the contact insulation layer 132.

The interlayer insulation layer 142 is formed on the upper part of the principal surface insulation layer 141. The interlayer insulation layer 142 may have a thickness more than that of the principal surface insulation layer 141. The interlayer insulation layer 142 covers substantially the entire region of the principal surface insulation layer 141. For instance, the interlayer insulation layer 142 contains at least one of silicon oxide ($SiO_2$), silicon nitride (SiN), aluminum oxide ($Al_2O_3$), zirconium oxide ($ZrO_2$), and tantalum oxide ($Ta_2O_3$).

Here, the interlayer insulation layer 142 includes an undoped silica glass (USG) layer as an example of silicon oxide. The interlayer insulation layer 142 may have a single-layer structure of the USG layer. The interlayer insulation layer 142 may have a smoothed principal surface. The principal surface of the interlayer insulation layer 142 may be a polished surface that is polished by a chemical mechanical polishing (CMP) method.

The interlayer insulation layer 142 may contain phosphor silicate glass (PSG) and/or boron phosphor silicate glass (BPSG) as an example of silicon oxide. The interlayer insulation layer 142 may have a multilayer structure including a PSG layer and a BPSG layer laminated in order from the side of the semiconductor layer 2. The interlayer insulation layer 142 may have a multilayer structure including the BPSG layer and the PSG layer laminated in order from the side of the first principal surface 3.

With reference to FIGS. 5 and 6, in the output region 6, a first plug electrode 143, a second plug electrode 144, a third plug electrode 145, and a fourth plug electrode 146 are embedded in the interlayer insulation layer 142. In this form, a plurality of the first plug electrodes 143, a plurality of the second plug electrodes 144, a plurality of the third plug electrodes 145, and a plurality of the fourth plug electrodes 146 are embedded in the interlayer insulation layer 142. The first plug electrode 143, the second plug electrode 144, the third plug electrode 145, and the fourth plug electrode 146 may each include tungsten.

The plurality of first plug electrodes 143 are each embedded in the interlayer insulation layer 142 at a part covering the first opening side electrode 87 of the first trench gate structure 60. In this form, the plurality of first plug electrodes 143 penetrate the interlayer insulation layer 142 in a region on one end side of the first trench gate structure 60, and are connected to a plurality of the first opening side electrodes 87 in a one-to-one relationship.

As a matter of course, the plurality of first plug electrodes 143 may be connected to one first opening side electrode 87. Although not illustrated in the diagram, in the same manner as the region on one end side, the plurality of first plug electrodes 143 are each embedded in the interlayer insulation layer 142 also in a part covering the region on the other end side of the first trench gate structure 60.

In this form, the plurality of first plug electrodes 143 are arranged with intervals in a row in the first direction X. Each first plug electrode 143 may be formed in a polygonal shape such as a triangle, a rectangle, a pentagon, or a hexagon, or in a circular or elliptical shape, in a plan view. Here, each first plug electrode 143 is formed in a rectangular shape in a plan view.

The plurality of second plug electrodes 144 are each embedded in a part covering the second opening side electrode 107 of the second trench gate structure 70 in the interlayer insulation layer 142. In this form, the plurality of second plug electrodes 144 penetrates the interlayer insulation layer 142 in a region on one end side of the second trench gate structure 70, and are connected to a plurality of the second opening side electrodes 107 in a one-to-one relationship.

As a matter of course, the plurality of second plug electrodes 144 may be connected to one second opening side electrode 107. Although not illustrated in the diagram, the plurality of second plug electrodes 144 are also each embedded in a part covering the region on the side of the other end part of the second trench gate structure 70 in the interlayer insulation layer 142, in the same manner as the region on one end side.

In this form, the plurality of second plug electrodes 144 are arranged with intervals in a row in the first direction X. Each second plug electrode 144 may be formed in a polygonal shape such as a triangle, a rectangle, a pentagon, or a hexagon, or in a circular or elliptical shape, in a plan view. Here, each second plug electrode 144 is formed in a rectangular shape in a plan view.

A plurality of the third plug electrodes 145 are each embedded in a part covering the contact electrode 133 in the interlayer insulation layer 142. The plurality of third plug electrodes 145 penetrate the interlayer insulation layer 142 and are connected to the contact electrode 133.

Although not illustrated in the diagram, the plurality of third plug electrodes 145 are also each embedded in a part covering the contact electrode 133 of the trench contact structure 120 on the other side in the interlayer insulation layer 142, in the same manner as the region on one end side.

In this form, the plurality of third plug electrodes 145 are arranged with intervals in a row in the first direction X. Each third plug electrode 145 may be formed in a polygonal shape such as a triangle, a rectangle, a pentagon, or a hexagon, or in a circular or elliptical shape, in a plan view. Here, each third plug electrode 145 is formed in a rectangular shape in a plan view.

The plurality of fourth plug electrodes 146 are respectively embedded in parts covering the plurality of cell regions 75 in the interlayer insulation layer 142. Each fourth plug electrode 146 penetrates the interlayer insulation layer 142 and is connected to each cell region 75. More specifically, in each cell region 75, each fourth plug electrode 146 is electrically connected to the first source region 92, the first contact region 93, the second source region 112, and the second contact region 113.

Each fourth plug electrode 146 is formed in a strip shape extending along each cell region 75 in a plan view. Each fourth plug electrode 146 has a length in the second direction Y, which may be less than the length of each cell region 75 in the second direction Y.

As a matter of course, the plurality of fourth plug electrodes 146 may be connected to each cell region 75. In this case, the plurality of fourth plug electrodes 146 are formed with intervals along each cell region 75. Further, each fourth plug electrode 146 may be formed in a polygonal shape such as a triangle, a rectangle, a pentagon, or a hexagon, or in a circular or elliptical shape, in a plan view.

In the output region 6, the source electrode 12 and the gate control wirings 17 described above are formed on the interlayer insulation layer 142. The source electrode 12 is electrically connected to the plurality of fourth plug electrodes 146 as a whole on the interlayer insulation layer 142. The source electrode 12 is applied with a reference voltage (e.g. the ground voltage). The reference voltage is transmitted to the first source region 92, the first contact region 93, the second source region 112, and the second contact region 113 via the plurality of fourth plug electrodes 146.

Among the gate control wirings 17, the first gate control wiring 17A is electrically connected to the plurality of first plug electrodes 143 on the interlayer insulation layer 142. The first gate control wiring 17A is supplied with the gate control signal from the control IC 10. The gate control signal is transmitted to the first opening side electrode 87 via the first gate control wiring 17A and the plurality of first plug electrodes 143.

Among the gate control wirings 17, the second gate control wiring 17B is electrically connected to the plurality of second plug electrodes 144 on the interlayer insulation layer 142. The second gate control wiring 17B is supplied with the gate control signal from the control IC 10. The gate control signal is transmitted to the second opening side electrode 107 via the second gate control wiring 17B and the plurality of second plug electrodes 144.

Among the gate control wirings 17, the third gate control wiring 17C is electrically connected to the plurality of third plug electrodes 145 on the interlayer insulation layer 142. The third gate control wiring 17C is supplied with the gate control signal from the control IC 10. The gate control signal is transmitted to the contact electrode 133 via the third gate control wiring 17C and the plurality of third plug electrodes 145. In other words, the gate control signal from the control IC 10 is transmitted to the first bottom side electrode 86 and the second bottom side electrode 106 via the contact electrode 133.

When the first MISFET 56 (the first trench gate structure 60) and the second MISFET 57 (the second trench gate structure 70) are both controlled to the OFF state, the first channel region 91 and the second channel region 111 are both controlled to the OFF state.

When the first MISFET 56 and the second MISFET 57 are both controlled to the ON state, the first channel region 91 and the second channel region 111 are both controlled to the ON state (Full-ON control).

When the first MISFET 56 is controlled to the ON state while the second MISFET 57 is controlled to the OFF state, the first channel region 91 is controlled to the ON state, and the second channel region 111 is controlled to the OFF state (first Half-ON control).

When the first MISFET 56 is controlled to the OFF state while the second MISFET 57 is controlled to the ON state, the first channel region 91 is controlled to the OFF state, and the second channel region 111 is controlled to the ON state (the second Half-ON control).

In this way, in the power MISFET 9, using the first MISFET 56 and the second MISFET 57 formed in one output region 6, a plurality of types of control are realized, which include the Full-ON control, the first Half-ON control, and the second Half-ON control.

When the first MISFET 56 is driven (i.e., in gate ON control), the first bottom side electrode 86 may be applied with the ON signal Von, and the first opening side electrode 87 may be applied with the ON signal Von. In this case, the first bottom side electrode 86 and the first opening side electrode 87 function as gate electrodes.

In this way, a voltage drop between the first bottom side electrode 86 and the first opening side electrode 87 can be suppressed, and hence electric field concentration between the first bottom side electrode 86 and the first opening side electrode 87 can be suppressed. In addition, the on-resistance of the semiconductor layer 2 can be reduced, and hence power consumption can be reduced.

When the first MISFET 56 is driven (i.e., in gate ON control), the first bottom side electrode 86 may be applied with the OFF signal Voff (e.g. the reference voltage), and the first opening side electrode 87 may be applied with the ON signal Von. In this case, the first bottom side electrode 86 functions as a field electrode while the first opening side electrode 87 functions as the gate electrode. In this way, stray capacitance can be reduced, and hence switching speed can be improved.

When the second MISFET 57 is driven (i.e., in gate ON control), the second bottom side electrode 106 may be applied with the ON signal Von, and the second opening side electrode 107 may be applied with the ON signal Von. In this case, the second bottom side electrode 106 and the second opening side electrode 107 function as the gate electrode.

In this way, a voltage drop between the second bottom side electrode 106 and the second opening side electrode 107 can be suppressed, and hence electric field concentration between the second bottom side electrode 106 and the second opening side electrode 107 can be suppressed. In addition, the on-resistance of the semiconductor layer 2 can be reduced, and hence power consumption can be reduced.

When the second MISFET 57 is driven (i.e., in gate ON control), the second bottom side electrode 106 may be applied with the OFF signal Voff (the reference voltage), and the second opening side electrode 107 may be applied with the ON signal Von. In this case, the second bottom side electrode 106 functions as the field electrode while the second opening side electrode 107 functions as the gate electrode. In this way, stray capacitance can be reduced, and hence switching speed can be improved.

With reference to FIGS. 7 and 8, the first channel region 91 is formed with a first channel area 51 in each cell region 75. The first channel area 51 is defined by a total plane area of the plurality of first source regions 92 formed in the cell regions 75.

The first channel region 91 is formed with a first channel ratio R1 (first ratio) in each cell region 75. The first channel ratio R1 is a ratio of the first channel area 51 in each cell region 75 when the plane area of each cell region 75 is 100%.

The first channel ratio R1 is adjusted within a range of 0% or more and 50% or less. The first channel ratio R1 may be 0% or more and 5% or less, 5% or more and 10% or less, 10% or more and 15% or less, 15% or more and 20% or less, 20% or more and 25% or less, 25% or more and 30% or less, 30% or more and 35% or less, 35% or more and 40% or less, 40% or more and 45% or less, or 45% or more and 50% or less. The first channel ratio R1 is preferably 10% or more and 35% or less.

If the first channel ratio R1 is 50%, the first source region 92 is formed in substantially the entire region of the first side wall 61 and the second side wall 62 of the first trench gate structure 60. In this case, the first contact region 93 is not formed in the first side wall 61 and the second side wall 62 of the first trench gate structure 60. The first channel ratio R1 is preferably less than 50%.

If the first channel ratio R1 is 0%, the first source region 92 is not formed on the first side wall 61 and the second side wall 62 of the first trench gate structure 60. In this case, only the body region 55 and/or the first contact region 93 are formed on the first side wall 61 and the second side wall 62 of the first trench gate structure 60. The first channel ratio R1 is preferably more than 0%. In this form, an example is described in which the first channel ratio R1 is 25%.

The second channel region 111 is formed with a second channel area S2 in each cell region 75. The second channel area S2 is defined by a total plane area of the plurality of second source regions 112 formed in each cell region 75.

The second channel region 111 is formed with a second channel ratio R2 (the second ratio) in each cell region 75. The second channel ratio R2 is a ratio of the second channel area S2 in each cell region 75 when the plane area of each cell region 75 is 100%.

The second channel ratio R2 is adjusted within a range of 0% or more and 50% or less. The second channel ratio R2 may be 0% or more and 5% or less, 5% or more and 10% or less, 10% or more and 15% or less, 15% or more and 20% or less, 20% or more and 25% or less, 25% or more and 30% or less, 30% or more and 35% or less, 35% or more and 40% or less, 40% or more and 45% or less, or 45% or more and 50% or less. The second channel ratio R2 is preferably 10% or more and 35% or less.

If the second channel ratio R2 is 50%, the second source region 112 is formed in substantially the entire region of the first side wall 71 and the second side wall 72 of the second trench gate structure 70. In this case, the second contact region 113 is not formed on the first side wall 71 and the second side wall 72 of the second trench gate structure 70. The second channel ratio R2 is preferably less than 50%.

If the second channel ratio R2 is 0%, the second source region 112 is not formed on the first side wall 71 and the second side wall 72 of the second trench gate structure 70. In this case, only the body region 55 and/or the second contact region 113 are formed on the first side wall 71 and the second side wall 72 of the second trench gate structure 70. The second channel ratio R2 is preferably more than 0%. In this form, an example is described in which the second channel ratio R2 is 25%.

In this way, in each cell region 75, the first channel region 91 and the second channel region 111 are formed with a total channel ratio RT (RT=R1+R2) of 0% or more and 100% or less (preferably more than 0% and less than 100%).

In this form, the total channel ratio RT in each cell region 75 is 50%. In this form, all the total channel ratios RT are set to the same value. Therefore, an average channel ratio RAV in the output region 6 (a unit area) is 50%. The average channel ratio RAV is obtained by dividing the sum of all the total channel ratios RT by the total number of the total channel ratios RT.

Figure 12A:
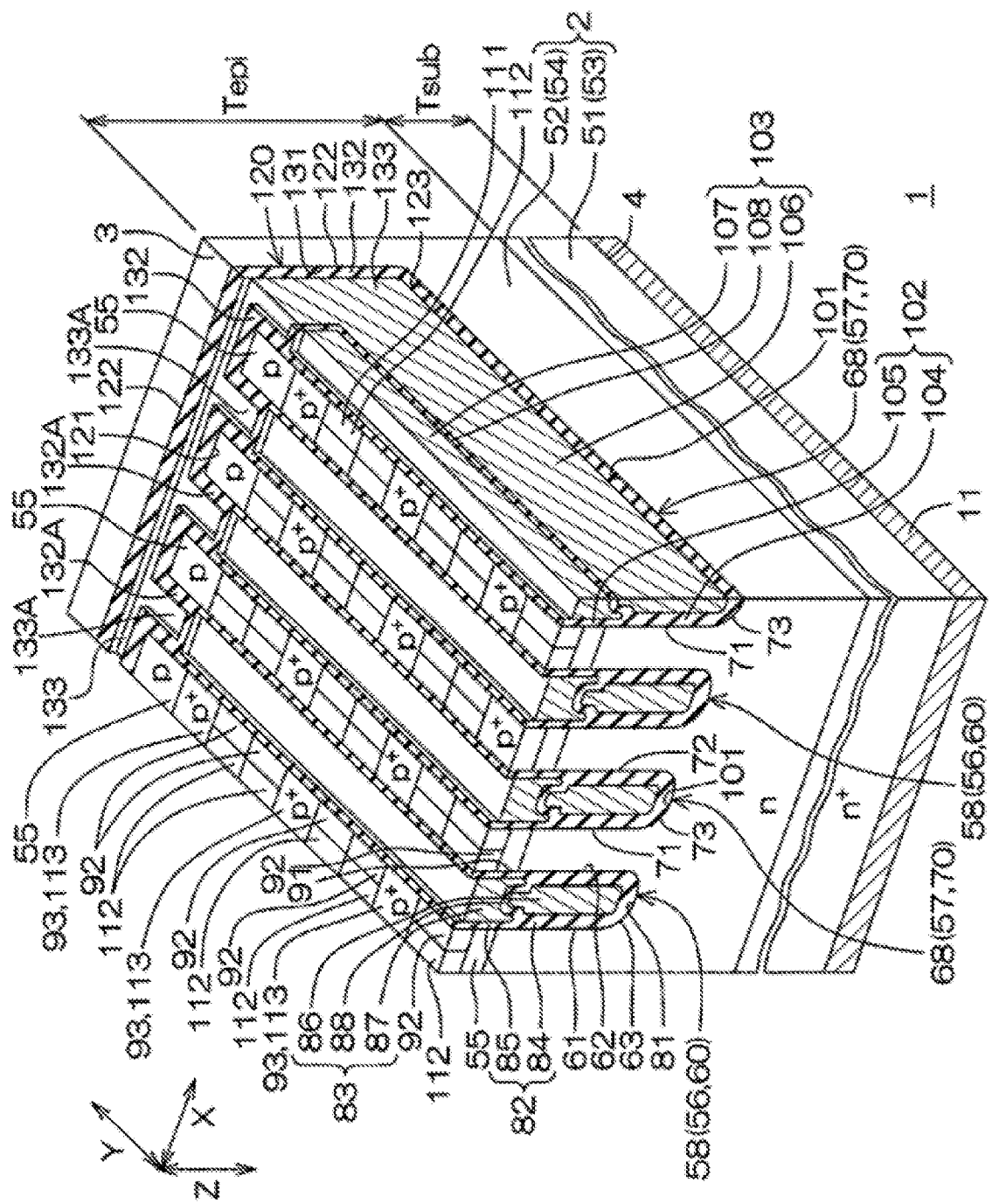
FIG. 12A is a cross-sectional perspective view of the region corresponding to FIG. 7, and is a cross-sectional perspective view illustrating a form including a channel structure according to a second form example.
Figure 12B:
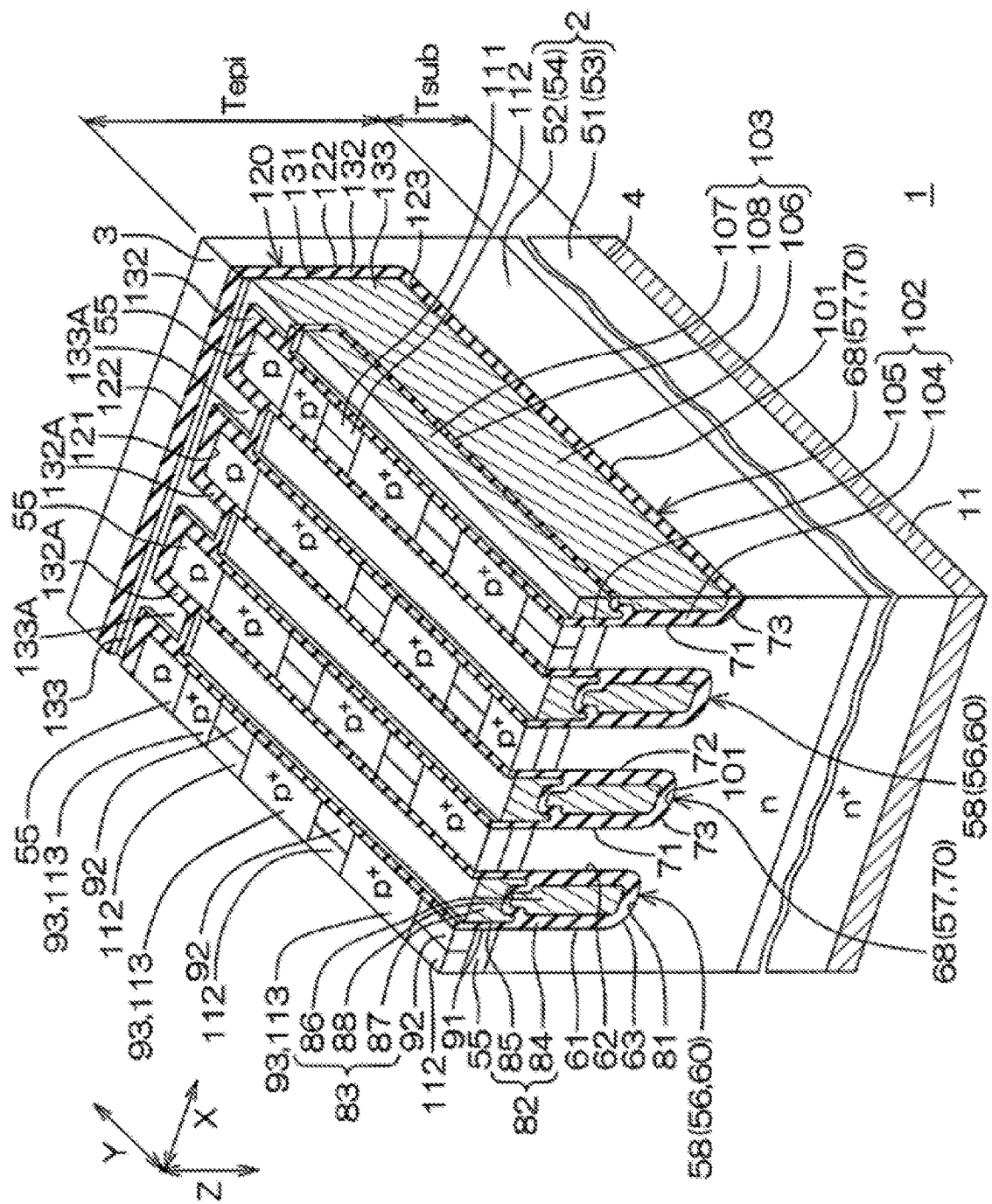
FIG. 12B is a cross-sectional perspective view of the region corresponding to FIG. 7, and is a cross-sectional perspective view illustrating a form including a channel structure according to a third form example.

FIGS. 12A and 12B illustrate form examples in which the average channel ratio RAV is adjusted. FIG. 12A is a cross-sectional perspective view of the region corresponding to FIG. 7, and is a cross-sectional perspective view illustrating a form including a channel structure according to a second form example. FIG. 12B is a cross-sectional perspective view of the region corresponding to FIG. 7, and is a cross-sectional perspective view illustrating a form including a channel structure according to the third form example.

FIG. 12A illustrates a form example in which the average channel ratio RAV is adjusted to approximately 66%. The total channel ratio RT of each cell region 75 is approximately 66%. FIG. 12B illustrates a form example in which the average channel ratio RAV is adjusted to 33%. The total channel ratio RT of each cell region 75 is 33%.

The total channel ratio RT may be adjusted for each cell region 75. In other words, a plurality of the total channel ratios RT having different values may be applied to the cell regions 75, respectively. The total channel ratio RT is related to a temperature rise of the semiconductor layer 2. For instance, if the total channel ratio RT is increased, temperature of the semiconductor layer 2 easily increases. In contrast, if the total channel ratio RT is decreased, temperature of the semiconductor layer 2 hardly increases.

Utilizing this, the total channel ratio RT may be adjusted in accordance with a temperature distribution in the semiconductor layer 2. For instance, it may be possible to set the total channel ratio RT to a relatively small value in a region where temperature easily increases in the semiconductor layer 2, and to set the total channel ratio RT to a relatively large value in a region where temperature hardly increases in the semiconductor layer 2.

A middle part of the output region 6 can be exemplified as the region where temperature easily increases in the semiconductor layer 2. A peripheral part of the output region 6 can be exemplified as the region where temperature hardly increases in the semiconductor layer 2. As a matter of course, the average channel ratio RAV may be adjusted while adjusting the total channel ratio RT in accordance with the temperature distribution in the semiconductor layer 2.

A plurality of the cell regions 75 having the total channel ratio RT of 20% or more and 40% or less (e.g. 25%) may be concentrated in the region (e.g. the middle part) where temperature easily increases. A plurality of the cell regions 75 having the total channel ratio RT of 60% or more and 80% or less (e.g. 75%) may be concentrated in the region (e.g. the peripheral part) where temperature hardly increases. A plurality of the cell regions 75 having the total channel ratio RT of more than 40% and less than 60% (e.g. 50%) may be concentrated in a region between the region where temperature easily increases and the region where temperature hardly increases.

Further, the total channel ratio RT of 20% or more and 40% or less, the total channel ratio RT of 40% or more and 60% or less, and the total channel ratio RT of 60% or more and 80% or less may be applied to the plurality of cell regions 75, in a regular arrangement.

As one example, three types of the total channel ratios RT, which repeat 25% (low), 50% (middle), and 75% (high) in order, may be applied to the plurality of cell regions 75. In this case, the average channel ratio RAV may be adjusted to 50%. With this structure, formation of a biased temperature distribution in the semiconductor layer 2 can be suppressed by a relatively simple design. A specific form using this structure is described below as the next embodiment.

Figure 13:
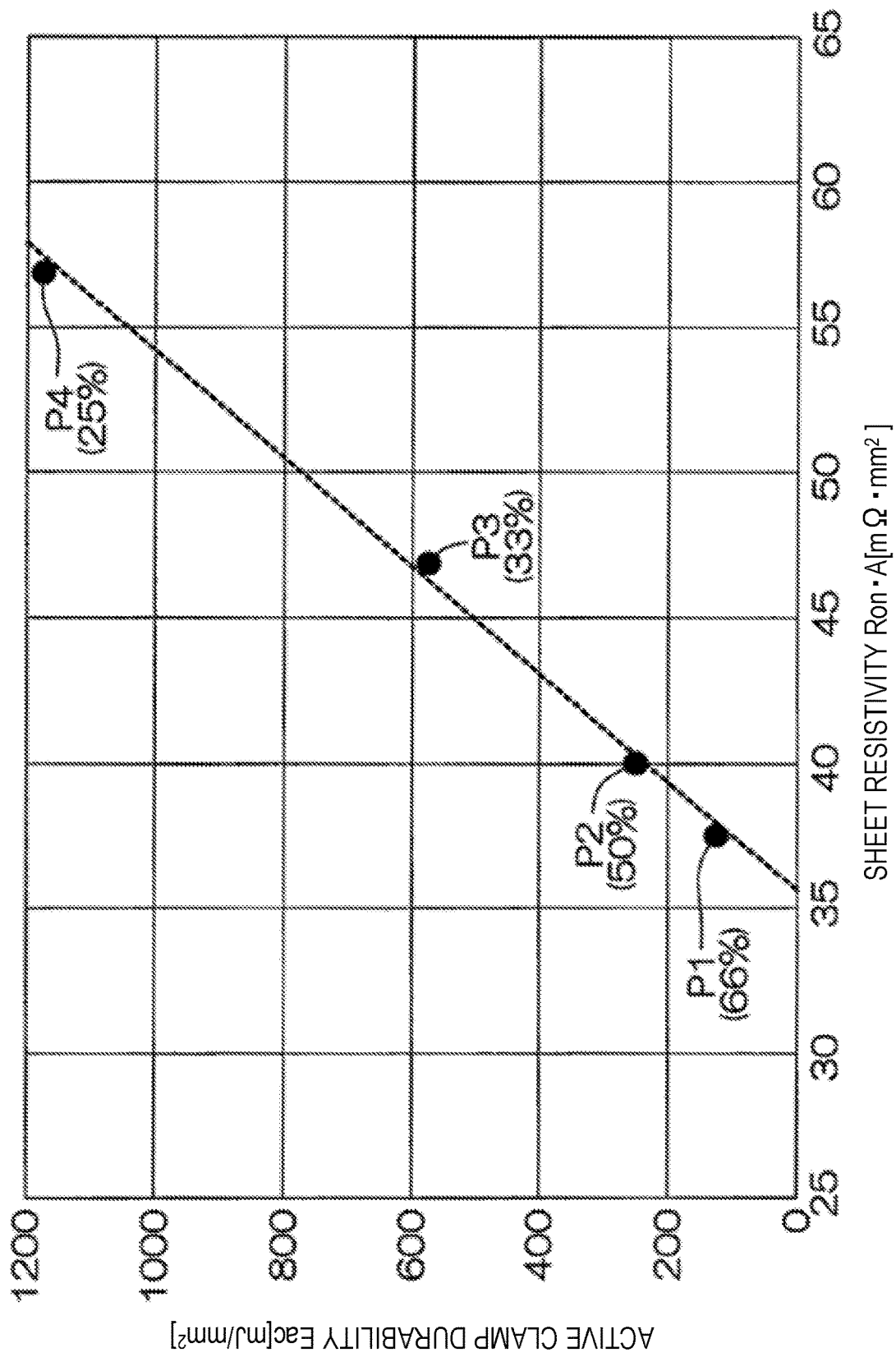
FIG. 13 is a graph of a relationship between active clamp durability and sheet resistivity, as a result of actual measurement.

FIG. 13 is a graph showing a relationship between the active clamp durability Eac and sheet resistivity Ron×A obtained by actual measurement. The graph of FIG. 13 shows characteristics when the first MISFET 56 and the second MISFET 57 are simultaneously controlled to the ON state and to the OFF state.

In FIG. 13, the vertical axis represents the active clamp durability Eac (mJ/mm$^2$), while the horizontal axis represents the sheet resistivity Ron×A (mΩ×mm$^2$). As described above with FIG. 3, the active clamp durability Eac is durability against counter electromotive force. The sheet resistivity Ron×A indicates on-resistance of the semiconductor layer 2 in the normal operation.

FIG. 13 shows a first plot point P1, a second plot point P2, a third plot point P3, and a fourth plot point P4. The first plot point P1, the second plot point P2, the third plot point P3, and the fourth plot point P4 show characteristics when the average channel ratio RAV (i.e., the total channel ratio RT in each cell region 75) is adjusted to 66%, 50%, 33%, and 25%, respectively.

When the average channel ratio RAV was increased, the sheet resistivity Ron×A was decreased in the normal operation, while the active clamp durability Eac was decreased in the active clamp operation. On the contrary, when the average channel ratio RAV was decreased, the sheet resistivity Ron×A was increased in the normal operation, and the active clamp durability Eac was increased in the active clamp operation.

In view of the sheet resistivity Ron×A, the average channel ratio RAV is preferably 33% or more (more specifically, 33% or more and less than 100%). In view of the active clamp durability Eac, the average channel ratio RAV is preferably less than 33% (more specifically, more than 0% and less than 33%).

Due to the increase in the average channel ratio RAV, the sheet resistivity Ron×A was decreased because the current paths were increased. In addition, due to the increase in the average channel ratio RAV, the active clamp durability Eac was decreased because a rapid temperature rise was caused by the counter electromotive force.

In particular, if the average channel ratio RAV (the total channel ratio RT) is relatively large, possibility of occurrence of a local and rapid temperature rise is increased in a region between the first trench gate structure 60 and the second trench gate structure 70 that are adjacent to each other. It is considered that the active clamp durability Eac was decreased due to this type of temperature rise.

In contrast, due to the decrease in the average channel ratio RAV, the sheet resistivity Ron×A was increased because the current path was contracted. It is considered that due to the decrease in the average channel ratio RAV, the active clamp durability Eac was increased because the average channel ratio RAV (the total channel ratio RT) became relatively small so that the local and rapid temperature rise was suppressed.

As understood from the graph of FIG. 13, the adjusting method based on the average channel ratio RAV (the total channel ratio RT) has a trade-off relationship, and hence it is difficult to achieve both good sheet resistivity Ron×A and good active clamp durability Eac separating from the trade-off relationship.

In contrast, as understood from the graph of FIG. 13, by making the power MISFET 9 operate to approach the first plot point P1 (RAV=66%) in the normal operation, and to approach the fourth plot point P4 (RAV=25%) in the active clamp operation, both good sheet resistivity Ron×A and good active clamp durability Eac can be achieved. Therefore, in this form, the control described below is performed.

Figure 14A:
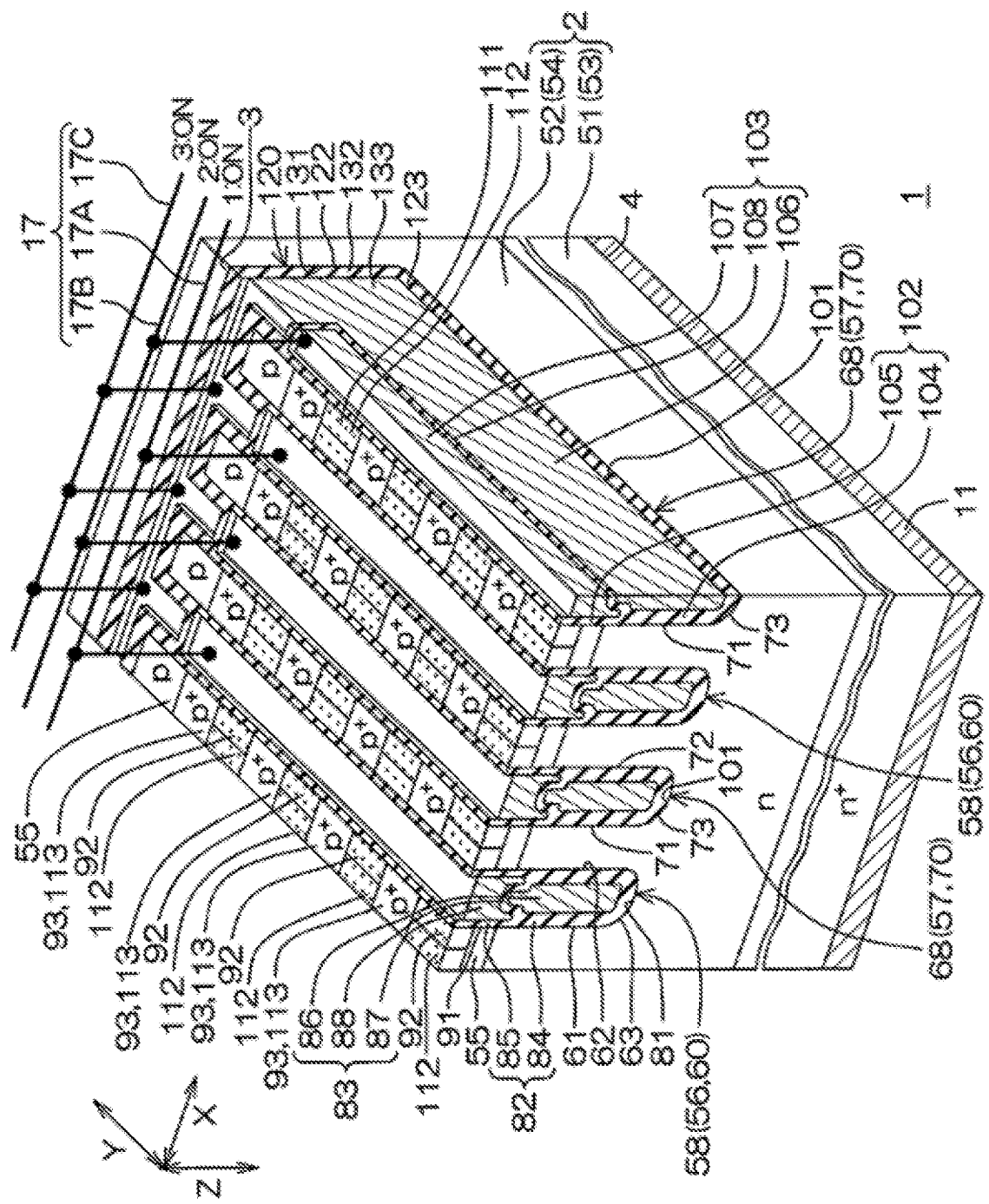
FIG. 14A is a cross-sectional perspective view for describing the normal operation according to a first control example of the semiconductor device illustrated in FIG. 1.
Figure 14B:
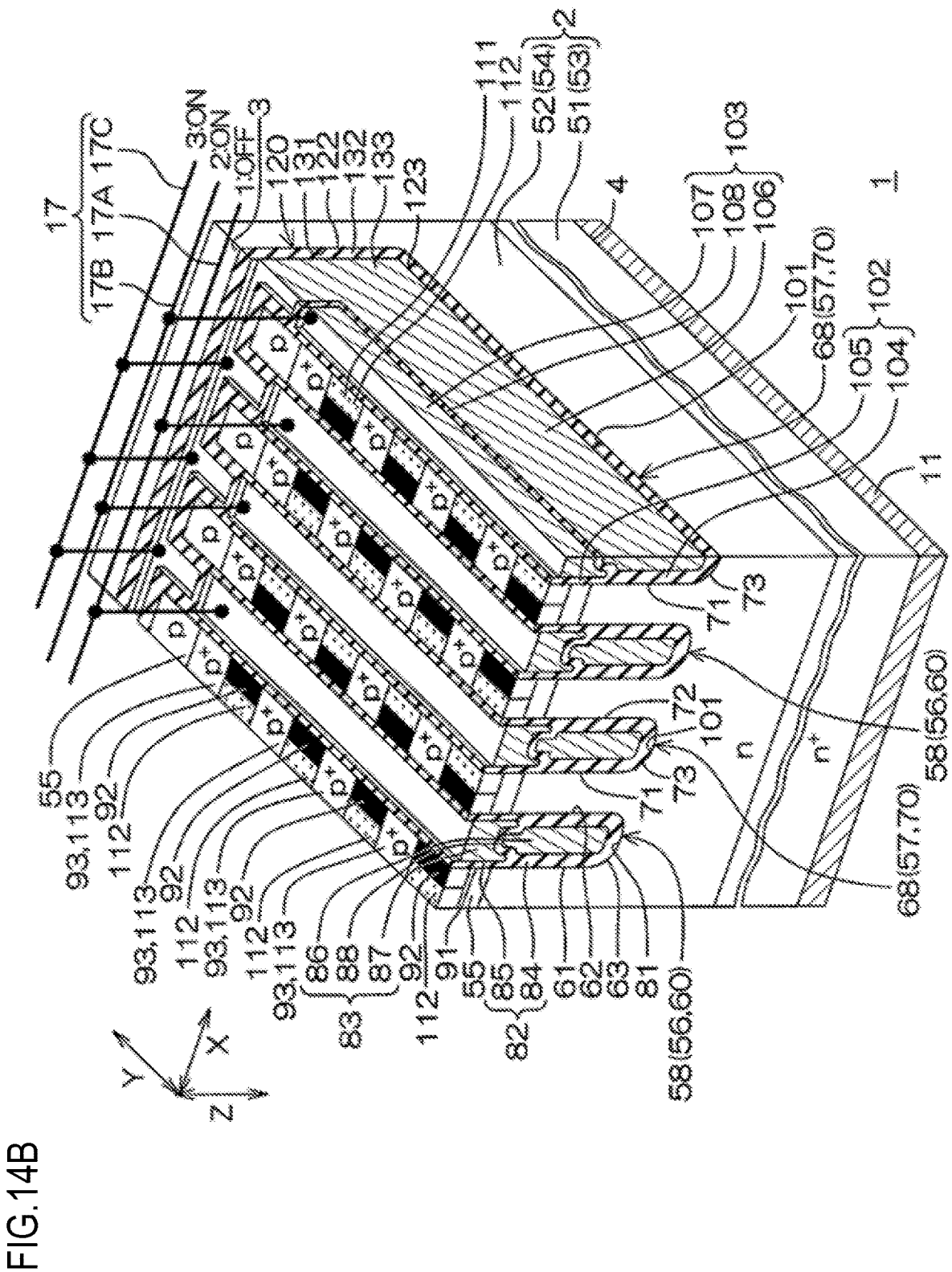
FIG. 14B is a cross-sectional perspective view for describing the active clamp operation according to the first control example of the semiconductor device illustrated in FIG. 1.

FIG. 14A is a cross-sectional perspective view for describing the normal operation according to a first control example of the semiconductor device 1 illustrated in FIG. 1. FIG. 14B is a cross-sectional perspective view for describing the active clamp operation according to the first control example of the semiconductor device 1 illustrated in FIG. 1. In FIGS. 14A and 14B, for convenience of description, the upper structure of the first principal surface 3 is not illustrated, and the gate control wirings 17 are simplified.

With reference to FIG. 14A, in the normal operation of the power MISFET 9, the first gate control wiring 17A is supplied with a first ON signal Von1, the second gate control wiring 17B is supplied with a second ON signal Von2, and the third gate control wiring 17C is supplied with a third ON signal Von3.

The first ON signal Von1, the second ON signal Von2, and the third ON signal Von3 are supplied from the control IC 10. The first ON signal Von1, the second ON signal Von2, and the third ON signal Von3 each have a voltage more than or equal to the gate threshold voltage Vth. The first ON signal Von1, the second ON signal Von2, and the third ON signal Von3 may have the same voltage.

In this case, the first opening side electrode 87, the second opening side electrode 107, the first bottom side electrode 86, and the second bottom side electrode 106 each become the ON state. In other words, the first opening side electrode 87, the second opening side electrode 107, the first bottom side electrode 86, and the second bottom side electrode 106 each function as the gate electrode.

In this way, the first channel region 91 and the second channel region 111 are both controlled to the ON state. In FIG. 14A, the first channel region 91 and the second channel region 111 in the ON state are shown by dotted hatching.

As a result, the first MISFET 56 and the second MISFET 57 are both driven (Full-ON control). A channel utilization factor RU in the normal operation is 100%. A characteristic channel ratio RC in the normal operation is 50%. The channel utilization factor RU is a ratio of the first channel regions 91 and the second channel regions 111 that are controlled to the ON state, among the first channel regions 91 and the second channel regions 111.

Note that the characteristic channel ratio RC is a value obtained by multiplying the average channel ratio RAV by the channel utilization factor RU (RC=RAV×RU). Characteristics (the sheet resistivity Ron×A and the active clamp durability Eac) of the power MISFET 9 are determined on the basis of the characteristic channel ratio RC. In this way, the sheet resistivity Ron×A approaches the sheet resistivity Ron×A shown by the second plot point P2 in the graph of FIG. 13.

In contrast, with reference to FIG. 14B, in the active clamp operation of the power MISFET 9, the first gate control wiring 17A is supplied with the OFF signal Voff, the second gate control wiring 17B is supplied with a first clamp ON signal VCon1, and the third gate control wiring 17C is supplied with a second clamp ON signal VCon2.

The OFF signal Voff, the first clamp ON signal VCon1, and the second clamp ON signal VCon2 are supplied from the control IC 10. The OFF signal Voff has a voltage (e.g. the reference voltage) that is less than the gate threshold voltage Vth. The first clamp ON signal VCon1 and the second clamp ON signal VCon2 each have a voltage more than or equal to the gate threshold voltage Vth. The first clamp ON signal VCon1 and the second clamp ON signal VCon2 may have the same voltage. The first clamp ON signal VCon1 and the second clamp ON signal VCon2 may have a voltage less than or equal to the voltage in the normal operation, or a voltage less than the same.

In this case, the first opening side electrode 87 becomes the OFF state, the first bottom side electrode 86, the second bottom side electrode 106, and the second opening side electrode 107 each become the ON state. In this way, the first channel region 91 is controlled to the OFF state, and the second channel region 111 is controlled to the ON state. In FIG. 14B, the first channel region 91 in the OFF state is shown by solid hatching, and the second channel region 111 in the ON state is shown by dotted hatching.

As a result, the first MISFET 56 is controlled to the OFF state while the second MISFET 57 is controlled to the ON state (the second Half-ON control). In this way, the channel utilization factor RU in the active clamp operation is more than zero and becomes less than the channel utilization factor RU in the normal operation.

The channel utilization factor RU in the active clamp operation is 50%. In addition, the characteristic channel ratio RC in the active clamp operation is 25%. In this way, the active clamp durability Eac approaches the active clamp durability Eac shown by the fourth plot point P4 in the graph of FIG. 13.

The first control example describes the example where the second Half-ON control is used in the active clamp operation. However, the first Half-ON control may be used in the active clamp operation.

Figure 15A:
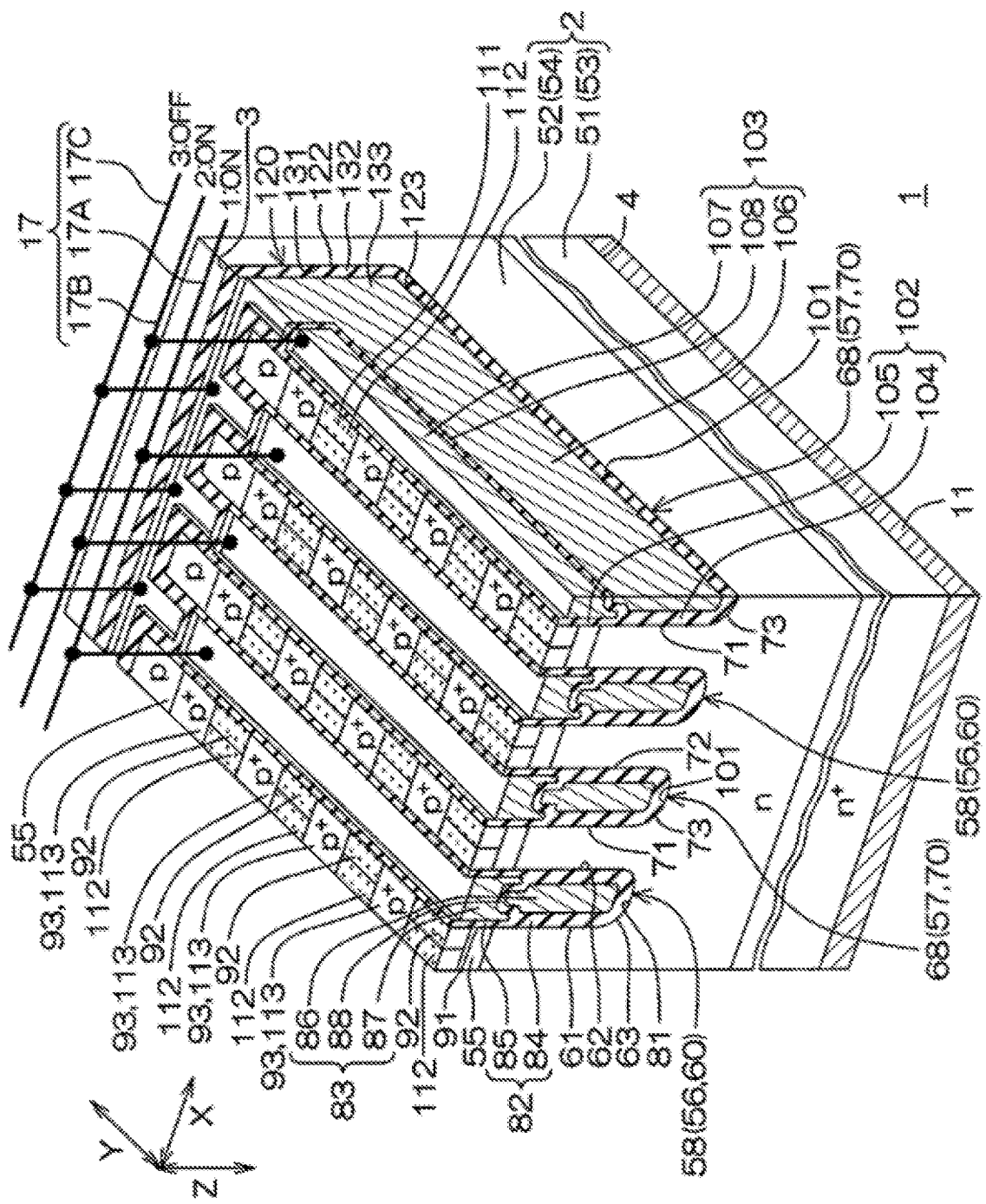
FIG. 15A is a cross-sectional perspective view for describing the normal operation according to a second control example of the semiconductor device illustrated in FIG. 1.
Figure 15B:
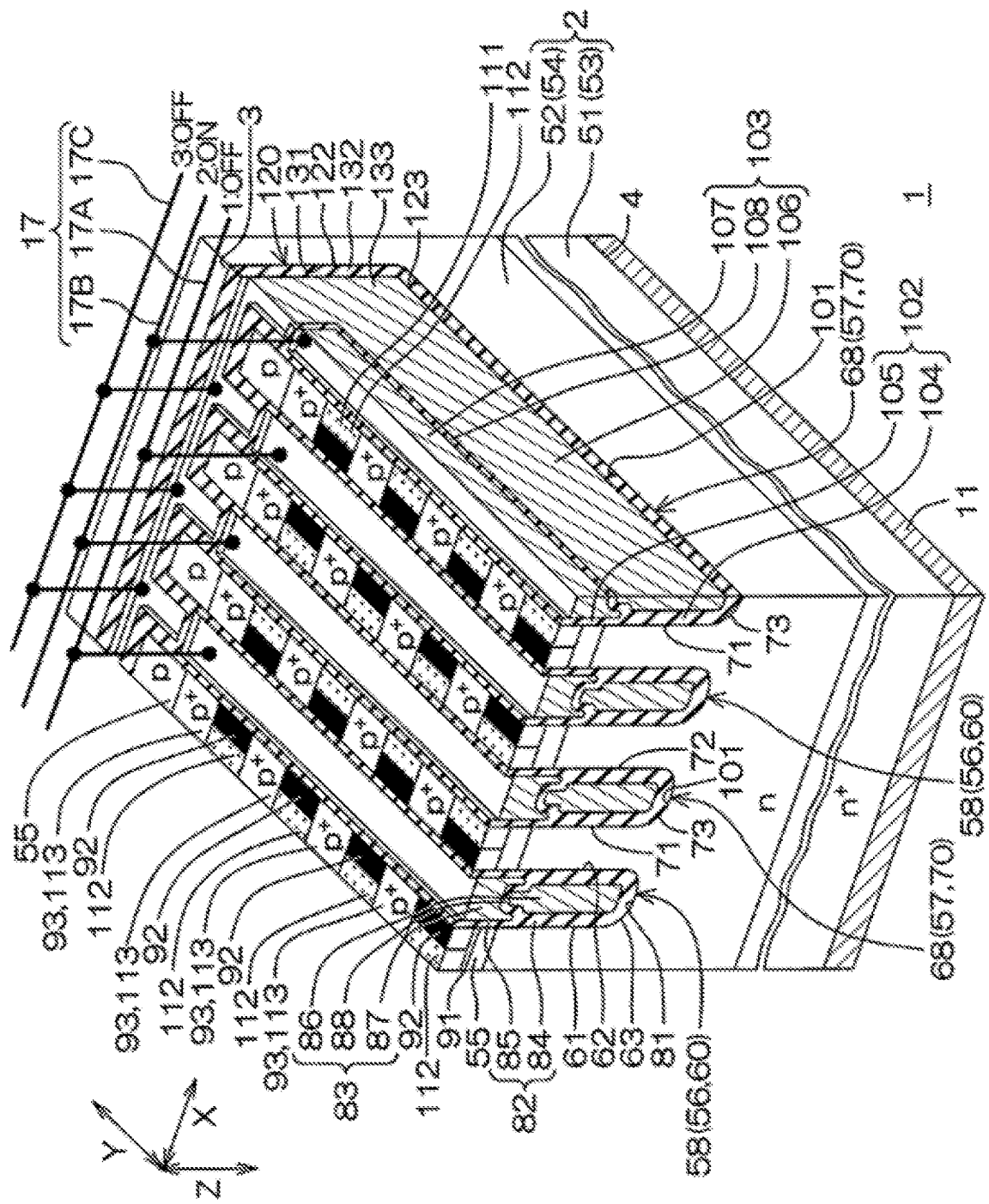
FIG. 15B is a cross-sectional perspective view for describing the active clamp operation according to the second control example of the semiconductor device illustrated in FIG. 1.

FIG. 15A is a cross-sectional perspective view for describing the normal operation according to a second control example of the semiconductor device 1 illustrated in FIG. 1. FIG. 15B is a cross-sectional perspective view for describing the active clamp operation according to the second control example of the semiconductor device 1 illustrated in FIG. 1. In FIGS. 15A and 15B, for convenience of description, the upper structure of the first principal surface 3 is not illustrated, and the gate control wirings 17 are simplified.

With reference to FIG. 15A, in the normal operation of the power MISFET 9, the first gate control wiring 17A is supplied with the first ON signal Von1, the second gate control wiring 17B is supplied with the second ON signal Von2, and the third gate control wiring 17C is supplied with the OFF signal Voff.

The first ON signal Von1, the second ON signal Von2, and the OFF signal Voff are input from the control IC 10. The first ON signal Von1 and the second ON signal Von2 each have a voltage more than or equal to the gate threshold voltage Vth. The first ON signal Von1 and the second ON signal Von2 may have the same voltage. The OFF signal Voff has a voltage (e.g. the reference voltage) less than the gate threshold voltage Vth.

In this case, the first opening side electrode 87 and the second opening side electrode 107 each become the ON state, and the first bottom side electrode 86 and the second bottom side electrode 106 each become the OFF state. In other words, the first opening side electrode 87 and the second opening side electrode 107 function as the gate electrode, while the first bottom side electrode 86 and the second bottom side electrode 106 function as the field electrode.

In this way, the first channel region 91 and the second channel region 111 are both controlled to the ON state. In FIG. 15A, the first channel region 91 and the second channel region 111 in the ON state are shown by dotted hatching.

As a result, both the first MISFET 56 and the second MISFET 57 are driven (Full-ON control). The channel utilization factor RU in the normal operation is 100%. The characteristic channel ratio RC in the normal operation is 50%. In this way, the sheet resistivity Ron×A approaches the sheet resistivity Ron×A shown by the second plot point P2 in the graph of FIG. 13.

In contrast, with reference to FIG. 15B, in the active clamp operation of the power MISFET 9, the first gate control wiring 17A is supplied with a first OFF signal Voff1, the second gate control wiring 17B is supplied with a clamp ON signal VCon, and the third gate control wiring 17C is supplied with a second OFF signal Voff2.

The first OFF signal Voff1, the clamp ON signal VCon, and the second OFF signal Voff2 are input from the control IC 10. The first OFF signal Voff1 has a voltage (e.g. the reference voltage) less than the gate threshold voltage Vth. The clamp ON signal VCon has a voltage more than or equal to the gate threshold voltage Vth. The clamp ON signal VCon may have a voltage less than or equal to the voltage in the normal operation or a voltage less than the same. The second OFF signal Voff2 has a voltage (e.g. the reference voltage) less than the gate threshold voltage Vth.

In this case, the first opening side electrode 87, the first bottom side electrode 86, and the second bottom side electrode 106 each become the OFF state, and the second opening side electrode 107 becomes the ON state. In this way, the first channel region 91 is controlled to the OFF state, and the second channel region 111 is controlled to the ON state. In FIG. 15B, the first channel region 91 in the OFF state is shown by solid hatching, and the second channel region 111 in the ON state is shown by dotted hatching.

As a result, the first MISFET 56 is controlled to the OFF state, while the second MISFET 57 is controlled to the ON state (the second Half-ON control). In this way, the channel utilization factor RU in the active clamp operation is more than zero and less than the channel utilization factor RU in the normal operation.

The channel utilization factor RU in the active clamp operation is 50%. In addition, the characteristic channel ratio RC in the active clamp operation is 25%. In this way, the active clamp durability Eac approaches the active clamp durability Eac shown by the fourth plot point P4 in the graph of FIG. 13.

The second control example describes the example in which the second Half-ON control is used in the active clamp operation. However, the first Half-ON control may be used in the active clamp operation.

As described above, the semiconductor device 1 includes the intelligent power device (IPD) formed in the semiconductor layer 2. The IPD includes the power MISFET 9 and the control IC 10 that controls the power MISFET 9. More specifically, the power MISFET 9 includes the first MISFET 56 and the second MISFET 57. The control IC 10 controls the first MISFET 56 and the second MISFET 57 separately.

More specifically, the control IC 10 controls the first MISFET 56 and the second MISFET 57 to the ON state in the normal operation, and controls the first MISFET 56 to the OFF state while controls the second MISFET 57 to the ON state in the active clamp operation.

Therefore, in the normal operation, current can flow using the first MISFET 56 and the second MISFET 57. In this way, the sheet resistivity Ron×A (the on-resistance) can be reduced.

In contrast, in the active clamp operation, current can flow using the second MISFET 57 while the first MISFET 56 is stopped, and hence the second MISFET 57 can consume (absorb) the counter electromotive force. In this way, rapid temperature rise due to the counter electromotive force can be suppressed, and hence the active clamp durability Eac can be improved.

More specifically, the semiconductor device 1 includes the first MISFET 56 having the first FET structure 58 and the second MISFET 57 having the second FET structure 68. The first FET structure 58 includes the first trench gate structure 60 and the first channel region 91. The second FET structure 68 includes the second trench gate structure 70 and the second channel region 111.

In this case, the control IC 10 controls the first MISFET 56 and the second MISFET 57 so that different characteristic channel ratios RC (channel areas) are used in the normal operation and in the active clamp operation. More specifically, the control IC 10 controls the first MISFET 56 and the second MISFET 57 so that the channel utilization factor RU in the active clamp operation becomes more than zero and less than the channel utilization factor RU in the normal operation.

Therefore, the characteristic channel ratio RC is relatively increased in the normal operation. In this way, the current paths are relatively increased, and hence the sheet resistivity Ron×A (the on-resistance) can be reduced. In contrast, in the active clamp operation, the characteristic channel ratio RC is relatively reduced. In this way, rapid temperature rise due to the counter electromotive force can be suppressed, and hence the active clamp durability Eac can be improved.

Therefore, it is possible to provide the semiconductor device 1 that can achieve both good sheet resistivity Ron×A and good active clamp durability Eac, separating from the trade-off relationship shown in FIG. 13.

Second Embodiment

A second embodiment of the present disclosure is described below. First, several terms used in the description of the second embodiment are mentioned. A line means a wiring to which an electric signal is transmitted or applied. The ground means a reference conductive part having a reference potential of 0 V (zero volts) or means the potential of 0 V itself. The reference conductive part is made of a metal or other conductive material. The potential of 0 V may be referred to as ground potential. In the second embodiment, a voltage without a specific reference means a potential with respect to the ground.

A level means a potential level, and for any noted signal or voltage, high level has a potential higher than a low level.

For any noted signal or voltage, that the signal or voltage is at high level means exactly that the signal or voltage has a level at high level. That the signal or voltage is at low level means exactly that the signal or voltage has a level at low level. A level of a signal may be referred to as a signal level, and a level of a voltage may be referred to as a voltage level. In any noted signal or voltage, switching from low level to high level is referred to as a positive edge (or a rising edge), and switching from high level to low level is referred to as a negative edge (or a falling edge).

For any transistor configured as a field effect transistor (FET) including a metal insulator semiconductor field effect transistor (MISFET), the ON state means a state where the transistor is conductive between drain and source, and the OFF state means a state where the transistor is not conductive (is disconnected) between drain and source. The same is true for other transistors that are not classified as FETs. The MISFET is regarded as an enhancement type MISFET unless otherwise specified.

For any transistor, switching from the OFF state to the ON state is referred to as turning on, and switching from the ON state to the OFF state is referred to as turning off. The same is true for any other switches such as an analog switch. In the following description, for any transistor or switch, the ON state and the OFF state may be simply referred to as ON and OFF, respectively.

In addition, for any transistor or switch, a period during which a transistor or a switch is in the ON state may be referred to as an ON period, and a period during which a transistor or a switch is in the OFF state may be referred to as an OFF period. For any signal having a signal level at high level or low level, a period during which the signal level is at high level is referred to as a high level period, and a period during which the signal level is at low level is referred to as a low level period. The same is true for any voltage having a voltage level at high level or low level. A connection between parts of a circuit, such as circuit elements, wirings (lines), or nodes, is understood to mean an electric connection unless otherwise noted.

Figure 16:
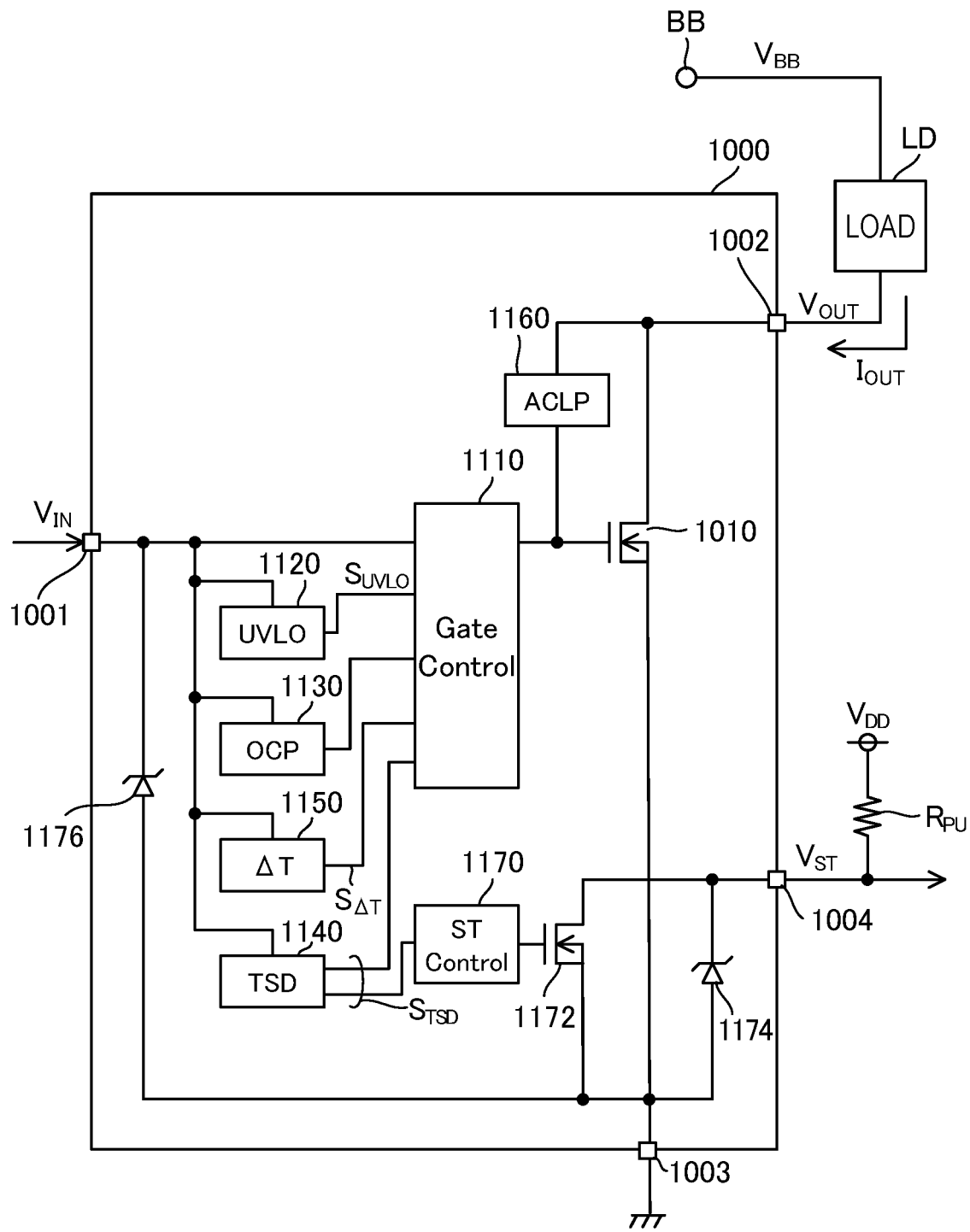
FIG. 16 is a structural block diagram of the switch device according to a second embodiment.

FIG. 16 illustrates a structural block diagram of a switch device 1000 according to the second embodiment. Here, as an example, it is supposed that the switch device 1000 is configured as a switching device on the low side.

The switch device 1000 has an input terminal 1001, an output terminal 1002, a ground terminal 1003 and a self-diagnosis terminal 1004, and includes an output transistor 1010, a gate control circuit 1110, a low voltage protection circuit 1120, an overcurrent protection circuit 1130, a first temperature protection circuit 1140, a second temperature protection circuit 1150, an active clamp circuit 1160, and a self-diagnosis circuit 1170, and further includes a transistor 1172, zener diodes 1174 and 1176.

The switch device 1000 is a semiconductor device (electronic component) equipped with a semiconductor chip having a semiconductor integrated circuit formed on a semiconductor substrate, a case (package) housing the semiconductor chip, and a plurality of external terminals exposed from the case to outside of the switch device 1000. The semiconductor device is formed by sealing the semiconductor chip in the case (package) made of resin. The semiconductor integrated circuit includes circuit components constituting the switch device 1000, which include the output transistor 1010, the circuits 1110 to 1170, the transistor 1172, and the zener diodes 1174 and 1176. FIG. 16 shows only the terminals 1001 to 1004 as the external terminals provided to the switch device 1000, but other external terminals can also be provided to the switch device 1000.

The input terminal 1001 is supplied with an input voltage $V_{IN}$ from a host system (not shown) disposed externally, and the input voltage $V_{IN}$ is applied to the input terminal 1001. The input voltage $V_{IN}$ is a voltage for setting the state of the output transistor 1010 to one of the ON state and the OFF state. The input voltage $V_{IN}$ may function as a power supply voltage to the circuits 1120 to 1150, and in this case the circuits 1120 to 1150 are driven on the basis of the input voltage $V_{IN}$. The circuits 1110 and 1170 may also be driven on the basis of the input voltage $V_{IN}$. However, the whole or any part of the circuits 1110 to 1170 may be driven on the basis of a power supply voltage (not shown) supplied to the switch device 1000 separately from the input voltage $V_{IN}$.

A voltage $V_{BB}$ is applied to a terminal BB disposed outside of the switch device 1000. The voltage $V_{BB}$ has a positive DC voltage value. For instance, when the switch device 1000 is mounted in a vehicle such as an automobile, an output voltage of a battery mounted in the vehicle is applied as the voltage $V_{BB}$ to the terminal BB. Outside the switch device 1000, a load LD is connected between the terminal BB and the output terminal 1002. The load LD may include an inductive load. A wiring (coil) of a solenoid, a motor, a transformer, a relay, or the like is exemplified as the inductive load. The load LD may include at least one of a resistance load and a capacitance load in addition to or instead of the inductive load.

The voltage applied to the output terminal 1002 is referred to as an output voltage $V_{OUT}$. In addition, current that flows from the terminal BB to the output terminal 1002 is referred to as output current $I_{OUT}$. As long as a so-called short to high level does not occur, the output current $I_{OUT}$ flows from the terminal BB to the output terminal 1002 through the load LD.

The ground terminal 1003 is connected to the ground. Therefore, in the second embodiment, that a part is connected to the ground is equivalent to that the part is connected to the ground terminal 1003. The self-diagnosis terminal 1004 is connected to the terminal to which a predetermined positive DC voltage $V_{DD}$ is applied via a pull-up resistor $R_{PU}$ outside of the switch terminal 1000. The voltage that is applied to the self-diagnosis terminal 1004 is referred to as a self-diagnosis voltage $V_{ST}$.

The output transistor 1010 is constituted as an N-channel type metal insulator semiconductor field effect transistor (MISFET). The output transistor 1010 has a drain, a source, and a gate. In the output transistor 1010, the drain is connected to the output terminal 1002, the source is connected to the ground terminal 1003. Therefore, when the output transistor 1010 is in the ON state, the output current $I_{OUT}$ flows from the output terminal 1002 to the ground terminal 1003 through a channel of the output transistor 1010 (a channel between drain and source).

The gate control circuit 1110 controls a gate potential of the output transistor 1010 so as to control the ON/OFF state of the output transistor 1010 (i.e. to drive the output transistor 1010). The gate control circuit 1110 controls the gate potential of the output transistor 1010 in accordance with the input voltage $V_{IN}$ and output signals of the circuits 1120 to 1150.

The low voltage protection circuit 1120 generates and outputs a signal $S_{UVLO}$ corresponding to the input voltage $V_{IN}$. The signal $S_{UVLO}$ is input to the gate control circuit 1110. The low voltage protection circuit 1120 generates the signal $S_{UVLO}$ so that the output transistor 1010 can be controlled to the ON state only when the input voltage $V_{IN}$ has a certain voltage value or more. The signal $S_{UVLO}$ is a binary signal having a signal level that is high level or low level. The signal $S_{UVLO}$ at high level has a value that is one of 0 and 1 (logical value), and the signal $S_{UVLO}$ at low level has a value that is the other of 0 and 1 (logical value).

Figure 17:
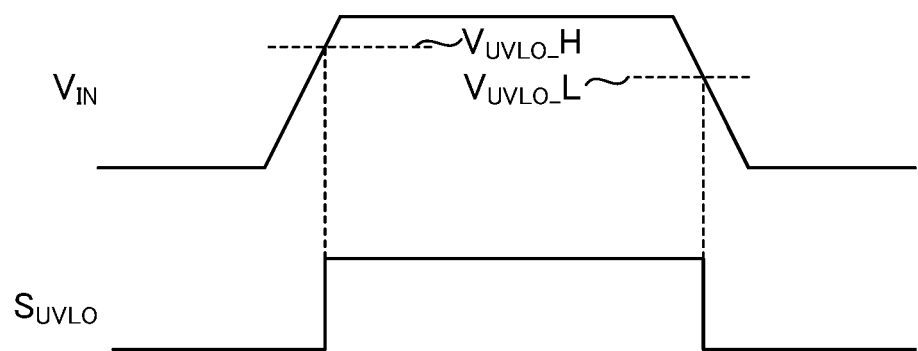
FIG. 17 is a function description diagram of a low voltage protection circuit of FIG. 16.

FIG. 17 shows a relationship between the input voltage $V_{IN}$ and the signal $S_{UVLO}$. In a state where the input voltage $V_{IN}$ is sufficiently low, including the state where the input voltage $V_{IN}$ is 0 V, the signal $S_{UVLO}$ has low level. When the input voltage $V_{IN}$ increases from the state where the signal $S_{UVLO}$ is at low level so that the state of $V_{IN}<V_{UVLO\_}H$ is switched to the state of $V_{IN}\geq V_{UVLO\_}H$, the signal $S_{UVLO}$ is changed from low level to high level. After that, when the input voltage $V_{IN}$ decreases so that the state of $V_{IN}\geq V_{UVLO\_}L$ is switched to the state of $V_{IN}<V_{UVLO\_}L$, the signal $S_{UVLO}$ is changed from high level to low level. Here, $V_{UVLO\_}H$ and $V_{UVLO\_}L$ has a positive DC voltage value that satisfies $V_{UVLO\_}H>V_{UVLO\_}L>0$.

The overcurrent protection circuit 1130 has a function of detecting a magnitude of the output current $I_{OUT}$ (i.e., a value of the output current $I_{OUT}$) flowing in the output transistor 1010. The overcurrent protection circuit 1130 performs an overcurrent protection operation in the state where the detected magnitude of the output current $I_{OUT}$ (detected value of the output current $I_{OUT}$) reaches a predetermined upper limit current value $I_{LIM}$, so as to limit the magnitude of the output current $I_{OUT}$ flowing in the output transistor 1010 to the upper limit current value $I_{LIM}$ or less. $I_{LIM}>0$ is satisfied. In the overcurrent protection operation, the gate potential of the output transistor 1010 is controlled so that the magnitude of the output current $I_{OUT}$ does not exceed the upper limit current value $I_{LIM}$ while keeping the output transistor 1010 in the ON state.

Figure 18:
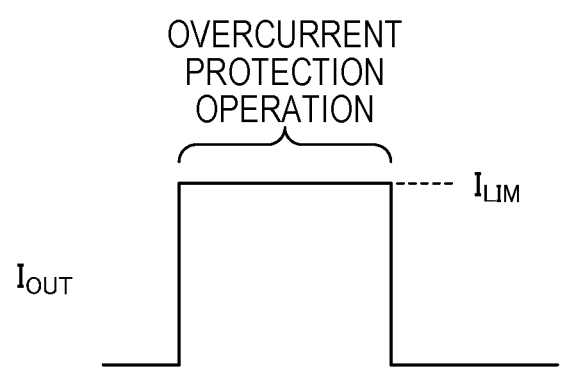
FIG. 18 is a function description diagram of an overcurrent protection circuit of FIG. 16.

FIG. 18 illustrates a waveform of the output current $I_{OUT}$ when the overcurrent protection operation is performed. If short to high level or the like occurs to the load LD so that the output current $I_{OUT}$ becomes excessive, the overcurrent protection operation is performed, and hence the output transistor 1010 and the switch device 1000 are protected. The short to high level of the load LD means the state where the terminal BB is short-circuited to the output terminal 1002 so that the voltage $V_{BB}$ is directly applied to the output terminal 1002.

The first temperature protection circuit 1140 detects temperature to be measured. In the following description, the temperature to be measured is referred to as temperature Tj. The temperature Tj is temperature of the output transistor 1010. More specifically, the temperature Tj is temperature at a predetermined point on the semiconductor constituting the output transistor 1010, and corresponds to junction temperature of the output transistor 1010. However, the temperature Tj may be temperature at any predetermined point in the switch device 1000, which is different from temperature of the output transistor 1010. The first temperature protection circuit 1140 generates and outputs a signal $S_{TSD}$ corresponding to the detected temperature Tj. The signal $S_{TSD}$ corresponds to a first temperature protection signal, which is input to the gate control circuit 1110. The signal $S_{TSD}$ is a binary signal having a signal level at high level or low level. The signal $S_{TSD}$ at high level has a value that is one of 0 and 1 (logical value), and the signal $S_{TSD}$ at low level has a value that is the other of 0 and 1 (logical value).

Figure 19:
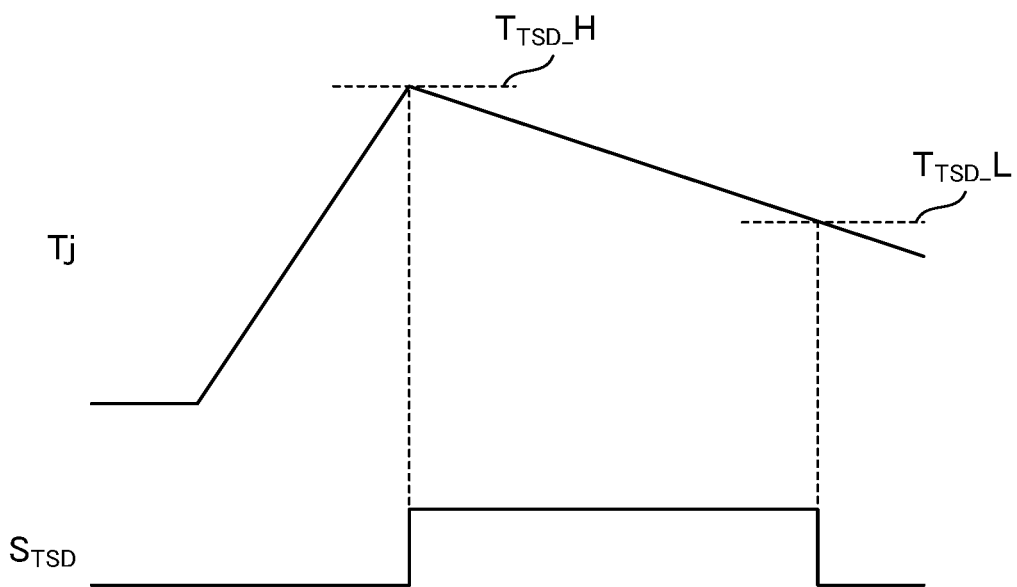
FIG. 19 is a function description diagram of a first temperature protection circuit of FIG. 16.

FIG. 19 shows a relationship between the temperature Tj and the signal $S_{TSD}$. In a state where the temperature Tj is sufficiently low, the signal $S_{TSD}$ has low level. When the temperature Tj increases from the state where the signal $S_{TSD}$ is at low level so that the state of $Tj<T_{TSD\_}H$ is switched to the state of $Tj\geq T_{TSD\_}H$, the signal $S_{TSD}$ is changed from low level to high level. After that, when the temperature Tj deceases so that the state of Tj≥$T_{TSD}$_L is switched to the state of Tj<$T_{TSD}$_L, the signal $S_{TSD}$ is changed from high level to low level. Here, $T_{TSD}$_H and $T_{TSD}$_L represent predetermined protection temperature (protection start temperature) and protection cancel temperature, respectively. The protection temperature $T_{TSD}$_H is higher than the protection cancel temperature $T_{TSD}$_L. For instance, the protection temperature $T_{TSD}$_H and the protection cancel temperature $T_{TSD}$_L are 175 degrees Celsius and 155 degrees Celsius, respectively.

The first temperature protection circuit 1140 is configured to switch the value of the signal $S_{TSD}$ as the first temperature protection signal from a first logical value to a second logical value, when the temperature Tj of the output transistor 1010 reaches a predetermined protection temperature $T_{TSD}$_H. Here, it is supposed that the signal $S_{TSD}$ at low level is associated with the first logical value (e.g. 0), and that the signal $S_{TSD}$ at high level is associated with the second logical value (e.g. 1).

The second temperature protection circuit 1150 has a function of detecting the temperature Tcnt that is different from the temperature Tj, so as to generate and output a signal $S_{AT}$ corresponding to a temperature difference between the temperature Tj and the temperature Tcnt. The signal $S_{AT}$ corresponds to a second temperature protection signal and is input to the gate control circuit 1110. The temperature Tcnt is temperature at a predetermined temperature measurement point in the switch device 1000. The temperature measurement point is a point apart from the output transistor 1010. For instance, the temperature Tcnt may be temperature of the gate control circuit 1110. In the following description, the temperature difference between the temperature Tj and the temperature Tcnt is referred to as a temperature difference ΔT. However, the temperature difference ΔT indicates a value of the temperature Tj with respect to the temperature Tcnt, and therefore the temperature difference ΔT is expressed by ΔT=Tj−Tcnt. The signal $S_{AT}$ is a binary signal having a signal level at high level or low level. The signal $S_{AT}$ at high level has a value that is one of 0 and 1 (logical value), and the signal $S_{AT}$ at low level has a value that is the other of 0 and 1 (logical value).

Figure 20:
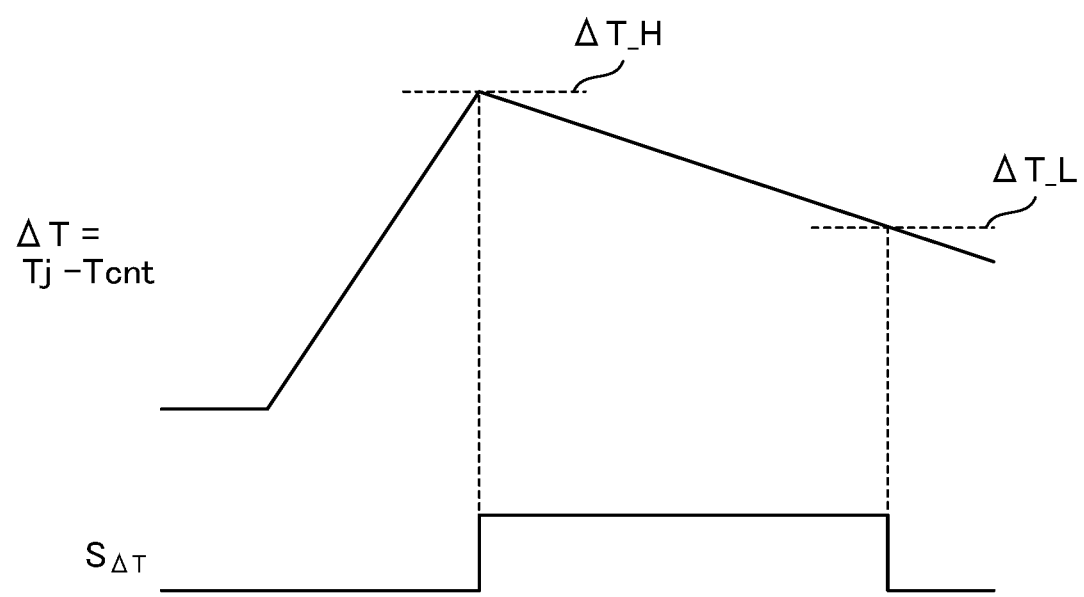
FIG. 20 is a function description diagram of a second temperature protection circuit of FIG. 16.

FIG. 20 shows a relationship between the temperature difference ΔT and the signal $S_{AT}$. In a state where the temperature difference ΔT is sufficiently small, the signal $S_{AT}$ has low level. When the temperature difference ΔT increases from the state where the signal $S_{AT}$ is at low level so that the state of ΔT<ΔT_H is switched to the state of ΔT≥ΔT_H, the signal $S_{AT}$ is changed from low level to high level. After that, when the temperature difference ΔT decreases so that the state of ΔT≥ΔT_L is switched to the state of ΔT<ΔT_L, the signal $S_{AT}$ is changed from high level to low level. Here, ΔT_H and ΔT_L represent a predetermined protection temperature difference (a protection start temperature difference) and a protection cancel temperature difference, respectively. The protection temperature difference ΔT_H is more than the protection cancel temperature difference ΔT_L. For instance, the protection temperature difference ΔT_H and the protection cancel temperature difference ΔT_L are 80 degrees Celsius and 45 degrees Celsius, respectively.

The second temperature protection circuit 1150 is configured to switch the value of the signal $S_{AT}$ as the second temperature protection signal from the first logical value to the second logical value, when the temperature difference ΔT reaches a predetermined protection temperature difference ΔT_H. Here, it is supposed that the signal $S_{AT}$ at low level is assigned with the first logical value (e.g. 0), and that the signal $S_{AT}$ at high level is assigned with the second logical value (e.g. 1).

The active clamp circuit 1160 protects the output transistor 1010 from a counter electromotive force generated by an inductive load when the load LD include the inductive load. For example, the active clamp circuit 1160 is configured to include a plurality of diodes, and realize the protection by limiting the voltage between drain and source of the output transistor 1010 to a predetermined clamp voltage or less.

The self-diagnosis circuit 1170 performs self-diagnosis whether or not the switch device 1000 is normally operating, and outputs a result of the self-diagnosis from the self-diagnosis terminal 1004 using the transistor 1172. In the configuration example of FIG. 16, the transistor 1172 is formed of an N-channel type MISFET, and the drain and source of the transistor 1172 are connected to the self-diagnosis terminal 1004 and the ground, respectively. Further, the self-diagnosis circuit 1170 controls the ON/OFF state of the transistor 1172 in accordance with the signal $S_{TSD}$, so as to output a result of the self-diagnosis from the self-diagnosis terminal 1004. The voltage $V_{ST}$ at the self-diagnosis terminal 1004 is at low level when the transistor 1172 is in the ON state, and is at high level when the transistor 1172 is in the OFF state.

The zener diodes 1174 and 1176 are components for protecting the internal circuit of the switch device 1000 from high voltage (such as static electricity) that can be applied to the terminals 1004 and 1001. Cathodes of the zener diodes 1174 and 1176 are connected to the terminals 1004 and 1001, respectively. Anodes of the zener diodes 1174 and 1176 are connected to the ground terminal 1003.

Figure 21:
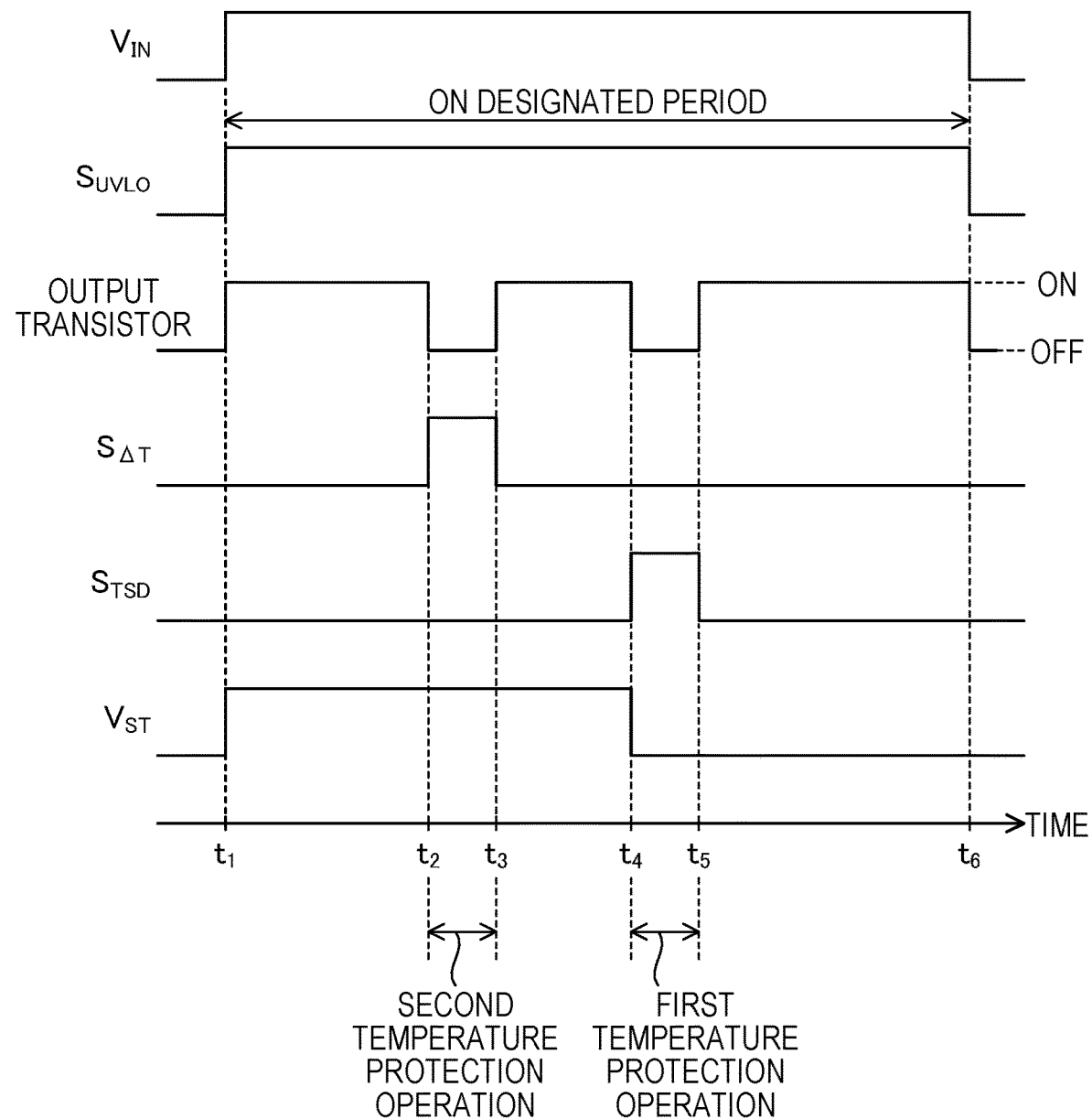
FIG. 21 is a timing chart illustrating a relationship among several signals and the like related to the switch device of FIG. 16.

FIG. 21 shows a relationship among some voltages and signals in the switch device 1000. FIG. 21 shows a waveform of the input voltage $V_{IN}$, a waveform of the signal $S_{UVLO}$, a state of the output transistor 1010, a waveform of the signal $S_{AT}$, a waveform of the signal $S_{TSD}$, and a waveform of the voltage $V_{ST}$, in order from top to bottom. For any natural number i, time $t_{i+1}$ is after time $t_i$.

At time $t_1$, a value of the input voltage $V_{IN}$ increases from 0 V to a predetermined positive voltage value, so that a positive edge is generated in the signal $S_{UVLO}$. After that, the value of the input voltage $V_{IN}$ decreases back to 0 V at time $t_6$, so that a negative edge is generated in the signal $S_{UVLO}$. In the example of FIG. 21, the signal $S_{AT}$ is at low level in principle, but the signal $S_{AT}$ becomes high level only in the period from time $t_2$ to time $t_3$. In the example of FIG. 21, the signal $S_{TSD}$ is at low level in principle, but the signal $S_{TSD}$ becomes high level only in the period from time $t_4$ to time $t_5$.

Basically, the gate control circuit 1110 controls the output transistor 1010 to the ON state or the OFF state on the basis of the input voltage $V_{IN}$. In other words, the gate control circuit 1110 controls the output transistor 1010 to the ON state in principle during the high level period of the signal $S_{UVLO}$ (i.e. in the period where the input voltage $V_{IN}$ is high to the extent that the signal $S_{UVLO}$ becomes high level). In contrast, it controls the output transistor 1010 to the OFF state during the low level period of the signal $S_{UVLO}$ (i.e. in the period where the input voltage $V_{IN}$ is low to the extent that the signal $S_{UVLO}$ becomes low level). In the following description, the high level period of the signal $S_{UVLO}$ is referred to as an ON designated period, and the low level period of the signal $S_{UVLO}$ is referred to as an OFF designated period. In the example of FIG. 21, the period from time $t_1$ to time $t_6$ is the ON designated period, and the period before time $t_1$ and the period after time $t_6$ are the OFF designated period.

The OFF designated period is a period in which the state of the output transistor 1010 is designated to the OFF state on the basis of the input voltage $V_{IN}$. The gate control circuit 1110 controls the output transistor 1010 to the OFF state regardless of the signals $S_{AT}$ and $S_{TSD}$ in the OFF designated period.

In contrast, the ON designated period is a period in which the state of the output transistor 1010 is designated to the ON state on the basis of the input voltage $V_{IN}$. However, during the ON designated period, the gate control circuit 1110 may control the output transistor 1010 to the OFF state in accordance with the signal $S_{AT}$ or $S_{TSD}$ while controlling the output transistor 1010 to the ON state in principle. Specifically, also during the ON designated period (i.e. even if the signal $S_{UVLO}$ is at high level), if at least one of the signals $S_{AT}$ and $S_{TSD}$ is at high level, the gate control circuit 1110 controls the output transistor 1010 to the OFF state. If the signals $S_{AT}$ and $S_{TSD}$ are both at low level and if the signal $S_{UVLO}$ is at high level, the gate control circuit 1110 controls the output transistor 1010 to the ON state.

Therefore, in the example of FIG. 21, the output transistor 1010 turns on, turns off, turns on, turns off, turns on, and turns off at times $t_1$, $t_2$, $t_3$, $t_4$, $t_5$, and $t_6$, respectively. In other words, the output transistor 1010 is in the ON state in the periods between times $t_1$ and $t_2$, between times $t_3$ and $t_4$, and between times $t_5$ and $t_6$, while it is in the OFF state in the periods between times $t_2$ and $t_3$, and between times $t_4$ and $t_5$. Before time $t_1$ and after time $t_6$, the output transistor 1010 is in the OFF state.

During the high level period of the signal $S_{TSD}$, the gate control circuit 1110 performs a first temperature protection operation on the basis of the signal $S_{TSD}$. In the example of FIG. 21, in response to the switching of the signal $S_{TSD}$ from low level to high level (the switching of the value of the signal $S_{TSD}$ from the first logical value to the second logical value) at time $t_4$, the gate control circuit 1110 performs the first temperature protection operation. In the first temperature protection operation, the gate control circuit 1110 switches the output transistor 1010 from the ON state to the OFF state, and then keeps the output transistor 1010 in the OFF state until a predetermined first temperature protection cancel condition is satisfied. The first temperature protection cancel condition is satisfied when $Tj<T_{TSD\_L}$ is satisfied (see FIG. 19), and in the example of FIG. 21, the first temperature protection cancel condition is satisfied at time $t_{B5}$.

During the high level period of the signal $S_{AT}$, the gate control circuit 1110 performs a second temperature protection operation on the basis of the signal $S_{AT}$. In the example of FIG. 21, in response to the switching of the signal $S_{AT}$ from low level to high level (the switching of the value of the signal $S_{AT}$ from the first logical value to the second logical value) at time $t_2$, the gate control circuit 1110 performs the second temperature protection operation. In the second temperature protection operation, the gate control circuit 1110 switches the output transistor 1010 from the ON state to the OFF state, and after that it keeps the output transistor 1010 in the OFF state until a predetermined second temperature protection cancel condition is satisfied. The second temperature protection cancel condition is satisfied when $\Delta T<\Delta T\_L$ is satisfied (see FIG. 20), and in the example of FIG. 21, the second temperature protection cancel condition is satisfied at time $t_{B3}$.

The self-diagnosis circuit 1170 controls the transistor 1172 so that a positive edge is generated in the voltage $V_{ST}$ in synchronization with the positive edge of the signal $S_{UVLO}$ at time $t_1$. After that, when a positive edge is generated in the signal $S_{TSD}$, the self-diagnosis circuit 1170 turns on the transistor 1172, so that a negative edge is generated in the voltage $V_{ST}$. After that, it keeps the transistor 1172 in the ON state (i.e. it keeps the voltage $V_{ST}$ at low level) until a predetermined unlatch condition is satisfied. Therefore, in the example of FIG. 21, a negative edge is generated in the voltage $V_{ST}$ at time $t_4$. The switch device 1000 has a function of monitoring the output voltage $V_{OUT}$. Further, for example, after a negative edge is generated in the voltage $V_{ST}$, when a generation source of the voltage $V_{BB}$ (not shown) is removed from the terminal BB so that the output voltage $V_{OUT}$ becomes a predetermined voltage or less, the unlatch condition is satisfied. Alternatively, for example, after a negative edge is generated in the voltage $V_{ST}$, when the signal $S_{UVLO}$ is at low level while the output voltage $V_{OUT}$ becomes predetermined voltage or less, the unlatch condition is satisfied. However, content of the unlatch condition can be variously modified.

Reference Example

A reference example is described, which is compared with Example EX2_1 or the like described later. In the switch device 1000 according to the reference example, the upper limit current value $I_{LIM}$ is fixed to a predetermined current value $I_{LIM1}$ in the overcurrent protection operation.

Figure 22:
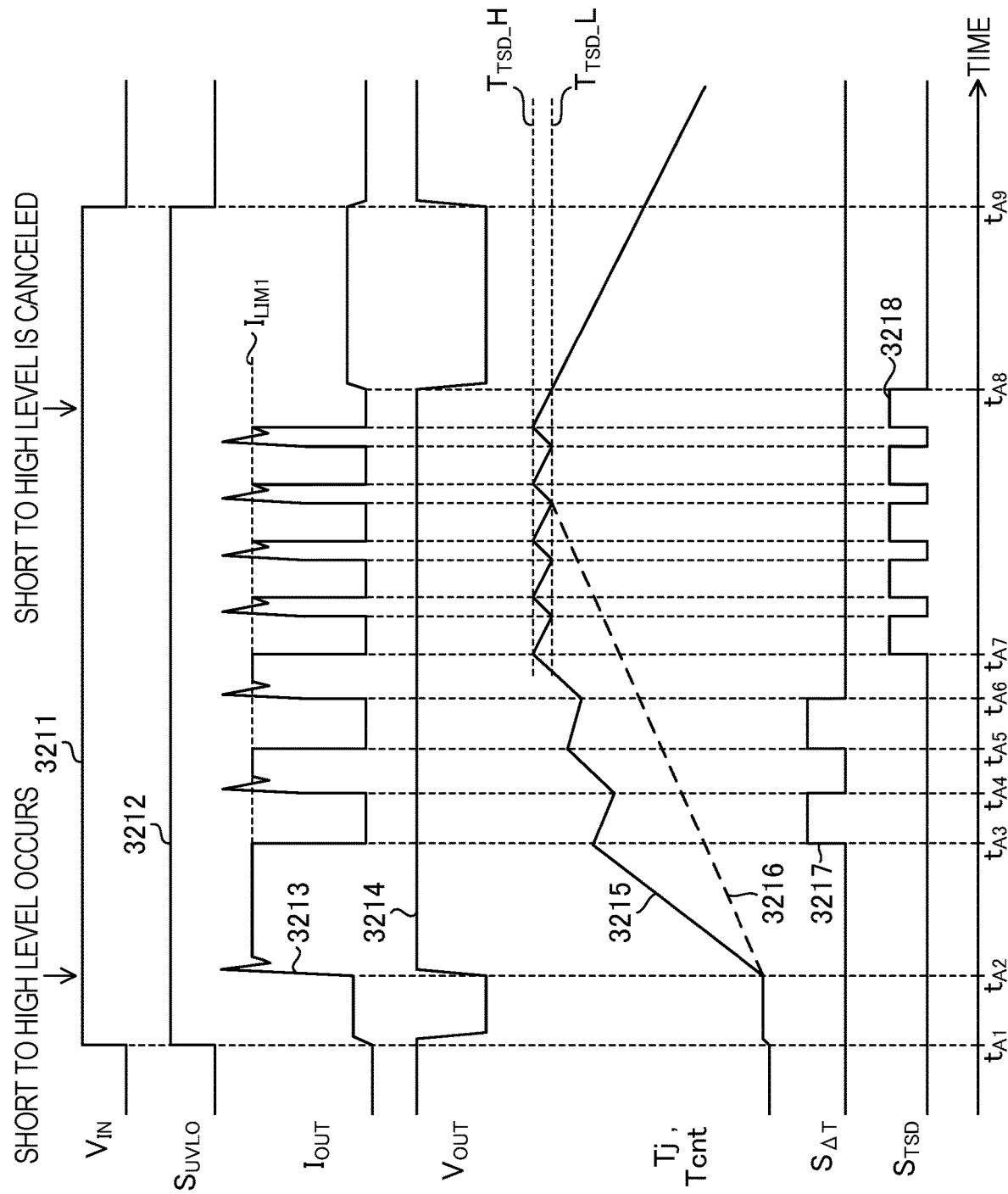
FIG. 22 is a timing chart according to a reference example.

FIG. 22 illustrates a timing chart of the reference example. In FIG. 22, waveforms 3211 to 3218 according to the reference example are shown. The waveforms 3211 to 3218 are those of the input voltage $V_{IN}$, the signal $S_{UVLO}$, the output current $I_{OUT}$, the output voltage $V_{OUT}$, the temperature $T_j$, the temperature $T_{cnt}$, the signal $S_{AT}$, and the signal $S_{TSD}$, respectively, according to the reference example. Note that in FIG. 22, it is supposed that after the temperature $T_{cnt}$ shown by the waveform 3216 of the broken line reaches the temperature $T_j$ shown by the waveform 3215 of the solid line, the temperature $T_{cnt}$ agrees with the temperature $T_j$, and illustration of the waveform 3216 after the temperature $T_{cnt}$ reaches the temperature $T_j$ is omitted. For any natural number i, time $t_{Ai+1}$ is after time $t_{Ai}$.

At time $t_{A1}$, the input voltage $V_{IN}$ increases from 0 V to a predetermined positive voltage value, so that a positive edge is generated in the signal $S_{UVLO}$, and after that the input voltage $V_{IN}$ decreases back to 0 V at time $t_{A9}$, so that a negative edge is generated in the signal $S_{UVLO}$. Therefore, the period between times $t_{A1}$ and $t_{A9}$ corresponds to the ON designated period. It is supposed that short to high level does not occur at time $t_{A1}$ and just after time $t_{A1}$, and that short to high level occurs at time $t_{A2}$. Then, the output current $I_{OUT}$ increases rapidly after time $t_{A2}$, and the magnitude of the output current $I_{OUT}$ is limited to the current value $I_{LIM1}$ or less by the overcurrent protection operation. Note that just after the overcurrent protection operation starts, the magnitude of the output current $I_{OUT}$ may transiently exceeds the upper limit current value $I_{LIM}$ (here, the current value km), and FIG. 22 schematically illustrates the transient response.

After time $t_{A2}$, large output current $I_{OUT}$ flows so that the temperature $T_j$ rapidly rises, and in this process the temperature difference $\Delta T$ increases and reaches the protection temperature difference $\Delta T\_H$ (see FIG. 20). Then, a positive edge is generated in the signal $S_{AT}$, and hence the second temperature protection operation (see FIG. 21) is performed. In the example of FIG. 22, a positive edge, a negative edge, a positive edge, and a negative edge are generated at times $t_{A3}$, $t_{A4}$, $t_{A5}$, and $t_{A6}$, respectively in the signal $S_{AT}$. Therefore, from time $t_{A2}$ to time $t_{A7}$, there alternately occur rises and falls of the temperature Tj, the rises being due to the output current $I_{OUT}$ near the upper limit current value $I_{LIM}$ (here, the current value km) flowing in the output transistor 1010, while the falls being due to the output transistor 1010 being kept in the OFF state by the second temperature protection operation.

After that, at time $t_{A7}$ the temperature Tj rises to the protection temperature $T_{TSD\_}H$ (see FIG. 19). Then, after that until the short to high level is canceled, the state continues where the temperature Tj fluctuate between the protection temperature $T_{TSD\_}H$ and the protection cancel temperature $T_{TSD\_}L$. In the example of FIG. 22, the short to high level is canceled just before time $t_{A8}$ after time $t_{A7}$. In the period from time $t_{A7}$ to time $t_{A8}$, there alternately occur rises of the temperature Tj, due to the output current $I_{OUT}$ near the upper limit current value $I_{LIM}$ (here, the current value $I_{LIM1}$) flowing in the output transistor 1010, and falls of the temperature Tj, due to the output transistor 1010 being kept in the OFF state by the first temperature protection operation.

After the short to high level is canceled, at time $t_{A8}$, the temperature Tj falls below the temperature $T_{TSD\_}L$ (protection cancel temperature), so that a negative edge is generated in the signal $S_{TSD}$. Then, the output transistor 1010 is turned on. In this case, the magnitude of the output current $I_{OUT}$ is sufficiently smaller than the upper limit current value $I_{LIM}$ (here, the current value $I_{LIM1}$). After that, when the input voltage $V_{IN}$ becomes 0 V at time $t_{A9}$, the output transistor 1010 is turned off, and the output current $I_{OUT}$ becomes zero.

As described above, in the switch device 1000 according to the reference example, the upper limit current value $I_{LIM}$ is fixed to the predetermined current value $I_{LIM1}$ in the overcurrent protection operation. Therefore, after short to high level occurs at time $t_{A2}$, until the short to high level is canceled, there alternately occur periods of the rising temperature Tj, due to the output current $I_{OUT}$ near the upper limit current value $I_{LIM}$ (here, the current value $I_{LIM1}$) flowing in the output transistor 1010, and periods of the falling temperature Tj, the output transistor 1010 being kept in the OFF state by the first or second temperature protection operation.

Now, the drain and source of the output transistor 1010 are connected to corresponding electrode pads with wire bonding. In other words, the drain of the output transistor 1010 is connected to a first electrode pad corresponding to the output terminal 1002 with a first wire, and the source of the output transistor 1010 is connected to a second electrode pad corresponding to the ground terminal 1003 with a second wire. When the periods of the rising temperature Tj accompanying the overcurrent protection operation and the periods of the falling temperature Tj due to the first or second temperature protection operation alternately occur as illustrated in FIG. 22, thermal stress is generated in a junction between the electrode pad and the wire due to a difference between thermal expansion coefficients of the electrode pad and the wire. The thermal stress that occurs repeatedly may cause a crack in the junction between the electrode pad and the wire, and may cause decrease in wire bonding strength resulting in a possibility of wire breakage.

Example EX2_1

Example EX2_1 of the second embodiment is described below. If the rapid heating can be reduced in the period where the short to high level is generated, possibility of the wire breakage due to the thermal stress is reduced so that the wire hardly breaks, and hence reliability of the switch device 1000 is enhanced. Example EX2_1 describes a structure of the switch device 1000 that contributes to reduction of the rapid heading. The above description of the second embodiment except for the reference example is applied to Example EX2_1.

Figure 23:
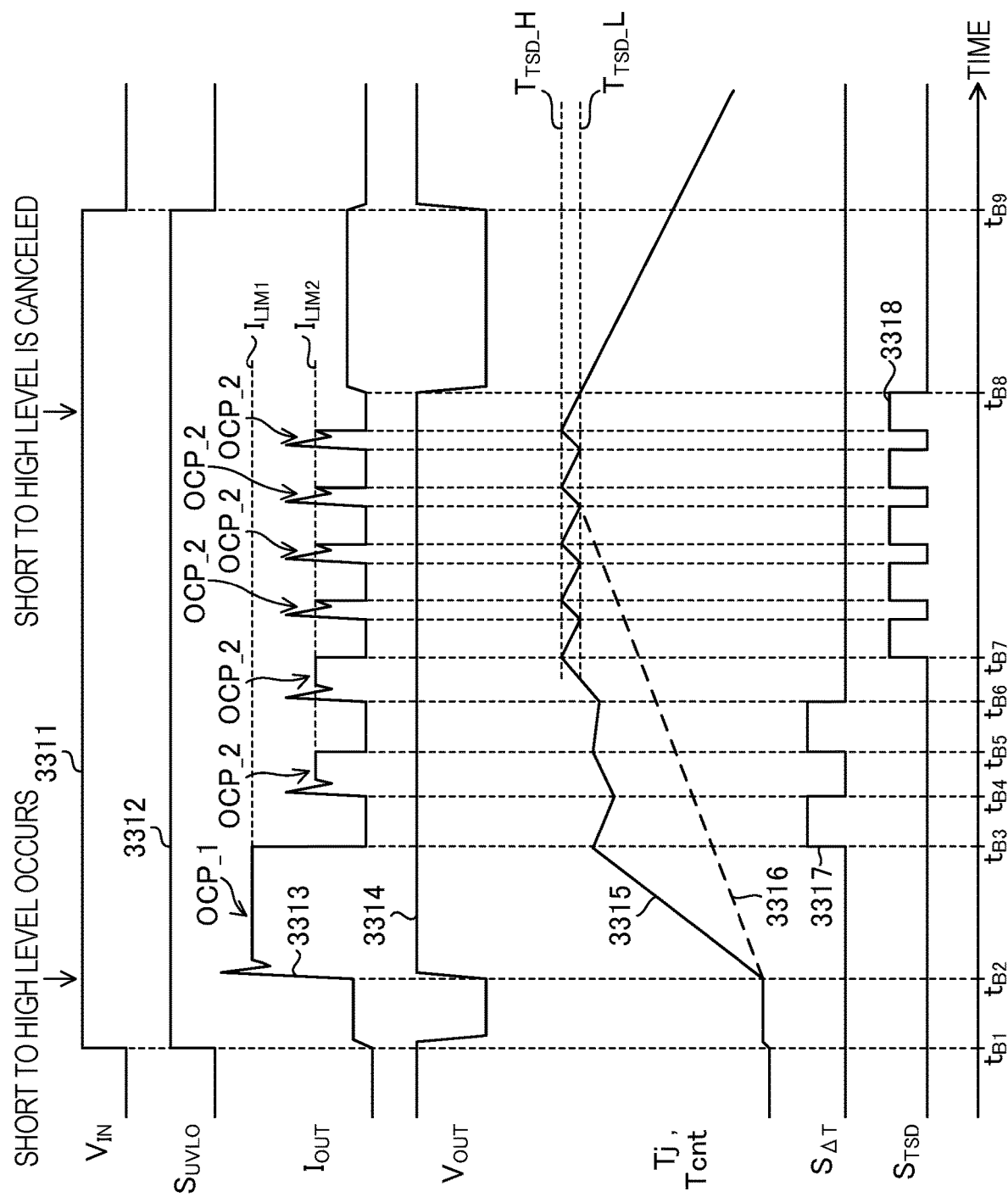
FIG. 23 is a timing chart of the switch device, according to Example EX2_1 of the second embodiment.

FIG. 23 illustrates a timing chart in Example EX2_1. In FIG. 23, waveforms 3311 to 3318 according to Example EX2_1 are shown. The waveforms 3311 to 3318 are those of the input voltage $V_{IN}$, the signal $S_{UVLO}$, the output current $I_{OUT}$, the output voltage $V_{OUT}$, the temperature Tj, the temperature Tcnt, the signal $S_{AT}$, and the signal $S_{TSD}$, respectively, according to Example EX2_1. Note that in FIG. 23, it is supposed that after the temperature Tcnt shown by the waveform 3316 of the broken line reaches the temperature Tj shown by the waveform 3315 of solid line, the temperature Tcnt agrees with the temperature Tj, and illustration of the waveform 3316 after the temperature Tcnt reaches the temperature Tj is omitted. For any natural number i, time $t_{Bi+1}$ is after time $t_{Bi}$.

The switch device 1000 according to Example EX2_1 is configured to be capable of changing the upper limit current value $I_{LIM}$ in the overcurrent protection operation among a plurality of current values including the predetermined current values $I_{LIM1}$ and $I_{LIM2}$. The plurality of current values may include three or more current values, but only the current values $I_{LIM1}$ and $I_{LIM2}$ are noted here. The current values $I_{LIM1}$ and $I_{LIM2}$ both have a positive predetermined current value, and the current value $I_{LIM2}$ is less than the current value $I_{LIM1}$. It may be considered that the overcurrent protection circuit 1130 changes the upper limit current value $I_{LIM}$ between a plurality of current values, or that the gate control circuit 1110 changes the upper limit current value $I_{LIM}$ between a plurality of current values. Here, it is considered that the gate control circuit 1110 changes the upper limit current value $I_{LIM}$ between the plurality of current values.

The gate control circuit 1110 sets an initial value of the upper limit current value $I_{LIM}$ to the current value $I_{LIM1}$. When the magnitude of the output current $I_{OUT}$ reaches the current value $I_{LIM1}$, the overcurrent protection operation is performed first time. After that, when the overcurrent protection operation is performed second time and after, the gate control circuit 1110 controls to perform the overcurrent protection operation each time in the state where the upper limit current value $I_{LIM}$ is set to the current value $I_{LIM2}$. An operation including this variable setting of the upper limit current value $I_{LIM}$ is described below with reference to FIG. 23.

At time $t_{Bi}$, the value of the input voltage $V_{IN}$ increases from 0 V to a predetermined positive voltage value, so that a positive edge is generated in the signal $S_{UVLO}$, and after that the input voltage $V_{IN}$ is decreases back to 0 V at time $t_{B9}$, so that a negative edge is generated in the signal $S_{UVLO}$. Therefore, the period between times $t_{Bi}$ and $t_{B9}$ corresponds to the ON designated period. It is supposed that short to high level does not occur at time $t_{Bi}$ and just after time $t_{Bi}$, and that short to high level occurs at time $t_{B2}$. Then, the output current $I_{OUT}$ increases rapidly after time $t_{B2}$, and the magnitude of the output current $I_{OUT}$ is limited to the current value $I_{LIM1}$ or less by the overcurrent protection operation. Note that just after the overcurrent protection operation starts, the magnitude of the output current $I_{OUT}$ may transiently exceeds the upper limit current value $I_{LIM}$ (the current value $I_{LIM1}$ in the overcurrent protection operation in first time), and FIG. 23 schematically illustrates the transient response.

After time $t_{B2}$, the output current $I_{OUT}$ having a large value flows so that the temperature Tj rapidly rises, and in this process the temperature difference ΔT increases and reaches the protection temperature difference ΔT_H (see FIG. 20). Then, a positive edge is generated in the signal $S_{AT}$, and hence the second temperature protection operation (see FIG. 21) is performed. In the example of FIG. 23, a positive edge, a negative edge, a positive edge, and a negative edge are generated at times $t_{B3}$, $t_{B4}$, $t_{B5}$, and $t_{B6}$, respectively in the signal $S_{AT}$. Therefore, from time $t_{B2}$ to time fir, there alternately occur rises and falls of the temperature Tj, the rises being due to the output current $I_{OUT}$ near the upper limit current value $I_{LIM}$ flowing in the output transistor 1010, while the falls being due to the output transistor 1010 being kept in the OFF state by the second temperature protection operation. As a point to be noted, the upper limit current value $I_{LIM}$ in the overcurrent protection operation performed after time $t_{B3}$ is the current value $I_{LIM2}$.

At time $t_{B7}$, the temperature Tj rises to the protection temperature $T_{TSD}$_H (see FIG. 19). Then, after that until the short to high level is canceled, the state continues where the temperature Tj fluctuate between the protection temperature $T_{TSD}$_H and the protection cancel temperature $T_{TSD}$_L. In the example of FIG. 23, the short to high level is canceled just before time $t_{B8}$ after time $t_{B7}$. In the period from time fir to time $t_{B8}$, there alternately occur rises of the temperature Tj, due to the output current $I_{OUT}$ near the upper limit current value $I_{LIM}$ (here, the current value $I_{LIM2}$) flowing in the output transistor 1010, and falls of the temperature Tj, due to the output transistor 1010 being kept in the OFF state by the first temperature protection operation.

After the short to high level is canceled, at time $t_{B8}$, the temperature Tj falls below the temperature $T_{TSD}$_L (the protection cancel temperature), so that a negative edge is generated in the signal $S_{TSD}$. Then, the output transistor 1010 is turned on. In this case, the magnitude of the output current $I_{OUT}$ is sufficiently smaller than the upper limit current value $I_{LIM}$ (here, the current value $I_{LIM2}$). After that, when the input voltage $V_{IN}$ becomes 0 V at time $t_{B9}$, the output transistor 1010 is turned off, and the output current $I_{OUT}$ becomes zero.

In the example of FIG. 23, the overcurrent protection operation in first time is performed over the entire period between times $t_{B2}$ and $t_{B3}$, and the overcurrent protection operation in second time is performed over the entire period between times $t_{B4}$ and $t_{B5}$, and the overcurrent protection operation in third period is performed over the entire period between times $t_{B6}$ and $t_{B7}$. After that, in the period between times fir and $t_{B8}$, the high level period of the signal $S_{TSD}$ and the low level period of the signal $S_{TSD}$ alternately and repeatedly occur, and the overcurrent protection operations in forth time and after are performed in the high level periods of the signal $S_{TSD}$. In the period between times $t_{B4}$ and $t_{B8}$ and in the period between times $t_{B6}$ and $t_{B7}$, the output transistor 1010 is kept in the OFF state by the second temperature protection operation. Further in the high level periods of the signal $S_{TSD}$ in the period between times fir and $t_{B8}$, the output transistor 1010 is kept in the OFF state by the first temperature protection operation.

Further, the overcurrent protection operation in first time is the overcurrent protection operation to limit the magnitude of the output current $I_{OUT}$ to the current value $I_{LIM1}$ or less (hereinafter referred to as overcurrent protection operation OCP_1), while each of the overcurrent protection operations in second time and after is the overcurrent protection operation to limit the magnitude of the output current $I_{OUT}$ to the current value $I_{LIM2}$ or less (hereinafter referred to as overcurrent protection operation OCP_2).

In the overcurrent protection operation OCP_1, the magnitude of the output current $I_{OUT}$ (i.e., the value of the output current $I_{OUT}$) is limited to the current value $I_{LIM1}$ or less while allowing the magnitude of the output current $I_{OUT}$ to exceed the current value $I_{LIM2}$. The overcurrent protection operation OCP_1 is an operation to control the gate potential of the output transistor 1010 so that the magnitude of the output current $I_{OUT}$ does not exceed the current value $I_{LIM1}$, while keeping the output transistor 1010 in the ON state, and if the overcurrent protection operation OCP_1 is performed during continuing short to high level, the magnitude of the output current $I_{OUT}$ is kept near the current value km (except for a transient state). The overcurrent protection operation OCP_2 is an operation to control the gate potential of the output transistor 1010 so that the magnitude of the output current $I_{OUT}$ does not exceeds the current value $I_{LIM2}$, while keeping the output transistor 1010 in the ON state, and if the overcurrent protection operation OCP_2 is performed during continuing short to high level, the magnitude of the output current $I_{OUT}$ is kept near the current value $I_{LIM2}$ (except for a transient state).

Also in Example EX2_1, similarly to the reference example described above, during continuing short to high level, there alternately occur periods of the rising temperature Tj, due to the output current $I_{OUT}$ near the upper limit current value $I_{LIM}$ flowing in the output transistor 1010, and periods of the falling temperature Tj, due to the output transistor 1010 being kept in the OFF state by the first or second temperature protection operation. However, in Example EX2_1, the upper limit current value $I_{LIM}$ in the overcurrent protection operation is decreased to the current value $I_{LIM2}$ in the overcurrent protection operations in second time and after, and hence an increase gradient of the temperature Tj in the repeating rises and falls of the temperature Tj becomes less than that in the reference example. As a result, the above-mentioned possibility of wire breakage due to thermal stress is reduced so that the wire breakage hardly occurs, and hence reliability of the switch device 1000 is enhanced (durability against overcurrent is improved).

Next, a circuit configuration of Example EX2_1 is described below. The output transistor 1010 according to Example EX2_1 is a gate division type FET. The gate division type FET is an MISFET having the structure described above in detail in the first embodiment, and the MISFET 9 in the first embodiment is the gate division type FET. The gate division type FET has first to n-th gates that are insulated from each other, and the first to n-th gates receive first to n-th gate signals, respectively. Symbol n is any integer of 2 or more. Further, the gate division type FET has first to n-th channel regions that are independently controlled to the ON state or the OFF state on the basis of the first to n-th gate signals. In Example EX2_1, it is supposed that the MISFET 9 in the first embodiment is used as the output transistor 1010 (therefore, n=2 is supposed).

Figure 24:
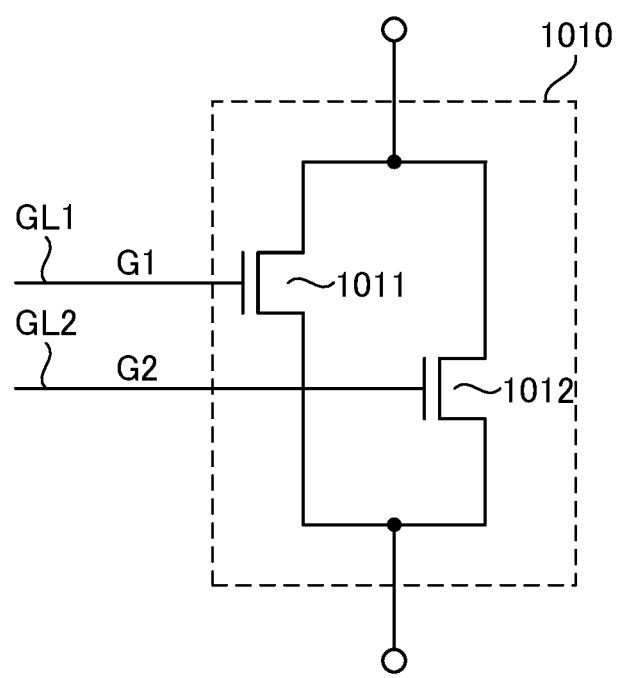
FIG. 24 is an equivalent circuit diagram of an output transistor, according to Example EX2_1 of the second embodiment.

Then, as illustrated in FIG. 24, the output transistor 1010 is considered to be equivalent to a parallel connection circuit of transistors 1011 and 1012. The transistors 1011 and 1012 correspond to the first MISFET 56 and the second MISFET 57, respectively, in the first embodiment. A gate signal G1 propagates in a gate line GL1, so that the gate signal G1 is applied to the gate of the transistor 1011. A gate signal G2 propagates in a gate line GL2, so that the gate signal G2 is applied to the gate of the transistor 1012. The gates of the transistors 1011 and 1012 correspond to the first and second gates of the output transistor 1010. The drains of the transistors 1011 and 1012 are commonly connected so as to form the drain of the output transistor 1010, while the sources of the transistors 1011 and 1012 are commonly connected so as to form the source of the output transistor 1010.

A channel region between drain and source of the transistor 1011 corresponds to the first channel region of the output transistor 1010, and a channel region between drain and source of the transistor 1012 corresponds to the second channel region of the output transistor 1010. If the MISFET 9 of the first embodiment is used as the output transistor 1010, the first channel region of the output transistor 1010 is formed of the channel region 91 described above in the first embodiment, and the second channel region of the output transistor 1010 is formed of the channel region 111 described above in the first embodiment. In the output transistor 1010, the first and second channel regions are electrically separated. Therefore, in the output transistor 1010, the first channel region is controlled to the ON state or the OFF state on the basis of the gate signal G1 independently from the second channel region, and the second channel region is controlled to the ON state or the OFF state on the basis of the gate signal G2 independently from the first channel region.

In accordance with the gate signals G1 and G2, the output transistor 1010 has one of a plurality of states including a full-ON state, a first half-ON state, a second half-ON state, and a full-OFF state. The ON state of the output transistor 1010 in the above description corresponds to the full-ON state, the first half-ON state, or the second half-ON state. The OFF state of the output transistor 1010 in the above description corresponds to the full-OFF state. In the full-ON state, the first and second channel regions are both in the ON state. In the first half-ON state, the first channel region is in the ON state while the second channel region is in the OFF state. In the second half-ON state, the first channel region is in the OFF state while the second channel region is in the ON state. In the full-OFF state, the first and second channel regions are both in the OFF state.

The full-ON state, the first half-ON state, and the second half-ON state respectively correspond to the Full-ON control, the first Half-ON control, and the second Half-ON control in the first embodiment. The ON state and the OFF state of the first channel region correspond to the ON state and the OFF state of the transistor 1011, respectively. The ON state and the OFF state of the second channel region correspond to the ON state and the OFF state of the transistor 1012, respectively. For any integer i, the ON state of the i-th channel region means that the i-th channel region is in a conductive state. When the i-th channel region is in the ON state, the output current $I_{OUT}$ flows through the i-th channel region. For any integer i, the OFF state of the i-th channel region means that the i-th channel region is in a cut-off state (non-conductive state). When the i-th channel region is in the OFF state, there is no flow of the output current $I_{OUT}$ through the i-th channel region (the flow is cut off).

When the first or second temperature protection operation is performed, the output transistor 1010 is in the full-OFF state. In the overcurrent protection operation, the output transistor 1010 is driven in the full-ON state or the first half-ON state (details will be described later).

Figure 25:
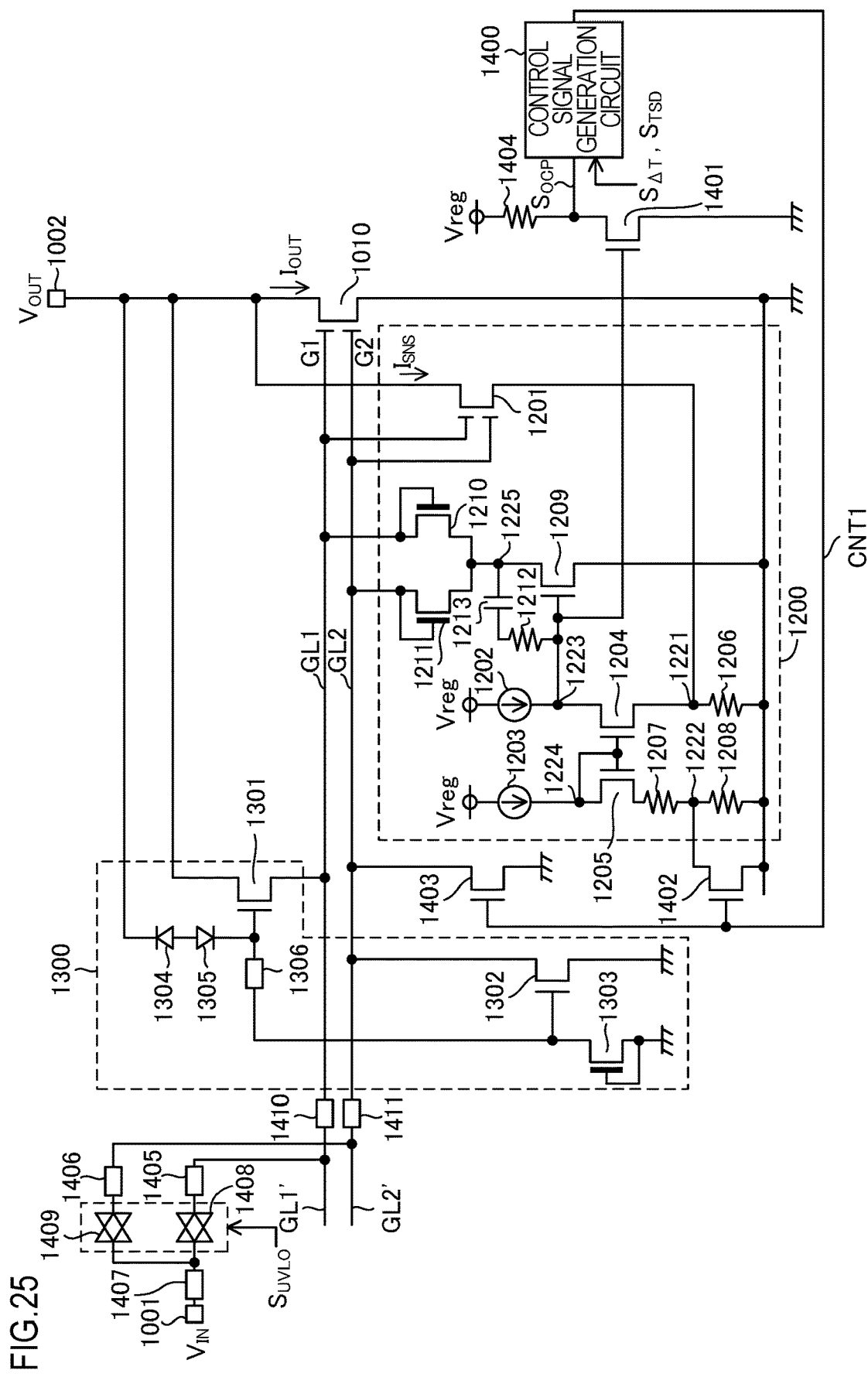
FIG. 25 is a partial circuit diagram of the switch device, according to Example EX2_1 of the second embodiment.

FIG. 25 illustrates a circuit diagram of a part of the switch device 1000 according to Example EX2_1. The switch device 1000 according to Example EX2_1 includes, in addition to the output transistor 1010 as the gate division type FET, a overcurrent protection circuit 1200, an active clamp circuit 1300, and a control signal generation circuit 1400, and it further includes transistors 1401 to 1403 as N-channel type MISFETs, resistors 1404 to 1407, 1410, and 1411, and switches 1408 and 1409 as analog switches. The overcurrent protection circuit 1200 and the active clamp circuit 1300 are examples of the overcurrent protection circuit 1130 and the active clamp circuit 1160, respectively, illustrated in FIG. 16. The control signal generation circuit 1400 and circuit elements denoted by numerals 1401 to 1404 are components of the gate control circuit 1110. Circuit elements denoted by numerals 1405 to 1411 may also be understood to be components of the gate control circuit 1110.

The circuit configuration of FIG. 25 is described below. The drain of the output transistor 1010 is connected to the output terminal 1002, and the source of the output transistor 1010 is connected to the ground. The first gate and the second gate of the output transistor 1010 are respectively connected to the gate line GL1 applied with the gate signal G1 and the gate line GL2 applied with the gate signal G2.

The overcurrent protection circuit 1200 includes a sense transistor 1201, constant current circuits 1202 and 1203, transistors 1204, 1205, 1209, 1210, and 1211 as N-channel type MISFETs, resistors 1206, 1207, 1208, and 1212, and a capacitor 1213. The transistors 1210, and 1211 are depletion type MISFETs. The resistor 1212 and the capacitor 1213 constitute a phase compensation circuit.

The sense transistor 1201 is a gate division type FET having the same structure as the output transistor 1010, and therefore has the first and second gates. The first and second gates of the sense transistor 1201 are connected to the gate lines GL1 and GL2, respectively. The drain of the sense transistor 1201 is connected to the drain of the output transistor 1010, and the source of the sense transistor 1201 is connected to one end of the resistor 1206 at a node 1221. The other end of the resistor 1206 is connected to the ground. Current flowing between drain and source of the sense transistor 1201 is referred to as sense current $I_{SNS}$. The sense current $I_{SNS}$ is proportional to the output current $I_{OUT}$ flowing between drain and source of the output transistor 1010. In other words, the sense transistor 1201 has a structure similar to that of the output transistor 1010 so that $I_{SNS}:I_{OUT}=1:\alpha$ is satisfied ($\alpha$ is sufficiently larger than 1). When the output transistor 1010 is controlled to the full-ON state, the first half-ON state, the second half-ON state, or the full-OFF state, the sense transistor 1201 is also controlled to the full-ON state, the first half-ON state, the second half-ON state, or the full-OFF state, respectively.

The constant current circuit 1202 is disposed between an internal power supply terminal applied with an internal power supply voltage Vreg and a node 1223, and supplies a predetermined constant current from the internal power supply terminal to the node 1223. The constant current circuit 1203 is disposed between an internal power supply terminal applied with the internal power supply voltage Vreg and a node 1224, and supplies a predetermined constant current from the internal power supply terminal to the node 1224. The internal power supply voltage Vreg has a positive DC voltage value. The switch device 1000 can generate the internal power supply voltage Vreg on the basis of a voltage supplied from outside.

The drain and source of the transistor 1204 are connected to the nodes 1223 and 1221, respectively. The drain and gate of the transistor 1205 and the gate of the transistor 1204 are commonly connected to the node 1224. The source of the transistor 1205 is connected to a node 1222 via a resistor 1207, and the node 1222 is connected to the ground via a resistor 1208.

The node 1223 is connected to the gates of the transistors 1209 and 1401 and is connected to one end of the resistor 1212. The other end of the resistor 1212 is connected to a node 1225 via the capacitor 1213. The drain of the transistor 1209 and the sources of the transistors 1210 and 1211 are commonly connected to the node 1225. The source of the transistor 1209 is connected to the ground. The drain and gate of the transistor 1210 are short-circuited to each other and are connected to the gate line GL1. The drain and gate of the transistor 1211 are short-circuited to each other and are connected to the gate line GL2.

The active clamp circuit 1300 includes transistors 1301 to 1303 as N-channel type MISFETs, diodes 1304 and 1305, and a resistor 1306. The transistor 1303 is a depletion type MISFET.

The drain of the transistor 1301 and the cathode of the diode 1304 are connected to the drain of the output transistor 1010. The anodes of the diodes 1304 and 1305 are connected to each other, the cathode of the diode 1305 is connected to the gate of the transistor 1301 and one end of the resistor 1306. The other end of the resistor 1306 is connected to the gate of the transistor 1302 and the drain of the transistor 1303. In the transistor 1302, the drain is connected to the gate line GL2, and the source is connected to the ground. The gate and the source of the transistor 1303 are connected to the ground. The source of the transistor 1301 is connected to the gate line GL1.

The drain of the transistor 1401 is connected to the internal power supply terminal applied with the internal power supply voltage Vreg via the resistor 1404. The source of the transistor 1401 is connected to the ground. A signal $S_{OCP}$ having the drain voltage of the transistor 1401 and the signals $S_{AT}$ and $S_{TSD}$ are input to the control signal generation circuit 1400. The control signal generation circuit 1400 generates and outputs a control signal CNT1 on the basis of these input signals. The control signal CNT1 is input to the gates of the transistors 1402 and 1403. In the transistor 1402, the drain is connected to the node 1222, and the source is connected to the ground. In the transistor 1403, the drain is connected to the gate line GL2, and the source is connected to the ground.

The input terminal 1001 is connected to one end of the resistor 1407, and the other end of the resistor 1407 is connected to one ends of the switches 1408 and 1409. The other end of the switch 1408 is connected to a line GL1' via the resistor 1405. The other end of the switch 1409 is connected to a line GL2' via the resistor 1406. The line GL1' is connected to the gate line GL1 via the resistor 1410. The line GL2' is connected to the gate line GL2 via the resistor 1411.

Functions and operations of the circuit illustrated in FIG. 25 are described below. The signal $S_{UVLO}$ is input to control terminals of the switches 1408 and 1409. During the high level period of the signal $S_{UVLO}$, the switches 1408 and 1409 are both in the ON state, while during the low level period of the signal $S_{UVLO}$, the switches 1408 and 1409 are both in the OFF state. Therefore, during the ON designated period based on the input voltage $V_{IN}$ (see FIG. 21), the input voltage $V_{IN}$ is applied to the lines GL1' and GL2'. During the ON designated period based on the input voltage $V_{IN}$, if the transistors 1210, 1211, 1302, 1403, or the like does not cause pulling charge out of the gate lines GL1 and GL2, the input voltage $V_{IN}$ itself is applied to the gate lines GL1 and GL2.

Note that although not illustrated in FIG. 25, the gate control circuit 1110 (FIG. 16) includes a circuit, which quickly decreases the gate signals G1 and G2 to sufficiently low potentials (e.g. the ground potential), or keeps the gate signals G1 and G2 at sufficiently low potentials (e.g. the ground potential), when the output transistor 1010 should be in the OFF state. In this way, the output transistor 1010 is kept in the OFF state (the full-OFF state) during the OFF designated period and the execution period of the first or second temperature protection operation.

The active clamp circuit 1300 protects the output transistor 1010 from an counter electromotive force generated by an inductive load if the load LD (see FIG. 16) includes the inductive load. The active clamp circuit 1300 limits the voltage between drain and source of the output transistor 1010 to a predetermined clamp voltage or less, by an operation similar to the active clamp operation described above in the first embodiment. In this way, it protects the output transistor 1010 from the counter electromotive force described above.

The control signal generation circuit 1400 outputs the control signal CNT1 having low level or high level. During the low level period of the control signal CNT1, the transistors 1402 and 1403 are in the OFF state, while during the high level period of the control signal CNT1, the transistors 1402 and 1403 are in the ON state. At the time when the input voltage $V_{IN}$ is switched from low level to high level (i.e. the time when a positive edge is generated in the signal $S_{UVLO}$), the control signal generation circuit 1400 sets the control signal CNT1 to low level, and after that, it switches the control signal CNT1 to high level in a predetermined condition.

It is assumed that the transistor 1403 is kept in the OFF state, and the overcurrent protection operation of the overcurrent protection circuit 1200 is described below. During a period in which the output current $I_{OUT}$ and the sense current $I_{SNS}$ are sufficiently low, voltage at the node 1223 is sufficiently low so that the transistors 1209 and 1401 are kept in the OFF state. When the output current $I_{OUT}$ increase from zero, the sense current $I_{SNS}$ also increases from zero. Further, when the magnitude of the output current $I_{OUT}$ increases to reach the upper limit current value $I_{LIM}$, the transistors 1209 and 1401 are switched from the OFF state to the ON state due to a potential increase at the node 1221 and the potential increase at the node 1223. During the ON period of the transistor 1209, charge is pulled out of the gate lines GL1 and GL2 through the transistors 1210 and 1211, and hence potentials of the gate signals G1 and G2 become less than those in the OFF period of the transistor 1209. As a result, the output current $I_{OUT}$ is decreased. When the sense current $I_{SNS}$ is decreased along with the decrease of the output current $I_{OUT}$, potential of the node 1223 is decreased, so that drain currents of the transistors 1210 and 1211 are also decreased, and potentials of the gate signals G1 and G2 are increased. The potential increases of the gate signals G1 and G2 cause an increase of the output current $I_{OUT}$ and an increase of potential at the node 1223 along with the increase of the sense current $I_{SNS}$. During the continuing short to high level, as this operation is repeated, the magnitude of the output current $I_{OUT}$ is the upper limit current value $I_{LIM}$ or less and is kept around the upper limit current value $I_{LIM}$.

The lower limit value of the sense current $I_{SNS}$ necessary for setting the transistors 1209 and 1401 to the ON state is referred to as a sense boundary current value. During the ON period of the transistor 1402, both terminals of the resistor 1208 are short-circuited by the transistor 1402, and hence the sense boundary current value is less than that in the OFF period of the transistor 1402. In other words, the product obtained by multiplying the sense boundary current value in the OFF period of the transistor 1402 by a predetermined proportional coefficient α corresponds to the current value km, and the product obtained by multiplying the sense boundary current value in the ON period of the transistor 1402 by the predetermined proportional coefficient α corresponds to the current value $I_{LIM2}$. Therefore, by turning on and off the transistor 1402, the upper limit current value $I_{LIM}$ can be switched between the current values km and $I_{LIM2}$.

As to a relationship to the timing chart of FIG. 23, operations of the overcurrent protection circuit 1200, the control signal generation circuit 1400, and the like are described. An initial level of the control signal CNT1 during the ON designated period is low level. Therefore, the control signal generation circuit 1400 sets the control signal CNT1 at low level at time $t_{B1}$ when the input voltage $V_{IN}$ is switched from low level to high level (i.e. at time $t_{B1}$ when a positive edge is generated in the signal $S_{UVLO}$).

When short to high level occurs at time $t_{B2}$, the overcurrent protection operation in first time is performed. The overcurrent protection operation in first time is the overcurrent protection operation OCP_1 in which $I_{LIM}=I_{LIM1}$ is satisfied, as described above. If the transistor 1401 is in the OFF state, the signal $S_{OCP}$ has high level, while if the transistor 1401 is in the ON state, the signal $S_{OCP}$ has low level. Therefore, during the period in which the overcurrent protection operation in first time is performed, the signal $S_{OCP}$ having low level is input to the control signal generation circuit 1400. Information indicating that the signal $S_{OCP}$ becomes low level is latched in the control signal generation circuit 1400 as overcurrent detection information indicating that the overcurrent protection operation has been performed. During the period in which the overcurrent protection operation OCP_1 is continuously performed between times $t_{B2}$ and $t_{B3}$, the control signal CNT1 is kept at low level.

After that, when a positive edge is generated in the signal $S_{AT}$ or $S_{TSD}$ in the state where the overcurrent detection information is latched, the control signal generation circuit 1400 switches the control signal CNT1 from low level to high level, and after that it keeps the control signal CNT1 at high level until a predetermined reset condition is satisfied. In the example of FIG. 23, among the signals $S_{AT}$ and $S_{TSD}$, the signal $S_{AT}$ first generates a positive edge, and the control signal CNT1 is switched to high level triggered by the positive edge of the signal $S_{AT}$. If the signal $S_{TSD}$ first generates a positive edge, the control signal CNT1 is switched to high level triggered by the positive edge of the signal $S_{TSD}$.

The reset condition is satisfied when a negative edge is generated in the signal $S_{UVLO}$ (therefor, it is satisfied at time $t_{B9}$). However, the reset condition is not limited to this. In addition, switch timing of the level of the control signal CNT1 can also be modified. In any case, within one ON designated period, the control signal CNT1 is set at low level during the period in which the overcurrent protection operation in first time is performed, and the control signal CNT1 is set at high level during the period in which the overcurrent protection operation in second time or after is performed. In this way, during one ON designated period, the overcurrent protection operation in first time is the overcurrent protection operation OCP_1, and the overcurrent protection operation in second time or after is the overcurrent protection operation OCP_2.

In addition, when the control signal CNT1 is set at high level so that the transistor 1403 becomes in the ON state, the gate signal G2 becomes sufficiently low, and the second channel region of the output transistor 1010 becomes the OFF state. In other words, during the period in the ON designated period, in which the output transistor 1010 is not controlled to the OFF state by the first or second temperature protection operation, if the control signal CNT1 is at low level, the output current $I_{OUT}$ flows through the first and second channel regions of the output transistor 1010 (in other words, the output transistor 1010 is driven in the full-ON state), while if the control signal CNT1 is at high level, the output current $I_{OUT}$ flows through only the first channel region of the output transistor 1010 (in other words, the output transistor 1010 is driven in the first half-ON state).

Therefore, in the overcurrent protection operation OCP_1, the output current $I_{OUT}$ flows through the first and second channel regions of the output transistor 1010, while in the overcurrent protection operation OCP_2, the output current $I_{OUT}$ flows through only the first channel region of the output transistor 1010.

In this way, in the overcurrent protection operation in second time, the channel regions through which the output current $I_{OUT}$ flows are reduced, so that the heating sections are reduced. As a result, compared with the case where the reduction is not performed (i.e., the case where all the channel regions are in the ON state in the overcurrent protection operations performed repeatedly), heating amount is reduced, and hence influence of the thermal stress becomes small. As a result, possibility of wire breakage due to thermal stress described above is reduced so that the wire breakage hardly occurs, and hence reliability of the switch device 1000 is enhanced (durability against overcurrent is improved).

Example EX2_2

Example EX2_2 of the second embodiment is described below. Example EX2_2 describes supplementary matter, modified technique, application technique, and the like for the above description in the second embodiment.

Example EX2_1 describes the structure in which the output transistor 1010 is the gate division type FET, but the output transistor 1010 may not be the gate division type FET. In other words, the output transistor 1010 may be the MISFET that has a single gate and is controlled to the ON state or the OFF state by a gate signal applied to the single gate.

The second temperature protection circuit 1150 may be eliminated from the switch device 1000. In this case, the temperature protection operation that can be performed in the switch device 1000 is only the first temperature protection operation by the first temperature protection circuit 1140.

It is supposed that the switch device 1000 is constituted as a switching device on the low side in the above description of the structure and the operation of the switch device 1000, but the switch device 1000 may be constituted as a switching device on the high side. In this case, the terminal BB (see FIG. 16) is directly connected to the terminal 1002 so that the voltage $V_{BB}$ is applied to the drain of the output transistor 1010, and the source of the output transistor 1010 is connected to the ground via the load LD.

For any signal or voltage, a relationship between high level and low level can be inverted from that described above without deviating from the spirit of the above description.

The channel types of the field effect transistors (FET) described in the embodiments are merely examples, and the configurations of the circuits including the FETs can be modified so that an N-channel type FET is replaced with a P-channel type FET or that a P-channel type FET is replaced with an N-channel type FET.

The switch device 1000 may be mounted in a vehicle such as an automobile, and the switch device 1000 may be used for any load LD in the vehicle. However, the switch device 1000 can be used for any usage without limiting to in-vehicle devices.

The embodiments of the present disclosure can be appropriately and variously modified within the scope of the technical concept recited in the claims. The embodiments described above are merely examples of the embodiments of the present disclosure, and meanings of the present disclosure and the terms of the components are not limited to those described in the above embodiments. Specific values described above are merely examples, and they can be changed to various values as a matter of course.

SUPPLEMENTARY NOTES

Supplementary notes are added to the present disclosure for which specific configuration examples are shown in the embodiments described above.

The switch device according to an aspect of the present disclosure (1000, see the second embodiment) includes an output transistor (1010), an overcurrent protection circuit (1130, 1200) configured to be capable of performing an overcurrent protection operation in which magnitude of target current ($I_{OUT}$) flowing in the output transistor is limited to a predetermined upper limit current value ($I_{LIM}$) or less, and a control circuit (1110) configured to be capable of controlling a state of the output transistor and capable of changing the upper limit current value among a plurality of current values including a predetermined first current value ($I_{LIM1}$) and a predetermined second current value ($I_{LIM2}$) less than the first current value. The control circuit is configured (as illustrated in FIG. 23) to be capable of changing the upper limit current value to the second current value after performing the overcurrent protection operation to limit the magnitude of the target current to the first current value or less when the magnitude of the target current reaches the first current value (First Structure).

The overcurrent protection operation may be performed repeatedly due to short to high level, short to ground, or the like. If the overcurrent protection operation is performed repeatedly, temperature fluctuation is generated in the output transistor. In the repeating overcurrent protection operation, if a gradient of temperature rise in the output transistor is too large, a large thermal stress is applied to the junction between the electrode pad and the wire so that a cracking may occur in the junction. With the first structure described above, possibility of cracking due to the thermal stress is reduced so that wire breakage hardly occurs, and hence reliability of the switch device is enhanced (durability against overcurrent is improved).

In the switch device having the first structure described above, it may be possible to adopt the structure, in which the switch device further includes the input terminal (1001) and the temperature protection circuit (1140, 1150) configured to be capable of outputting the temperature protection signal ($S_{TSD}$, $S_{\Delta T}$) having a predetermined first or second logical value in accordance with temperature of the output transistor, the control circuit is capable of controlling the output transistor to the ON state or the OFF state in accordance with the input voltage ($V_{IN}$) at the input terminal, the control circuit is capable of performing the temperature protection operation to switch the output transistor from the ON state to the OFF state and keep the output transistor in the OFF state until a predetermined temperature protection cancel condition is satisfied, when value of the temperature protection signal is switched from the first logical value to the second logical value in the ON designated period in which the output transistor is designated to the ON state in accordance with the input voltage, and after the overcurrent protection operation (OCP_1) is performed to limit magnitude of the target current to the first current value or less when the magnitude of the target current reaches the first current value during the ON designated period, and when another overcurrent protection operation (OCP_2) is performed via the temperature protection operation, the control circuit is capable of setting the upper limit current value to the second current value in the another overcurrent protection operation (Second Structure).

If the overcurrent protection operation is performed repeatedly via the temperature protection operation to keep the output transistor in the OFF state, temperature fluctuation is generated in the output transistor. In the repeating overcurrent protection operation, if a temperature rise gradient of the output transistor is too large, a large thermal stress is applied to the junction between the electrode pad and the wire so that a cracking may occur in the junction. With the second structure described above, possibility of cracking due to the thermal stress is reduced so that wire breakage hardly occurs, and hence reliability of the switch device is enhanced (durability against overcurrent is improved).

In the switch device having the second structure described above, it may be possible to adopt the structure, in which the temperature protection circuit (1140) switches the value of the temperature protection signal from the first logical value to the second logical value when temperature (Tj) of the output transistor reaches a predetermined protection temperature (Third Structure).

In the switch device having the second structure described above, it may be possible to adopt the structure, in which the temperature protection circuit (1150) switches the value of the temperature protection signal from the first logical value to the second logical value when a temperature difference ($\Delta T$) between the temperature (Tj) of the output transistor and another temperature (Tcnt) in the switch device reaches a predetermined protection temperature difference (Fourth Structure).

In the switch device having one of the first to fourth structures described above, (as illustrated in FIGS. 24 and 25), it may be possible to adopt the structure, in which the output transistor is a field effect transistor having a plurality of channel regions that are controlled to the ON state or the OFF state independently from each other on the basis of a plurality of gate signals (G1, G2), and the control circuit is capable of generating the plurality of gate signals, so that the target current flows through the plurality of channel regions in the overcurrent protection operation to limit the magnitude of the target current to the first current value or less, and that the target current flows through only a part of the plurality of channel regions in the overcurrent protection operation to limit the magnitude of the target current to the second current value or less (Fifth Structure).

In this way, when the overcurrent protection operation is performed to limit the magnitude of the target current to the second current value or less, the channel regions through which the target current flows are reduced, so that the heating sections are reduced. Then, heating amount is reduced, and hence influence of the thermal stress becomes small. As a result, possibility of cracking due to the thermal stress is reduced so that wire breakage hardly occurs, and hence reliability of the switch device is enhanced (durability against overcurrent is improved).

What is claimed is:

1. A switch device comprising:
an output transistor;
an overcurrent protection circuit configured to be capable of performing an overcurrent protection operation in which magnitude of target current flowing in the output transistor is limited to a predetermined upper limit current value or less; and
a control circuit configured to be capable of controlling a state of the output transistor and capable of changing the upper limit current value among a plurality of current values including a predetermined first current value and a predetermined second current value less than the first current value,
wherein:
the control circuit is configured to be capable of changing the upper limit current value to the second current value after performing the overcurrent protection operation to limit the magnitude of the target current to the first current value or less when the magnitude of the target current reaches the first current value,
the output transistor is a field effect transistor having a plurality of channel regions that are controlled to an ON state or an OFF state independently from each other on the basis of a plurality of gate signals, and
the control circuit is configured to be capable of generating the plurality of gate signals, so that the target current flows through the plurality of channel regions in the overcurrent protection operation to limit the magnitude of the target current to the first current value or less, and that the target current flows through only a part of the plurality of channel regions in the overcurrent protection operation to limit the magnitude of the target current to the second current value or less.

2. The switch device according to claim 1, further comprising:
an input terminal; and
a temperature protection circuit configured to be capable of outputting a temperature protection signal having a predetermined first or second logical value in accordance with temperature of the output transistor, wherein the control circuit is configured to be capable of controlling the output transistor to an ON state or an OFF state in accordance with an input voltage at the input terminal,
the control circuit is configured to be capable of performing a temperature protection operation, in which the output transistor is switched from the ON state to the OFF state and is kept in the OFF state until a predetermined temperature protection cancel condition is satisfied, when a value of the temperature protection signal is switched from the first logical value to the second logical value during an ON designated period in which the output transistor is designated to the ON state on the basis of the input voltage, and
after the overcurrent protection operation is performed to limit the magnitude of the target current to the first current value or less when the magnitude of the target current reaches the first current value during the ON designated period, and when another overcurrent protection operation is performed via the temperature protection operation, the control circuit is capable of setting the upper limit current value to the second current value in the another overcurrent protection operation.

3. The switch device according to claim 2, wherein the temperature protection circuit is configured to switch the value of the temperature protection signal from the first logical value to the second logical value when the temperature of the output transistor reaches a predetermined protection temperature.

4. The switch device according to claim 2, wherein the temperature protection circuit is configured to switch the value of the temperature protection signal from the first logical value to the second logical value when a temperature difference between the temperature of the output transistor and another temperature in the switch device reaches a predetermined protection temperature difference.

5. The switch device according to claim 1, further comprising:
an input terminal,
wherein the control circuit is connected to the input terminal and is configured to be capable of controlling the output transistor to an ON state or an OFF state in accordance with an input voltage at the input terminal.

6. The switch device according to claim 5 wherein the input terminal is not directly connected to the control circuit.

7. The switch device according to claim 6 wherein the input signal is not directly supplied to the control circuit so as to control the ON/OFF state of the output transistor.

* * * * *